(12) United States Patent
Ma et al.

(10) Patent No.: US 12,294,689 B2
(45) Date of Patent: *May 6, 2025

(54) DISPLAY APPARATUS OF LIGHT-SPLITTING STRUCTURE AND DRIVING METHOD THEREOF

(71) Applicant: BOE Technology Group Co., Ltd., Beijing (CN)

(72) Inventors: Sen Ma, Beijing (CN); Xue Dong, Beijing (CN); Jian Gao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/394,220

(22) Filed: Dec. 22, 2023

(65) Prior Publication Data

US 2024/0179290 A1   May 30, 2024

Related U.S. Application Data

(63) Continuation-in-part of application No. 18/316,915, filed on May 12, 2023, now Pat. No. 12,051,344, (Continued)

(30) Foreign Application Priority Data

May 12, 2022   (WO) ................ PCT/CN2022/092469

(51) Int. Cl.
*G09G 3/30* (2006.01)
*G02B 30/29* (2020.01)
(Continued)

(52) U.S. Cl.
CPC ........... *H04N 13/305* (2018.05); *G02B 30/29* (2020.01); *H04N 13/383* (2018.05)

(58) Field of Classification Search
CPC .......................... H04N 13/305; H04N 13/383
See application file for complete search history.

(56) References Cited

U.S. PATENT DOCUMENTS

| | | | |
|---|---|---|---|
| 6,801,243 | B1 | 10/2004 | Van Berkel |
| 2007/0201133 | A1 | 8/2007 | Cossairt |

(Continued)

FOREIGN PATENT DOCUMENTS

| | | |
|---|---|---|
| CN | 101729917 A | 6/2010 |
| CN | 102759803 A | 10/2012 |

(Continued)

OTHER PUBLICATIONS

European Extended Search Report, mailed May 19, 2023, from EP App. 21920361.9, 9 pages.

(Continued)

*Primary Examiner* — Sanghyuk Park
(74) *Attorney, Agent, or Firm* — Workman Nydegger

(57) ABSTRACT

The disclosure provides a display apparatus and a driving method. The display apparatus includes: a display panel, where the display panel includes a plurality of pixel islands arranged in arrays in a row direction and a column direction, and each pixel island includes n sub-pixels arranged at intervals in the row direction, where n is greater than 1; and a light-splitting component at a display side of the display panel, where the light-splitting component includes a plurality of light-splitting repeating units extending in the column direction and continuously arranged in the row direction, the light-splitting repeating unit includes M light-splitting structures extending in the column direction and continuously arranged in the row direction, each light-splitting repeating unit correspondingly covers K columns of pixel islands, both M and K are integers greater than 1, and M and K are prime to each other.

24 Claims, 38 Drawing Sheets

Related U.S. Application Data which is a continuation-in-part of application No. 17/757,975, filed as application No. PCT/CN2021/073653 on Jan. 25, 2021.

(51) Int. Cl.
*G09G 3/36* (2006.01)
*H04N 13/305* (2018.01)
*H04N 13/383* (2018.01)

(56) References Cited

U.S. PATENT DOCUMENTS

| | | |
|---|---|---|
| 2010/0097449 A1 | 4/2010 | Jeong et al. |
| 2012/0275183 A1 | 11/2012 | Minami |
| 2013/0069918 A1 | 3/2013 | Hou et al. |
| 2013/0208357 A1 | 8/2013 | Saito |
| 2016/0249042 A1 | 8/2016 | Liao |
| 2017/0155891 A1 | 6/2017 | Hu et al. |
| 2017/0195657 A1 | 7/2017 | Li et al. |
| 2018/0007349 A1 | 1/2018 | Lee et al. |
| 2020/0043989 A1* | 2/2020 | Liu .................. G02B 30/30 |
| 2020/0174279 A1 | 6/2020 | Ishihara et al. |
| 2021/0057493 A1 | 2/2021 | Liu et al. |
| 2022/0103804 A1 | 3/2022 | Naske |
| 2022/0206313 A1 | 6/2022 | Park et al. |
| 2022/0308349 A1 | 9/2022 | Yan et al. |
| 2022/0311991 A1 | 9/2022 | Hong |
| 2022/0366819 A1 | 11/2022 | Gao et al. |
| 2022/0394236 A1 | 12/2022 | Gao |

FOREIGN PATENT DOCUMENTS

| | | |
|---|---|---|
| CN | 103096109 A | 5/2013 |
| CN | 103995361 A | 8/2014 |
| CN | 107580211 A | 1/2018 |
| CN | 110459577 A | 11/2019 |
| CN | 110632767 A | 12/2019 |
| CN | 111175982 A | 5/2020 |
| CN | 111552093 A | 8/2020 |
| CN | 111766716 A | 10/2020 |
| CN | 113903785 A | 1/2022 |
| EP | 0752609 A2 | 1/1997 |
| EP | 0829743 A2 | 3/1998 |
| EP | 3499578 A1 | 6/2019 |
| JP | 2005-223727 A | 8/2005 |
| WO | 2020240106 A1 | 12/2020 |
| WO | 2022028020 A1 | 2/2022 |

OTHER PUBLICATIONS

Wash, M.R. et al., "Distributed pixel mapping for refining dark area in parallax barriers based on holoscopic 3D Display", 2013 International Conference on 3D Imaging, IEEE, Dec. 3, 2013, pp. 1-4.
International Search Report and Written Opinion, mailed Oct. 14, 2021, from PCT/CN2021/073653, 14 pages.
US Non-Final Office Action, mailed Dec. 7, 2023, for U.S. Appl. No. 18/316,915, 17 pages.
US Non-Final Office Action, mailed Feb. 23, 2024, from U.S. Appl. No. 17/757,975, 18 pages.
US Notice of Allowance, mailed Mar. 26, 2024, from U.S. Appl. No. 18/316,195, 14 pages.

* cited by examiner

| 55.6% | 78.3% | 94.9% | 94.9% | 78.3% |
|---|---|---|---|---|
| 94.9% | 78.3% | 55.6% | 78.3% | 94.9% |
| 78.3% | 94.9% | 94.9% | 78.3% | 55.6% |
| 78.3% | 55.6% | 78.3% | 94.9% | 94.9% |
| 94.9% | 94.9% | 78.3% | 55.6% | 78.3% |

DISPLAY APPARATUS OF LIGHT-SPLITTING STRUCTURE AND DRIVING METHOD THEREOF

CROSS REFERENCE TO RELATED APPLICATIONS

The application is a continuation-in-part application under U.S. Ser. No. 18/316,915, and claims the priority from International Patent Application No. PCT/CN2022/092469, filed on May 12, 2022.

FIELD

The present disclosure relates to the technical field of display, in particular to a display apparatus and a driving method thereof.

BACKGROUND

With constant development of display technology, a three-dimensional (3D) display technology has attracted more and more attention. Through the three-dimensional display technology, a display picture becomes three-dimensional and realistic. A principle of the technology is that: a left eye image and a right eye image with a certain parallax are respectively received by left and right eyes of a person, and after the two parallax images are received by the left and right eyes of the person, the brain can superimpose and fuse image information to construct a 3D visual display effect.

SUMMARY

In one aspect, embodiments of the present disclosure provide a display apparatus, including:
- a display panel, including: a plurality of pixel islands arranged at intervals in a row direction and a column direction, each pixel island being provided with n sub-pixels arranged at intervals in the row direction, where n is an integer greater than 1; and
- a light-splitting component, disposed on a display side of the display panel and including a plurality of light-splitting structures extending in the column direction and continuously arranged in the row direction.

In another aspect, embodiments of the present disclosure provides a method for driving the above display apparatus, including:
- determining a first image driving signal corresponding to each pixel island under a two-dimensional display mode according to image information to be displayed, and providing the corresponding first image driving signal to all sub-pixels in the pixel island to form a two-dimensional image; and
- determining a second image driving signal corresponding to each viewpoint under a three-dimensional display mode according to the image information to be displayed, and providing the second image driving signal to sub-pixels in the respective pixel islands to form a three-dimensional image with a plurality of viewpoints.

DETAILED DESCRIPTION OF THE EMBODIMENTS

Figure 1:
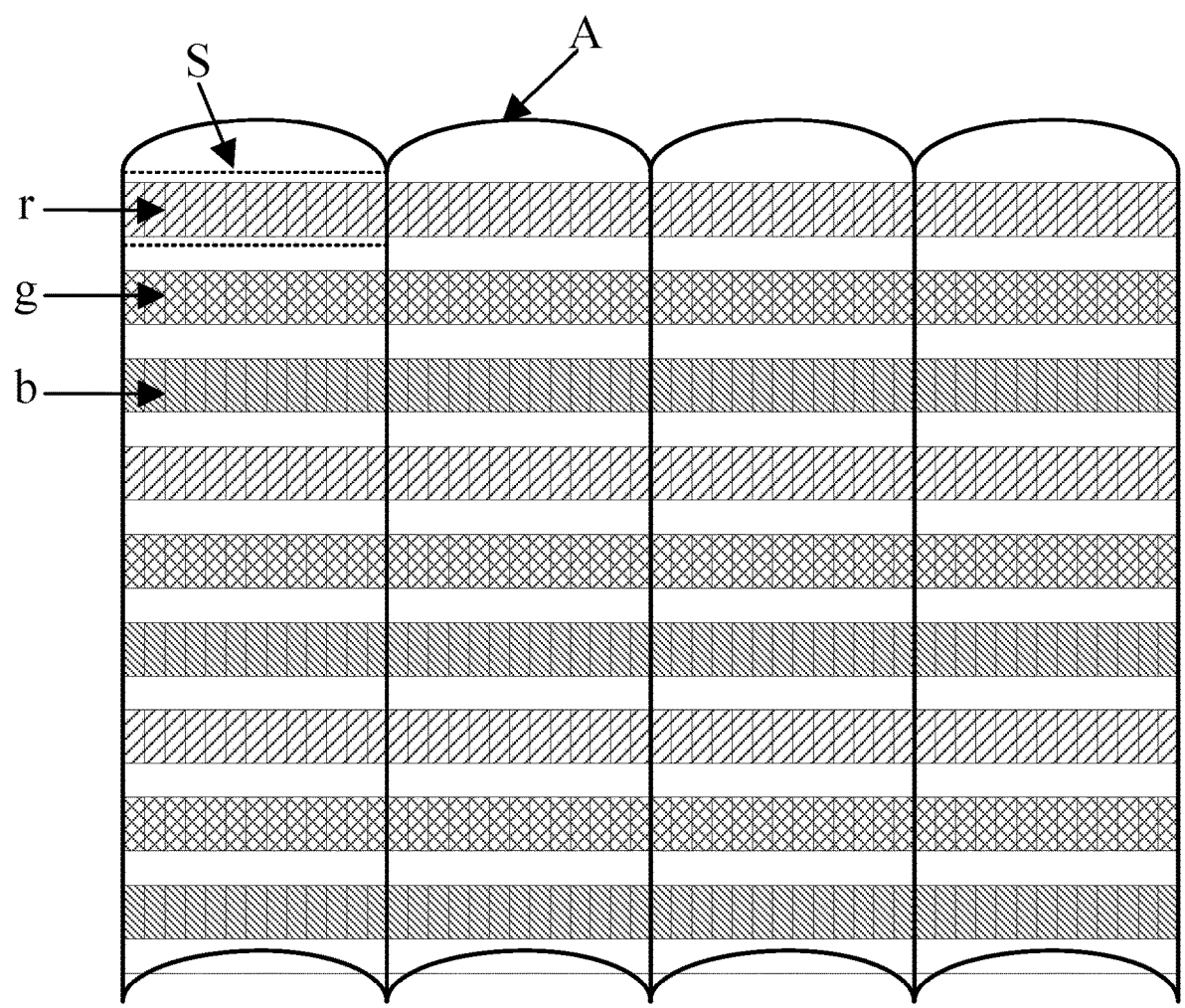
FIG. 1 is a schematic structural diagram of a display apparatus in the related art.

In order to make objectives, technical solutions and advantages of embodiments of the present disclosure clearer, the technical solutions of the embodiments of the present disclosure will be clearly and completely described below in combination with the accompanying drawings of the embodiments of the present disclosure. It should be noted that the sizes and shapes of the figures in the accompanying drawings do not reflect the actual scale, and are only intended to illustrate the present disclosure. The same or similar reference numerals refer to the same or similar elements or elements having the same or similar functions throughout. Apparently, the described embodiments are only some embodiments of the present disclosure, rather than all the embodiments. Based on the embodiments of the present disclosure, all other embodiments obtained by those of ordinary skill in the art without creative efforts fall within the protection scope of the present disclosure.

Unless otherwise defined, technical or scientific terms used herein shall have the ordinary meaning as understood by those of ordinary skill in the art to which the present disclosure belongs. Similar words such as "first" or "second" used in the specification and the claims of the present disclosure do not denote any order, quantity, or importance, but are merely used to distinguish the various components. Similar words such as "comprise" or "include" mean that elements or items appearing before the words encompass elements or items recited after the words and their equivalents, but do not exclude other elements or items. "Inner", "outer", "upper", "lower", etc. are only used to indicate a relative positional relationship, and when an absolute position of a described object changes, the relative positional relationship may also change accordingly.

Figure 2:
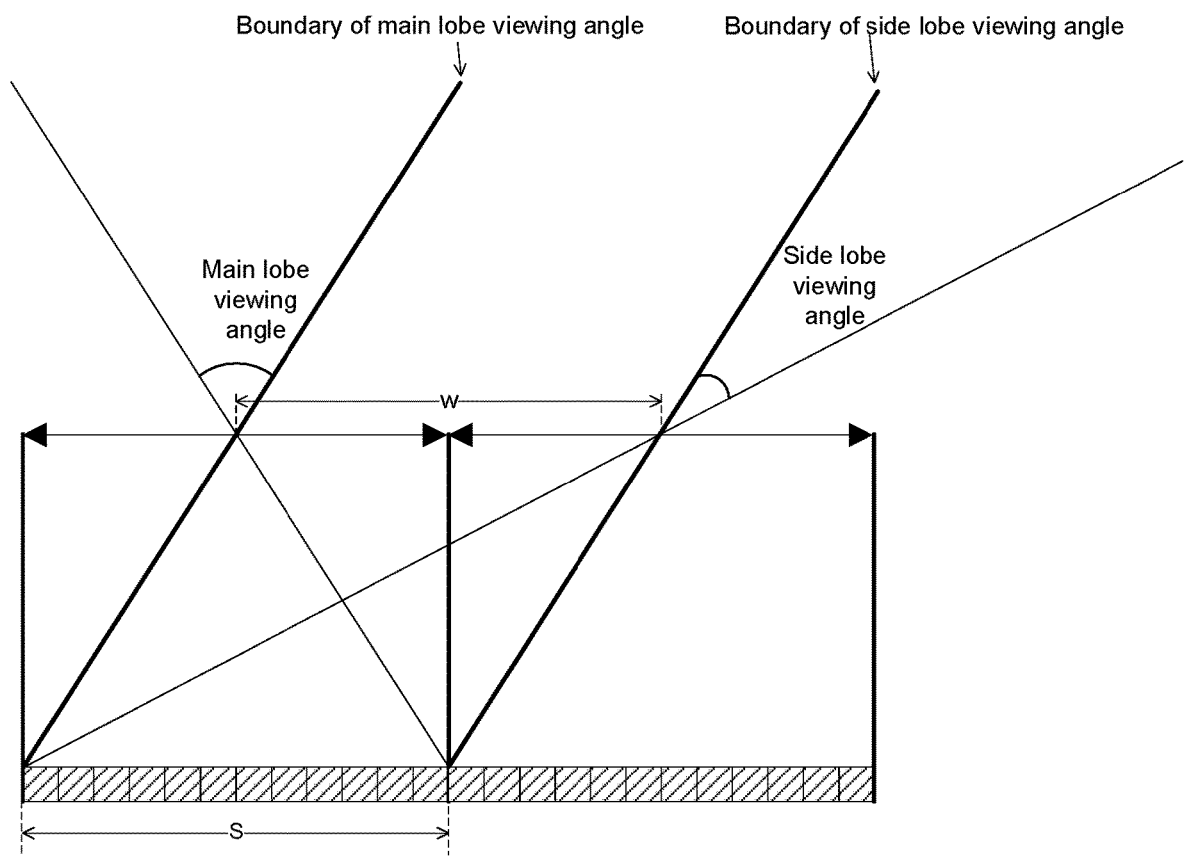
FIG. 2 is a schematic diagram of a light path of light emitted by a pixel island passing a light-splitting structure in the related art.

FIG. 1 shows a display apparatus in the related art. The display apparatus includes a plurality of pixel islands S. Each pixel island S may be divided into a plurality of sub-pixels. Each sub-pixel can be controlled independently. No gap exists between the sub-pixels. Further, as shown in FIG. 2, a main lobe viewing angle and a side lobe viewing angle of an entire pixel island S are closely connected, and continuous light emission can be realized.

However, due to limitation of process capability, the sub-pixels in the pixel island S are not continuously arranged, i.e. gaps exist among the sub-pixels in the pixel island S, so the pixel island S cannot realize continuous light emission, resulting in non-continuous viewing angles. Therefore, a "black region" will be seen at a corresponding position where a gap is projected to a space, which affects a viewing effect.

Figure 3:
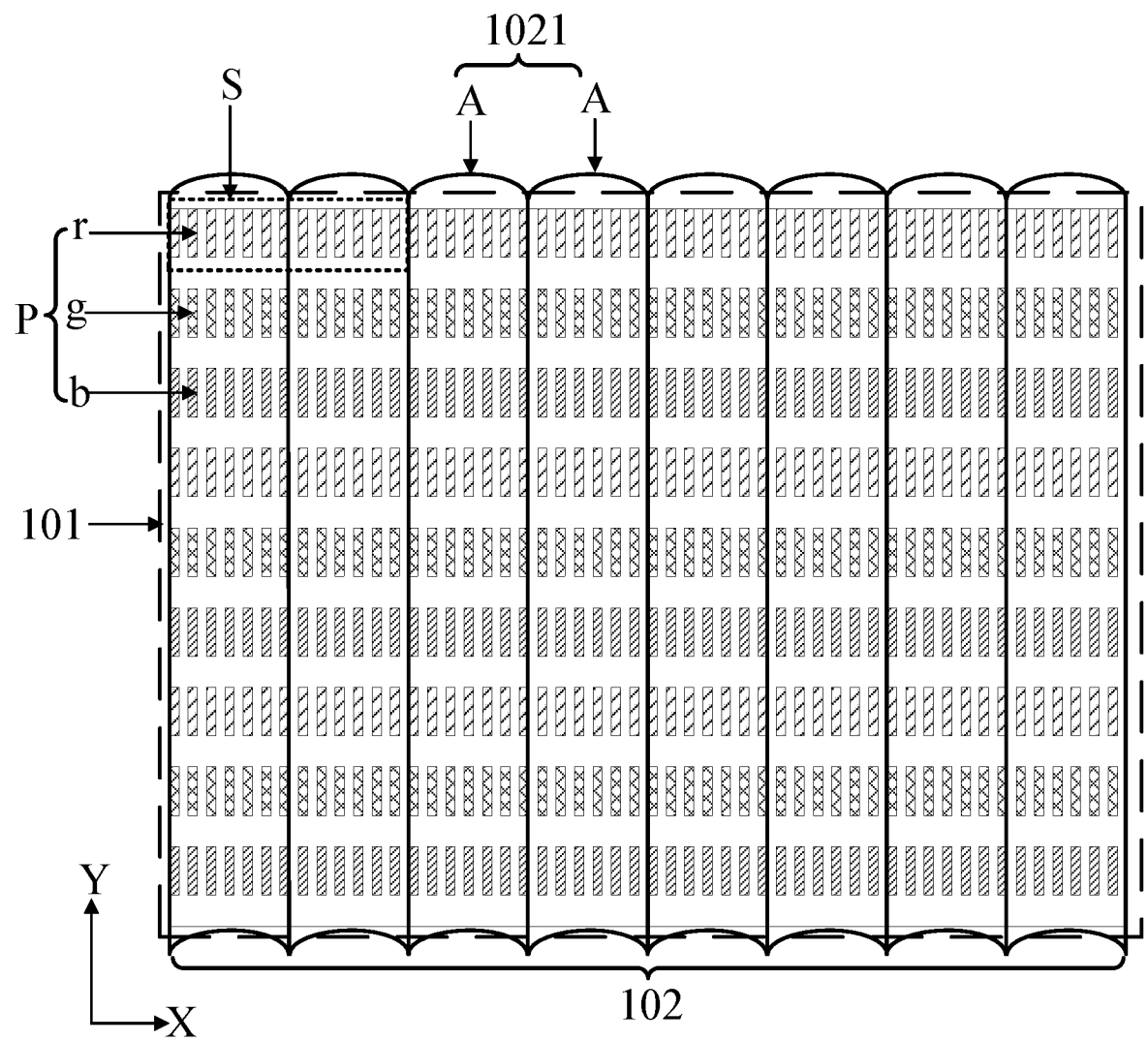
FIG. 3 is a schematic structural diagram of a display apparatus provided by an embodiment of the present disclosure.

For the above technical problem existing in the related art, embodiments of the present disclosure provide a display apparatus, as shown in FIG. 3, including:
  a display panel 101, including: a plurality of pixel islands S arranged at intervals in a row direction X and a column direction Y; each pixel island S being provided with a plurality of sub-pixels arranged at intervals in the row direction X; and
  a light-splitting component 102, disposed on a display side of the display panel 101 and including a plurality of light-splitting structures A extending in the column direction Y and continuously arranged in the row direction X.

In the row direction X, every at least two adjacent light-splitting structures A are one light-splitting repeating unit 1021. Each light-splitting repeating unit 1021 covers one column of the pixel islands S correspondingly. In one of the pixel islands S, relative positions of the sub-pixels to the corresponding light-splitting structures A are complementary.

In the above display apparatus provided by the embodiments of the present disclosure, because each pixel island S is covered with a plurality of light-splitting structures A. The relative positions of the sub-pixels to the corresponding light-splitting structures A above the sub-pixels just form a staggered complementary arrangement mode. The light-splitting structure A is relatively small in pitch, it is impossible for the human eyes to distinguish which light-splitting structure A specifically emits the light, so it appears to the human eye that emergent light of the pixel island S being split through the plurality of light-splitting structures A above it is continuous in space and the human eyes will not see a "black region" in case of spatial movement.

For better understanding of the solution, taking FIG. 4 as an example below; it will be described in detail that the emergent light of the pixel island S passing the plurality of light-splitting structures A above it is continuous in space.

First, continuity of a main lobe viewing angle is described. The main lobe viewing angle refers to a viewing angle formed in space by light emitted by the sub-pixels passing the light-splitting structures A right above them to be split.

Figure 4:
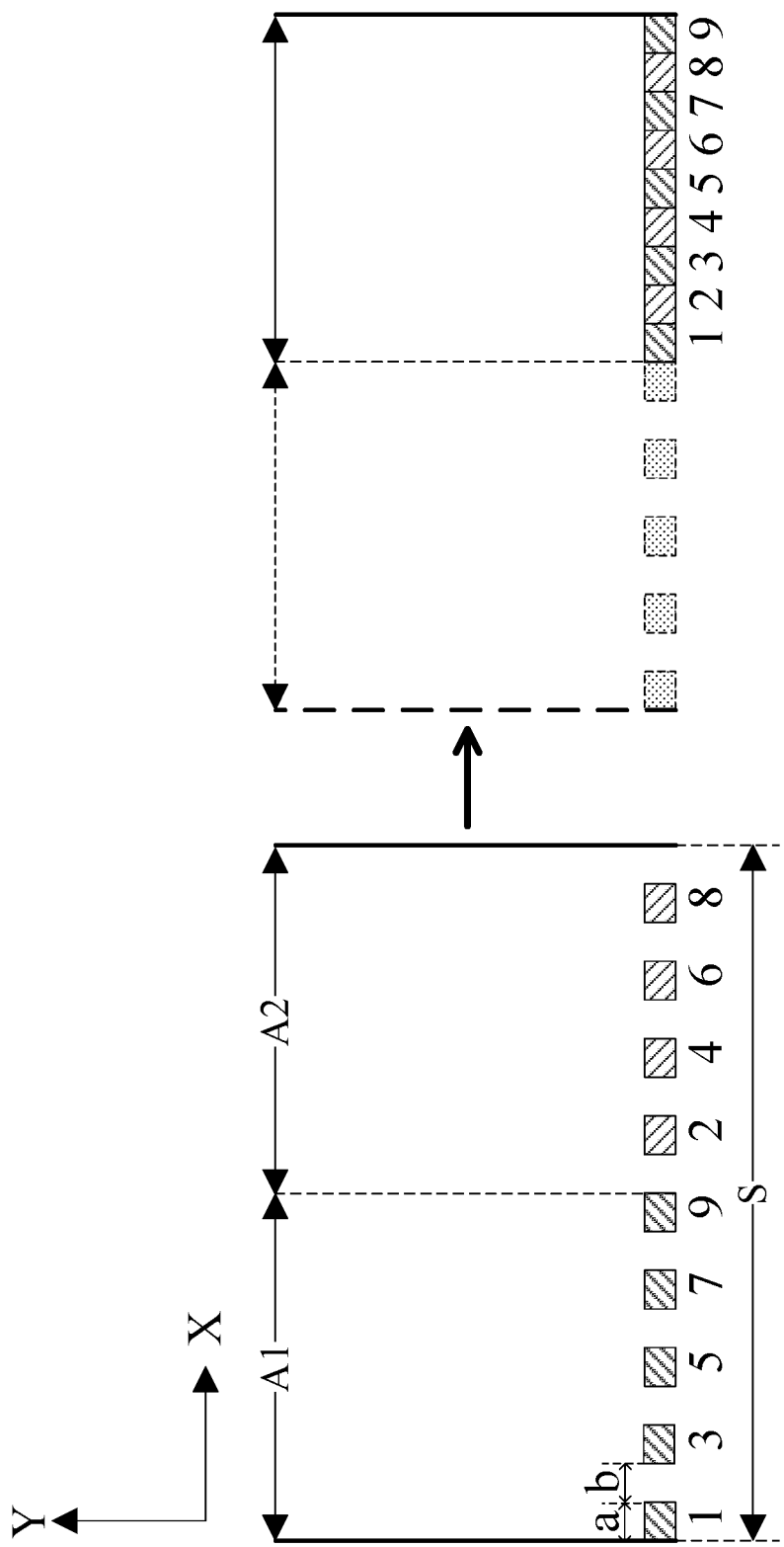
FIG. 4 is a diagram of complementary arrangement of relative positions of sub-pixels in a pixel island and a corresponding light-splitting structure provided by an embodiment of the present disclosure.

It can be seen from FIG. 4 that, one pixel island S includes nine sub-pixels, respectively marked as a first sub-pixel 1, a second sub-pixel 2, a third sub-pixel 3, a fourth sub-pixel 4, a fifth sub-pixel 5, a sixth sub-pixel 6, a seventh sub-pixel 7, an eighth sub-pixel 8 and a ninth sub-pixel 9. One light-splitting repeating unit 1021 corresponding to the pixel island S includes two light-splitting structures A, respectively marked as a first light-splitting structure A1 and a second light-splitting structure A2. The first light-splitting structure A1 covers the first sub-pixel 1, the third sub-pixel 3, the fifth sub-pixel 5, the seventh sub-pixel 7 and the ninth sub-pixel 9, and the second light-splitting structure A2 covers the second sub-pixel 2, the fourth sub-pixel 4, the sixth sub-pixel 6 and the eighth sub-pixel 8. It can be seen from FIG. 4 that the relative positions of the first sub-pixel 1, the third sub-pixel 3, the fifth sub-pixel 5, the seventh sub-pixel 7 and the ninth sub-pixel 9 to the first light-splitting structure A1 are exactly located in gaps among the relative positions of the second sub-pixel 2, the fourth sub-pixel 4, the sixth sub-pixel 6 and the eighth sub-pixel 8 to the second light-splitting structure A2, thus forming a staggered complementary arrangement mode.

Figure 5:
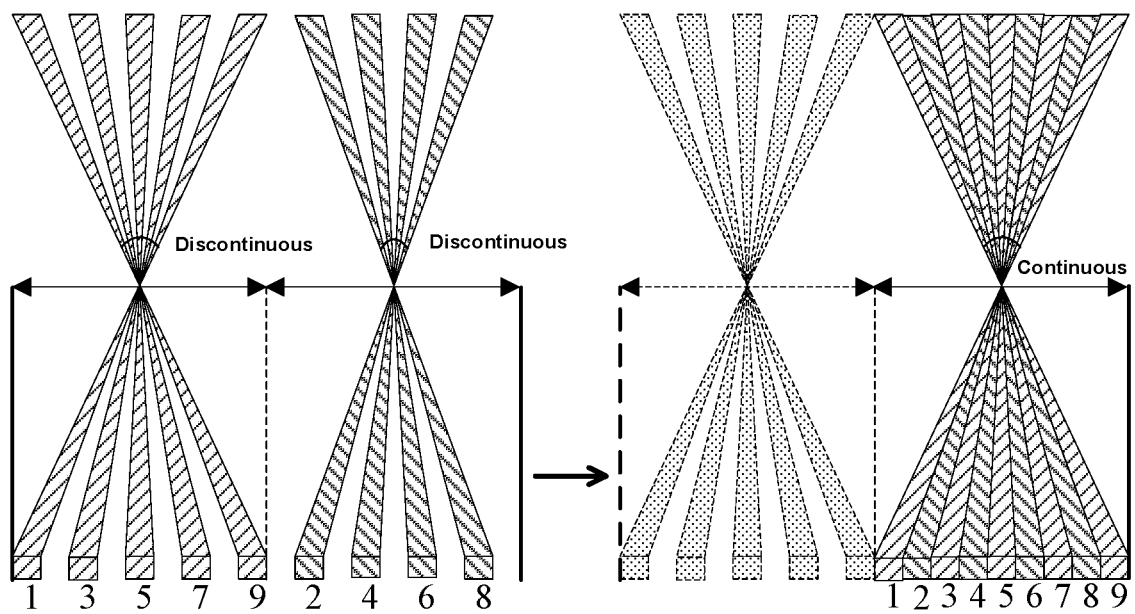
FIG. 5 is a schematic diagram of continuous light emission of a main lobe viewing angle of the pixel island shown in FIG. 4.

Light emission distribution after light emitted by each of the first sub-pixel 1, the third sub-pixel 3, the fifth sub-pixel 5, the seventh sub-pixel 7 and the ninth sub-pixel 9 is split by the first light-splitting structure A1 directly above them and the light output distribution after light emitted by the second sub-pixel 2, the fourth sub-pixel 4, the sixth sub-pixel 6 and the eighth sub-pixel 8 is split by the second light-splitting structure A2 directly above them are as shown in FIG. 5. Since there are gaps between the first sub-pixel 1 to the ninth sub-pixel 9, the light emitted by adjacent sub-pixels after passing through the same light-splitting structure A is discontinuous in space. Relative positions of sub-pixels in the same pixel island S to the two light-splitting structures A are in a staggered complementary relationship, so light emitting angles of the two light-splitting structures A are also complementary in a staggered mode. Due to small pitch of the light-splitting structure A, it is impossible for the human eyes to distinguish which light-splitting structure A specifically emits the light. Therefore, it appears to the human eye that the emergent light of each pixel island S being split by the plurality of light-splitting structures A above it is continuous in space and the human eyes will not see a "black region" in case of spatial movement.

Figure 6:
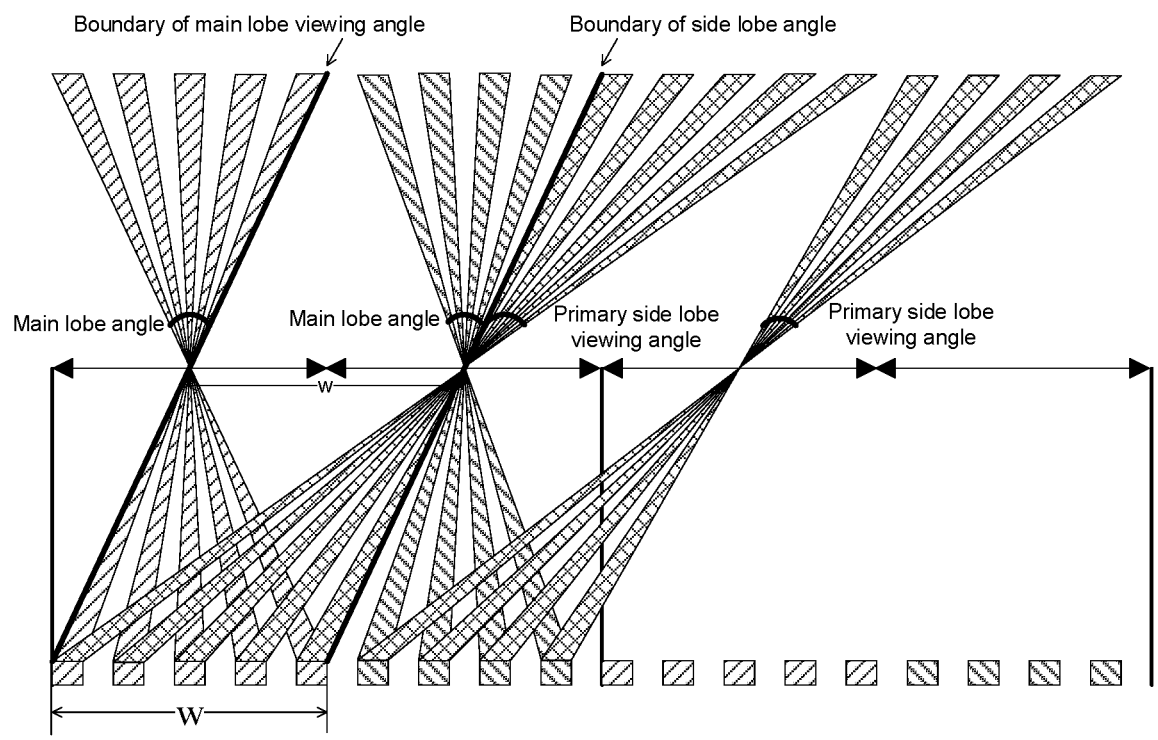
FIG. 6 is a schematic diagram of continuous light emission of a main lobe viewing angle and a side lobe viewing angle of the pixel island shown in FIG. 4.

Then, continuity of the main lobe viewing angle and the side lobe viewing angle is described. The side lobe viewing angle refers to a viewing angle formed in space by light emitted by the sub-pixels passing the light-splitting structures A adjacent to the light-splitting structure A right above them. For example a viewing angle formed by light passing a first light-splitting structure A (such as the second light-splitting structure A2) adjacent to the light-splitting structure A right above (such as the first light-splitting structure A1) is a primary side lobe viewing angle, and a viewing angle formed by light passing a second light-splitting structure A adjacent to the light-splitting structure A right above is a secondary side lobe viewing angle, etc. Similar to the above-mentioned continuity of the main lobe viewing angle, two discontinuous primary side lobe viewing angles of the pixel island S passing the adjacent light-splitting structures A may be complementary to be one continuous primary side lobe viewing angle. Pitches of the first light-splitting structure A1 and the second light-splitting structure A2 each is equal to ½ of a pitch of the pixel island S, so a boundary of the main lobe viewing angle and a boundary of the side lobe viewing angle are definitely parallel, and a distance between the two boundaries is equal to the pitch of the pixel island S, as shown in FIG. 6. Since the human eyes cannot distinguish a distance between the boundary of the main lobe viewing angle and the boundary of the side lobe viewing angle, it is observed that the main lobe viewing angle and the side lobe viewing angle are also continuous. In the same way, the primary side lobe viewing angle and the secondary side lobe viewing angle are also continuous, the secondary side lobe viewing angle and a tertiary side lobe viewing angle are also continuous, and so on. In this way, a continuous viewing angle is obtained. In theory, the viewing angle of the pixel island S can reach 180°.

It can be seen from the above description that, in the above display apparatus provided by the embodiments of the present disclosure, each light-splitting structure A is configured to enable light emitted by all sub-pixels covered by the light-splitting structure A to form the main lobe viewing angle, and enable light emitted by all sub-pixels covered by an adjacent light-splitting structure A to form the side lobe viewing angle. The shortest distance between the boundary of the main lobe viewing angle and the boundary of the side lobe viewing angle is equal to the width of the light-splitting structure A in the row direction X, and the shortest distance between boundaries of any two adjacent side lobe viewing angles is equal to the width of the light-splitting structure A in the row direction X.

In addition, because sub-pixel sub-division is performed in the pixel island S (which may server as a sub pixel in 2D display), a same resolution as 2D display may be maintained under a 3D display mode, and multi-viewpoint display of a large viewing angle can be realized in combination of eye-tracking. Further, compared with other solutions in the related art that 3D display is performed by taking sub pixel as a unit, the above solution can realize 3D display of more pixels per inch (ppi), a larger amount of information and lower color interference between adjacent viewpoints.

Figure 7:
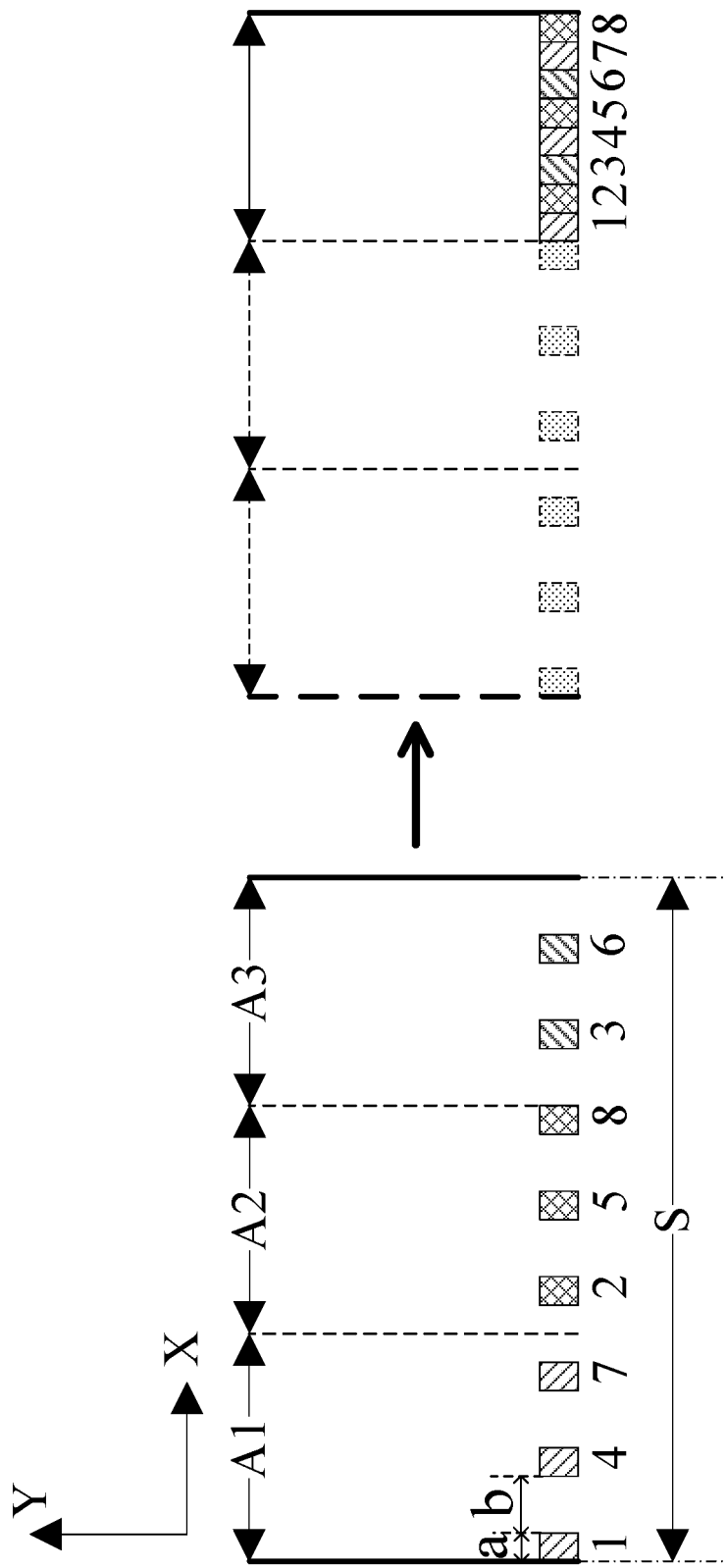
FIG. 7 is another diagram of complementary arrangement of relative positions of sub-pixels in a pixel island and a corresponding light-splitting structure provided by an embodiment of the present disclosure.

Optionally, in the above display apparatus provided by the embodiments of the present disclosure, as shown in FIG. 4 and FIG. 7, in one pixel island S, the relative positions of all the sub-pixels to the corresponding light-splitting structures A are continuously arranged in the row direction X, so that emergent light emitted by the sub-pixels in the pixel island S is continuous in space after passing the corresponding light-splitting structures A.

Optionally, in the above display apparatus provided by the embodiments of the present disclosure, in a horizontal direction X, a width of the light-splitting structure A is equal to 1/m of a width of the corresponding pixel island S. m is a total quantity of the light-splitting structures A in one of the light-splitting repeating units 201. For example, in FIG. 4, a light-splitting repeating unit 201 has two light-splitting structures A, namely a first light-splitting structure A1 and a second light-splitting structure A2, and the widths of the first light-splitting structure A1 and the second light-splitting structure A2 each is equal to ½ of the width of the pixel island S. In FIG. 7, a light-splitting repeating unit 201 has three light-splitting structures A, namely a first light-splitting structure A1, a second light-splitting structure A2 and a third light-splitting structure A3, and the widths of the first light-splitting structure A1, the second light-splitting structure A2 and the third light-splitting structure A3 each is equal to ⅓ of the width of the pixel island S. In this way, the sub-pixels below each light-splitting repeating unit 201 may be arranged complementary in a staggered mode to each other relative to the position of the corresponding light-splitting structures A.

Optionally, in the above display apparatus provided by the embodiments of the present disclosure, the pixel island S includes m*N+k sub-pixels, N is an integer larger than or equal to 2, k is an integer larger than or equal to 1, and no common divisor of k and m exits other than 1. In the row direction X, a ratio of a width 'a' of a sub-pixel to a width 'b' of a gap between two adjacent sub-pixels is larger than or equal to 0.95/(m−1) and smaller than or equal to 1.05/(m−1). In some embodiments, a/b equals to 1/(m−1), so the larger the quantity 'm' of the light-splitting structures A covered on each pixel island S is, the larger the gap between two adjacent sub-pixels is. In this way, the sub-pixels under each light-splitting repeating unit 201 may be staggered and complementary relative to the corresponding light-splitting structures A, and defect of moiré patterns caused by excessively large widths of the sub-pixels may further be avoided.

Exemplarily, as shown in FIG. 4, m is 2, N is 4, k is 1, the pixel island S includes nine sub-pixels, and the ratio of the width 'a' of each sub-pixel to the width 'b' of the gap between the adjacent two sub-pixels is 1:1 (namely, a proportion of opening widths of the sub-pixels is 50%). In one light-splitting repeating unit 201, one light-splitting structure A (for example, the first light-splitting structure A1) correspondingly covers 5 sub-pixels, and the other light-splitting structure A (for example, the second light-splitting structure A2) correspondingly covers 4 sub-pixels.

As shown in FIG. 7, m is 3, N is 2, k is 2, each pixel island S includes eight sub-pixels, and the ratio of the width 'a' of each sub-pixel to the width 'b' of the gap of two adjacent sub-pixels is 1:2 (namely, the proportion of the opening widths of the sub-pixels is ⅓). In one light-splitting repeating unit 201, the first light-splitting structure A1 correspondingly covers three sub-pixels (respectively the first sub-pixel 1, the fourth sub-pixel 4, and the seventh sub-pixel 7), the second light-splitting structure A2 correspondingly covers three sub-pixels (respectively the second sub-pixel 2, the fifth sub-pixel 5 and the eighth sub-pixel 8), and the third light-splitting structure A3 correspondingly covers two sub-pixels (respectively the third sub-pixel 3 and the sixth sub-pixel 6).

Figure 8:
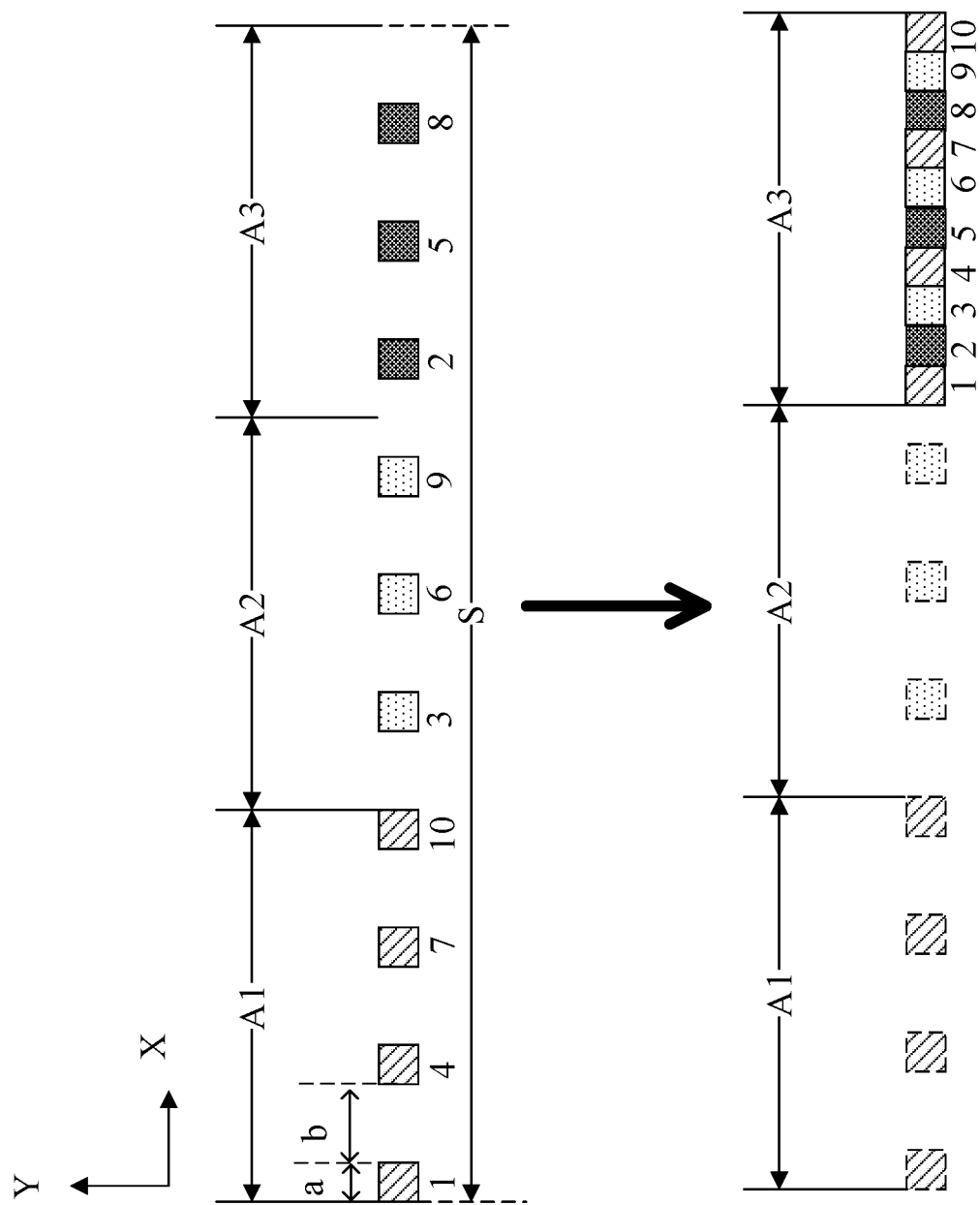
FIG. 8 is yet another diagram of complementary arrangement of relative positions of sub-pixels in a pixel island and a corresponding light-splitting structure provided by an embodiment of the present disclosure.

As shown in FIG. 8, m is 3, N is 3, k is 1, each pixel island S includes ten sub-pixels, and the ratio of the width 'a' of each sub-pixel to the width 'b' of the gap of two adjacent sub-pixels is 1:2 (namely, the proportion of the opening widths of the sub-pixels is ⅓). In one light-splitting repeating unit 201, the first light-splitting structure A1 correspondingly covers four sub-pixels (respectively the first sub-pixel 1, the fourth sub-pixel 4, the seventh sub-pixel 7 and a tenth sub-pixel 10), the second light-splitting structure A2 correspondingly covers three sub-pixels (respectively the third sub-pixel 3, the sixth sub-pixel 6 and the ninth sub-pixel 9), and the third light-splitting structure A3 correspondingly covers three sub-pixels (respectively the second sub-pixel 2, the fifth sub-pixel 5 and the eighth sub-pixel 8).

Figure 9:
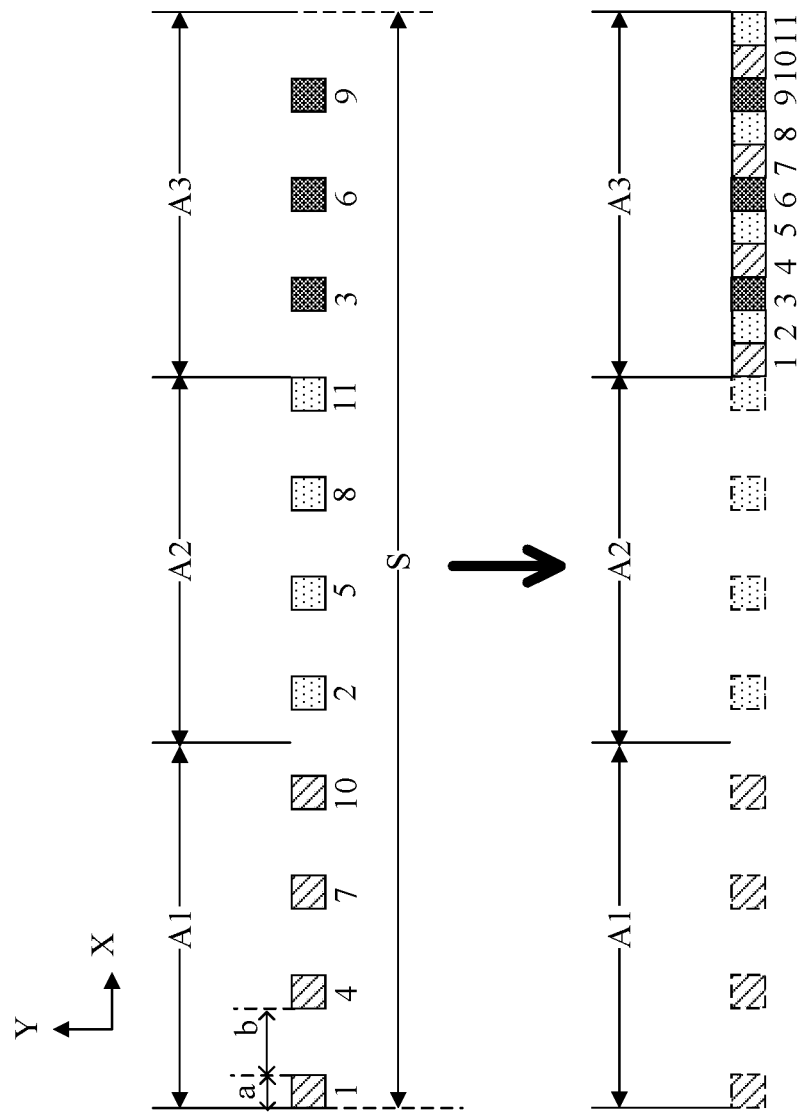
FIG. 9 is yet another diagram of complementary arrangement of relative positions of sub-pixels in a pixel island and a corresponding light-splitting structure provided by an embodiment of the present disclosure.

As shown in FIG. 9, m is 3, N is 3, k is 2, each pixel island S includes eleven sub-pixels, and the ratio of the width 'a' of each sub-pixel to the width 'b' of the gap of two adjacent sub-pixels is 1:2 (namely, the proportion of the opening widths of the sub-pixels is ⅓). In one light-splitting repeating unit 201, the first light-splitting structure A1 correspondingly covers four sub-pixels (respectively the first sub-pixel 1, the fourth sub-pixel 4, the seventh sub-pixel 7 and the tenth sub-pixel 10), the second light-splitting structure A2 correspondingly covers four sub-pixels (respectively the second sub-pixel 2, the fifth sub-pixel 5, the eighth sub-pixel 8, and an eleventh sub-pixel 11), and the third light-splitting structure A3 correspondingly covers three sub-pixels (respectively the third sub-pixel 3, the sixth sub-pixel 6 and the ninth sub-pixel 9).

Figure 10:
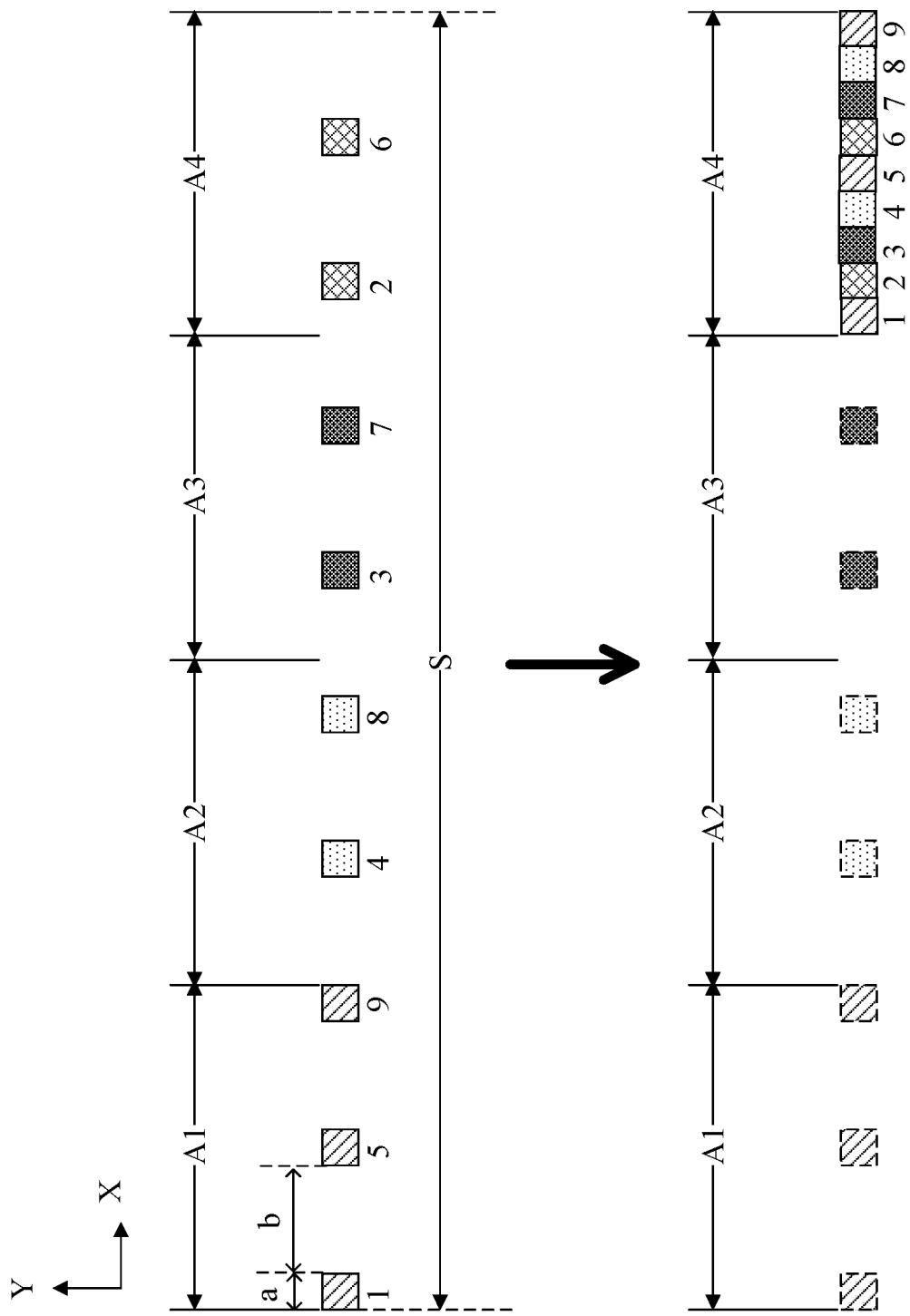
FIG. 10 is yet another diagram of complementary arrangement of relative positions of sub-pixels in a pixel island and a corresponding light-splitting structure provided by an embodiment of the present disclosure.

As shown in FIG. 10, m is 4, N is 2, k is 1, each pixel island S includes nine sub-pixels, and the ratio of the width 'a' of each sub-pixel to the width 'b' of the gap of two adjacent sub-pixels is 1:3 (namely, the proportion of the opening widths of the sub-pixels is ¼). In one light-splitting repeating unit 201, the first light-splitting structure A1 correspondingly covers three sub-pixels (respectively, the first sub-pixel 1, the fifth sub-pixel 5, and the ninth sub-pixel 9), the second light-splitting structure A2 correspondingly covers two sub-pixels (respectively the fourth sub-pixel 4 and the eighth sub-pixel 8), the third light-splitting structure A3 correspondingly covers two sub-pixels (respectively the third sub-pixel 3 and the seventh sub-pixel 7) and a fourth light-splitting structure A4 correspondingly covers two sub-pixels (respectively the second sub-pixel 2 and the sixth sub-pixel 6).

Figure 11:
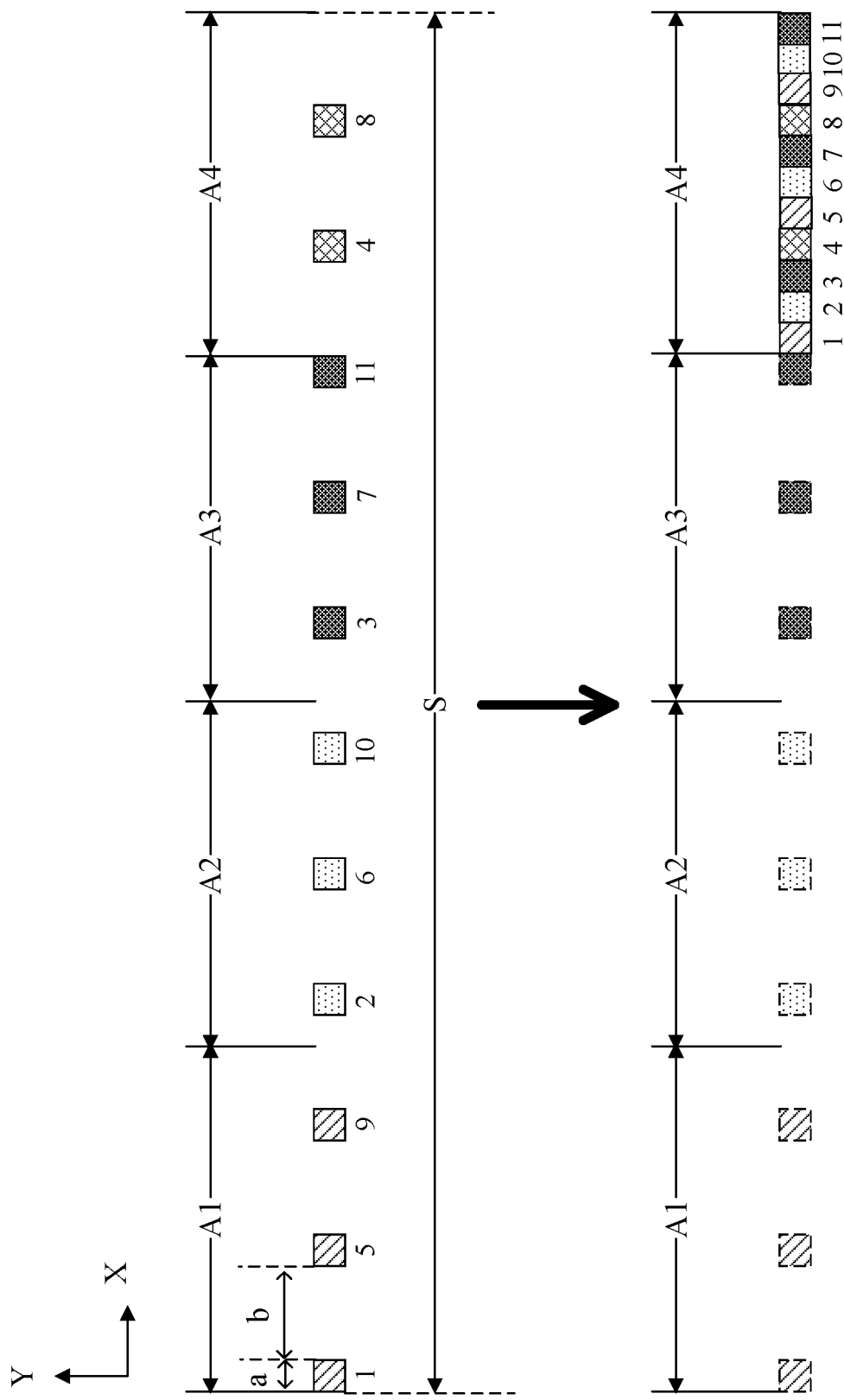
FIG. 11 is yet another diagram of complementary arrangement of relative positions of sub-pixels in a pixel island and a corresponding light-splitting structure provided by an embodiment of the present disclosure.

As shown in FIG. 11, m is 4, N is 2, k is 3, each pixel island S includes eleven sub-pixels, and the ratio of the width 'a' of each sub-pixel to the width 'b' of the gap of two adjacent sub-pixels is 1:3 (namely, the proportion of the opening widths of the sub-pixels is ¼). In one light-splitting repeating unit 201, the first light-splitting structure A1 correspondingly covers three sub-pixels (respectively the first sub-pixel 1, the fifth sub-pixel 5, and the ninth sub-pixel 9), the second light-splitting structure A2 correspondingly covers three sub-pixels (respectively the second sub-pixel 2, the sixth sub-pixel 6 and the tenth sub-pixel 10), the third light-splitting structure A3 correspondingly covers three sub-pixels (respectively the third sub-pixel 3, the seventh sub-pixel 7 and the eleventh sub-pixel 11) and the fourth light-splitting structure A4 correspondingly covers two sub-pixels (respectively the fourth sub-pixel 4 and the eighth sub-pixel 8).

Figure 12:
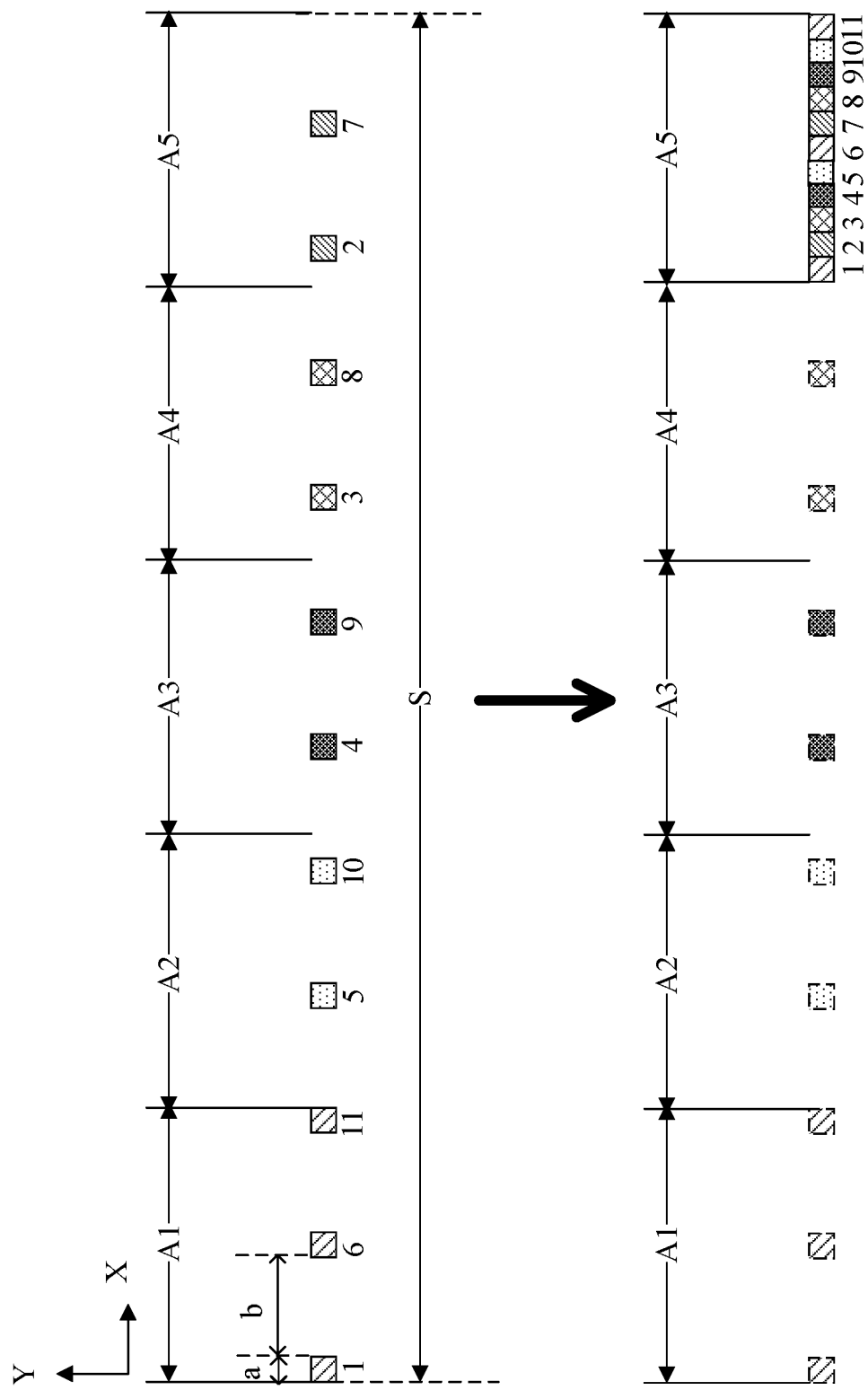
FIG. 12 is yet another diagram of complementary arrangement of relative positions of sub-pixels in a pixel island and a corresponding light-splitting structure provided by an embodiment of the present disclosure.

As shown in FIG. 12, m is 5, N is 2, k is 1, each pixel island S includes eleven sub-pixels, and the ratio of the width 'a' of each sub-pixel to the width 'b' of the gap of two adjacent sub-pixels is 1:4 (namely, the proportion of the opening widths of the sub-pixels is ⅕). In one light-splitting repeating unit 201, the first light-splitting structure A1 correspondingly covers three sub-pixels (respectively, the first sub-pixel 1, the sixth sub-pixel 6 and the eleventh sub-pixel 11), the second light-splitting structure A2 correspondingly covers two sub-pixels (respectively the fifth sub-pixel 5 and the tenth sub-pixel 10), the third light-splitting structure A3 correspondingly covers two sub-pixels (respectively the fourth sub-pixel 4 and the ninth sub-pixel 9), the fourth light-splitting structure A4 correspondingly covers two sub-pixels (respectively the third sub-pixel 3 and the eighth sub-pixel 8) and a fifth light-splitting structure A5 correspondingly covers two sub-pixels (respectively the second sub-pixel 2 and the seventh sub-pixel 7).

Figure 13:
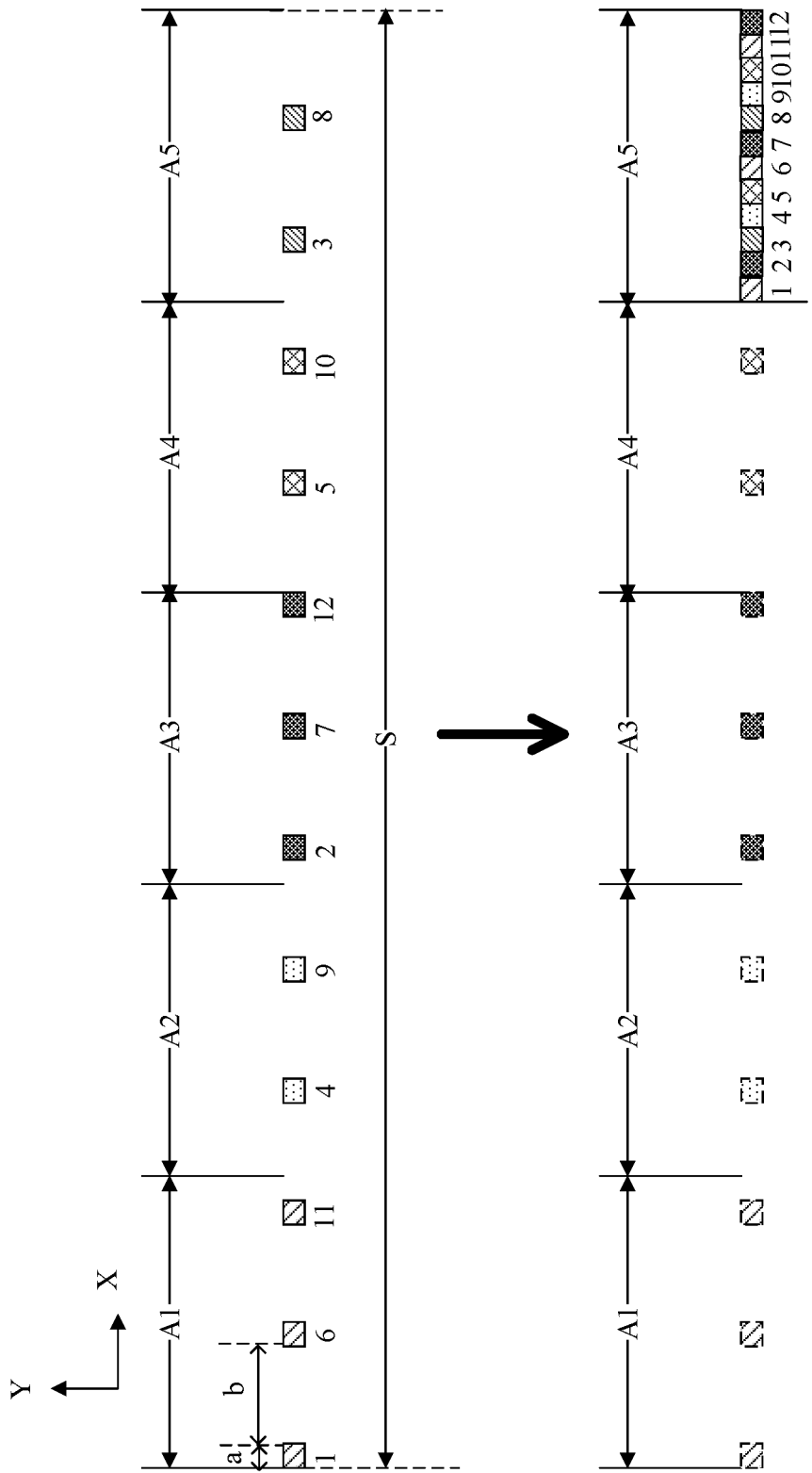
FIG. 13 is yet another diagram of complementary arrangement of relative positions of sub-pixels in a pixel island and a corresponding light-splitting structure provided by an embodiment of the present disclosure.

As shown in FIG. 13, m is 5, N is 2, k is 2, each pixel island S includes twelve sub-pixels, and the ratio of the width 'a' of each sub-pixel to the width 'b' of the gap of two adjacent sub-pixels is 1:4 (namely, the proportion of the opening widths of the sub-pixels is ⅕). In one light-splitting repeating unit 201, the first light-splitting structure A1 correspondingly covers three sub-pixels (respectively the first sub-pixel 1, the sixth sub-pixel 6 and the eleventh sub-pixel 11), the second light-splitting structure A2 correspondingly covers two sub-pixels (respectively the fourth sub-pixel 4 and the ninth sub-pixel 9), the third light-splitting structure A3 correspondingly covers three sub-pixels (respectively the second sub-pixel 4, the seventh sub-pixel 7 and a twelfth sub-pixel 12), the fourth light-splitting structure A4 correspondingly covers two sub-pixels (respectively the fifth sub-pixel 5 and the tenth sub-pixel 10) and the fifth light-splitting structure A5 correspondingly covers two sub-pixels (respectively, the third sub-pixel 3 and the eighth sub-pixel 8).

Figure 14:
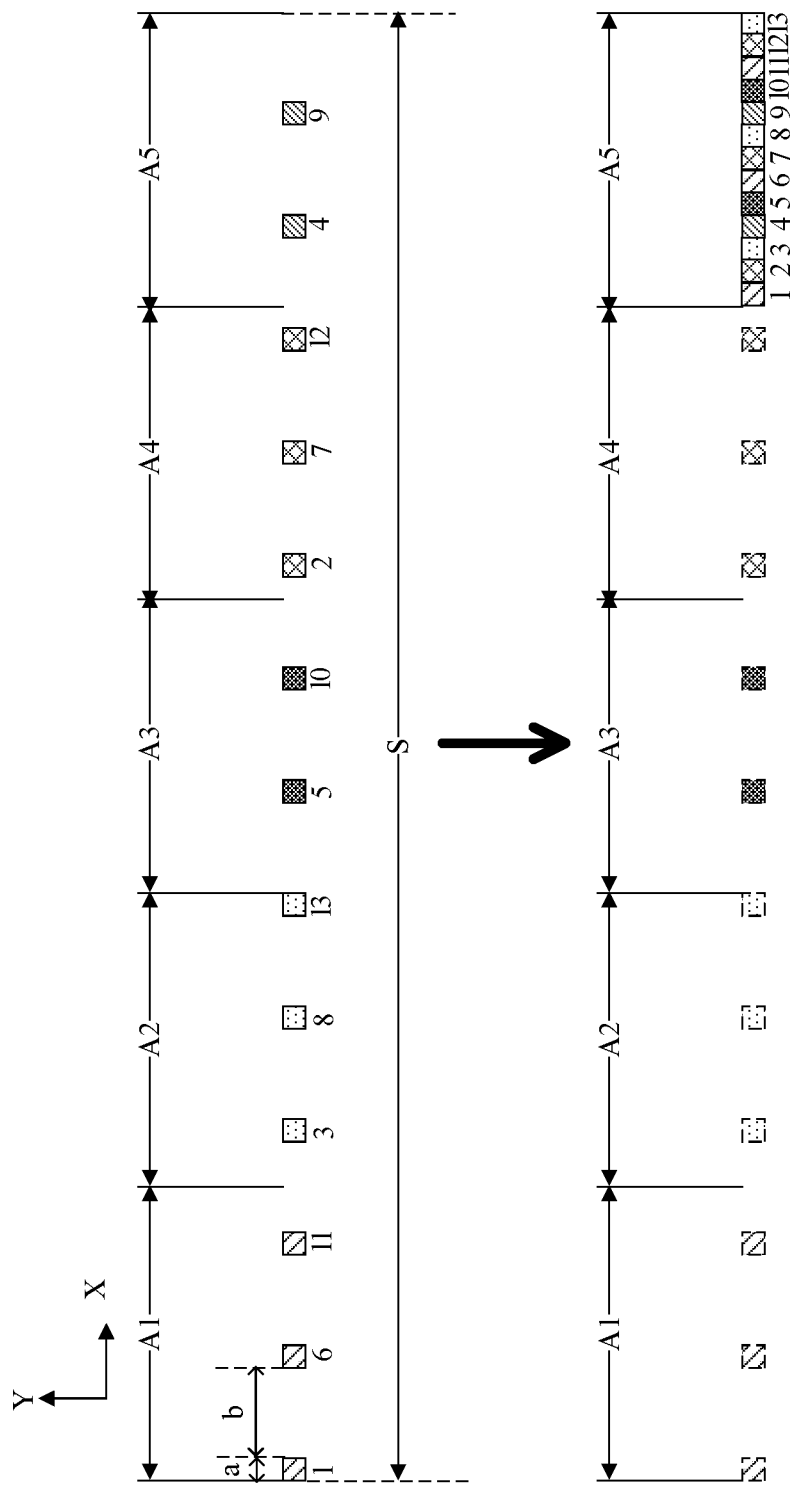
FIG. 14 is yet another diagram of complementary arrangement of relative positions of sub-pixels in a pixel island and a corresponding light-splitting structure provided by an embodiment of the present disclosure.

As shown in FIG. 14, m is 5, N is 2, k is 3, each pixel island S includes thirteen sub-pixels, and the ratio of the width 'a' of each sub-pixel to the width 'b' of the gap of two adjacent sub-pixels is 1:4 (namely, the proportion of the opening widths of the sub-pixels is ⅕). In one light-splitting repeating unit 201, the first light-splitting structure A1 correspondingly covers three sub-pixels (respectively the first sub-pixel 1, the sixth sub-pixel 6 and the eleventh sub-pixel 11), the second light-splitting structure A2 correspondingly covers three sub-pixels (respectively the third sub-pixel 3, the eighth sub-pixel 8 and a thirteenth sub-pixel 13), the third light-splitting structure A3 correspondingly covers two sub-pixels (respectively the fifth sub-pixel 5 and the tenth sub-pixel 10), the fourth light-splitting structure A4 correspondingly covers three sub-pixels (respectively the second sub-pixel 2, the seventh sub-pixel 7 and the twelfth sub-pixel 12) and the fifth light-splitting structure A5 correspondingly covers two sub-pixels (respectively the fourth sub-pixel 4 and the ninth sub-pixel 9).

Figure 15:
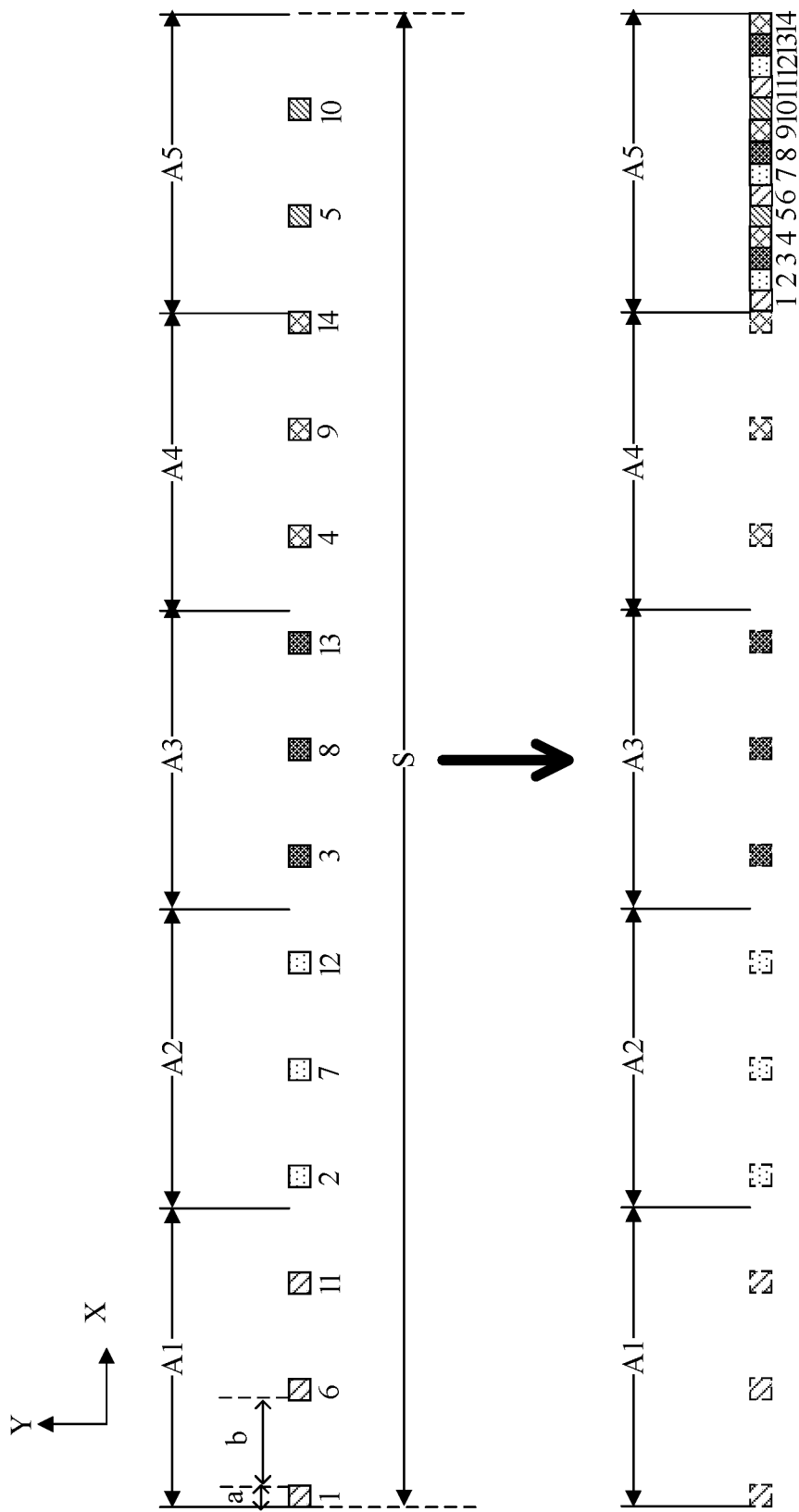
FIG. 15 is yet another diagram of complementary arrangement of relative positions of sub-pixels in a pixel island and a corresponding light-splitting structure provided by an embodiment of the present disclosure.

As shown in FIG. 15, m is 5, N is 2, k is 4, each pixel island S includes fourteen sub-pixels, and the ratio of the width 'a' of each sub-pixel to the width 'b' of the gap of two adjacent sub-pixels is 1:4 (namely, the proportion of the opening widths of the sub-pixels is ⅕). In one light-splitting repeating unit 201, the first light-splitting structure A1 correspondingly covers three sub-pixels (respectively, the first sub-pixel 1, the sixth sub-pixel 6 and the eleventh sub-pixel 11), the second light-splitting structure A2 correspondingly covers three sub-pixels (respectively the second sub-pixel 2, the seventh sub-pixel 7 and the twelfth sub-pixel 12), the third light-splitting structure A3 correspondingly covers three sub-pixels (respectively the third sub-pixel 3, the eighth sub-pixel 8 and the thirteenth sub-pixel 13), the fourth light-splitting structure A4 correspondingly covers three sub-pixels (respectively the fourth sub-pixel 4, the ninth sub-pixel 9 and a fourteenth sub-pixel 14) and the fifth light-splitting structure A5 correspondingly covers two sub-pixels (respectively the fifth sub-pixel 5 and the tenth sub-pixel 10).

Figure 16:
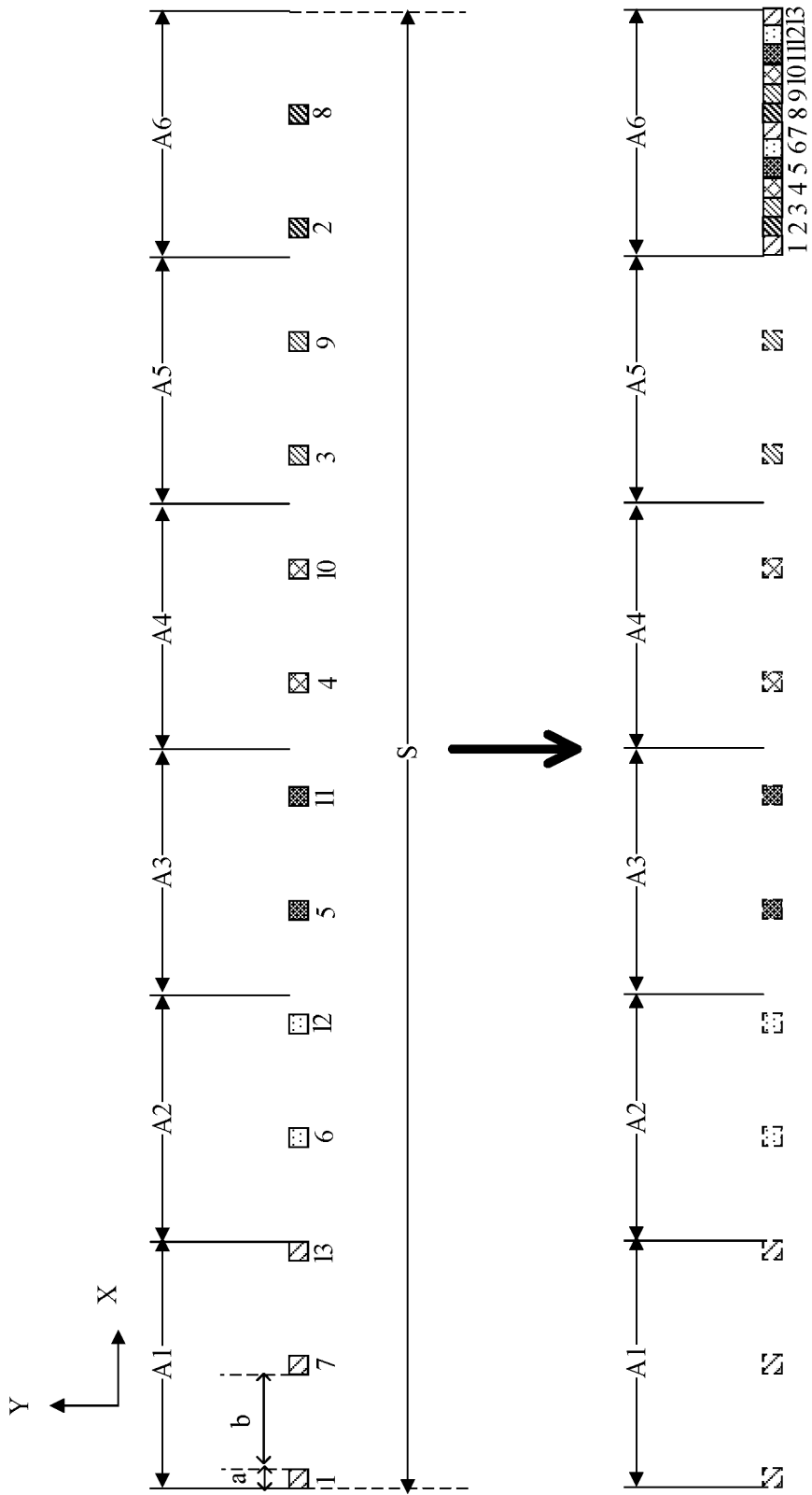
FIG. 16 is yet another diagram of complementary arrangement of relative positions of sub-pixels in a pixel island and a corresponding light-splitting structure provided by an embodiment of the present disclosure.

As shown in FIG. 16, m is 6, N is 2, k is 1, each pixel island S includes thirteen sub-pixels, and the ratio of the width 'a' of each sub-pixel to the width 'b' of the gap of two adjacent sub-pixels is 1:5 (namely, the proportion of the opening widths of the sub-pixels is ⅙). In one light-splitting repeating unit 201, the first light-splitting structure A1 correspondingly covers three sub-pixels (respectively the first sub-pixel 1, the seventh sub-pixel 7 and the thirteenth sub-pixel 13), the second light-splitting structure A2 correspondingly covers two sub-pixels (respectively the sixth sub-pixel 6 and the twelfth sub-pixel 12), the third light-splitting structure A3 correspondingly covers two sub-pixels (respectively the fifth sub-pixel 5 and the eleventh sub-pixel 11), the fourth light-splitting structure A4 correspondingly covers two sub-pixels (respectively the fourth sub-pixel 4 and the tenth sub-pixel 10), the fifth light-splitting structure A5 correspondingly covers two sub-pixels (respectively the third sub-pixel 3 and the ninth sub-pixel 9) and a sixth light-splitting structure A6 correspondingly covers two sub-pixels (respectively the second sub-pixel 2 and the eighth sub-pixel 8).

Figure 17:
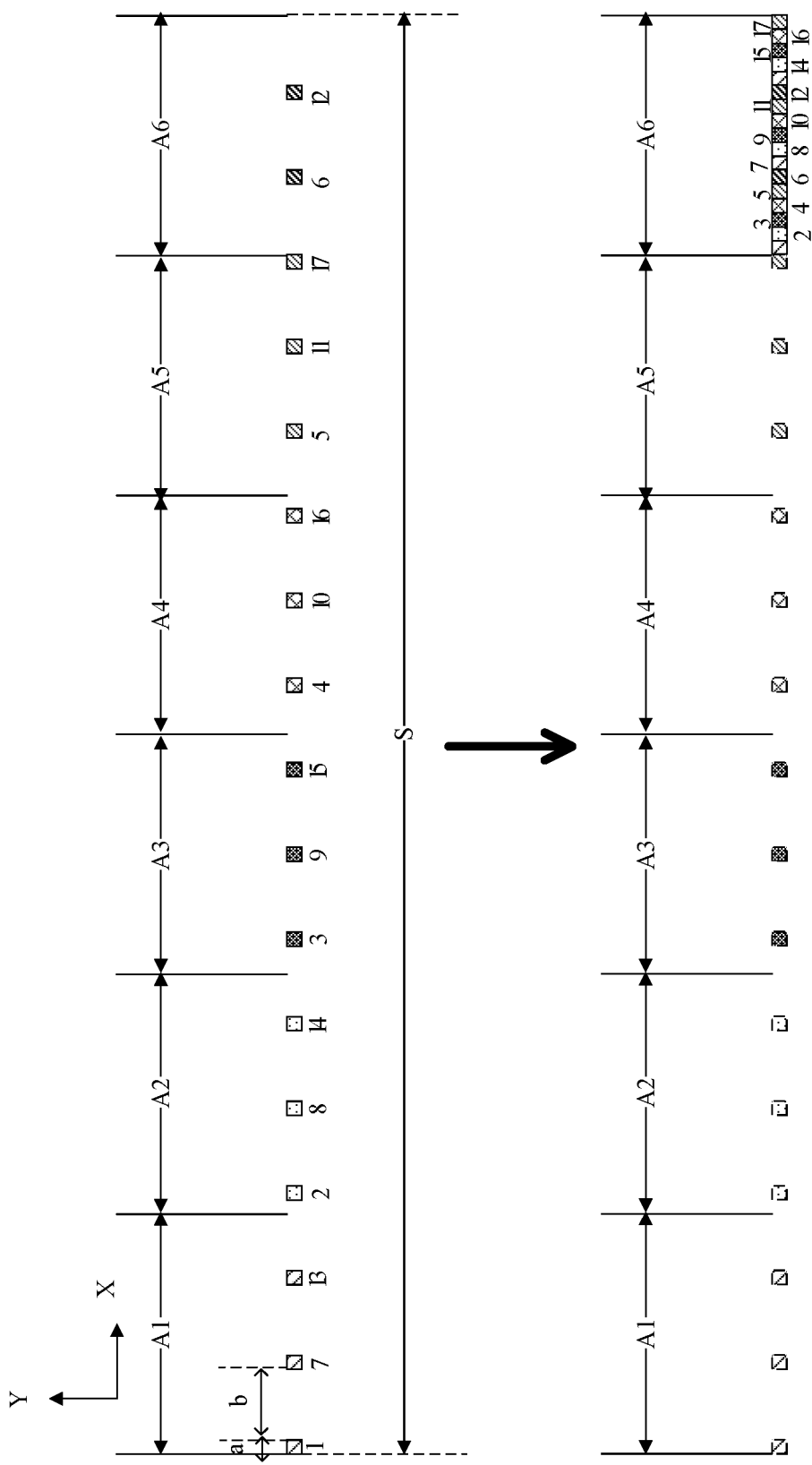
FIG. 17 is yet another diagram of complementary arrangement of relative positions of sub-pixels in a pixel island and a corresponding light-splitting structure provided by an embodiment of the present disclosure.

As shown in FIG. 17, m is 6, N is 2, k is 5, each pixel island S includes seventeen sub-pixels, and the ratio of the width 'a' of each sub-pixel to the width 'b' of the gap of two adjacent sub-pixels is 1:5 (namely, the proportion of the opening widths of the sub-pixels is ⅙). In one light-splitting repeating unit 201, the first light-splitting structure A1 correspondingly covers three sub-pixels (respectively the first sub-pixel 1, the seventh sub-pixel 7 and the thirteenth sub-pixel 13), the second light-splitting structure A2 correspondingly covers three sub-pixels (respectively the second sub-pixel 2, the eighth sub-pixel 8 and the fourteenth sub-pixel 14), the third light-splitting structure A3 correspondingly covers three sub-pixels (respectively the third sub-pixel 3, the ninth sub-pixel 9 and a fifteenth sub-pixel 15), the fourth light-splitting structure A4 correspondingly covers three sub-pixels (respectively the fourth sub-pixel 4, the tenth sub-pixel 10 and a sixteenth sub-pixel 16), the fifth light-splitting structure A5 correspondingly covers three sub-pixels (respectively the fifth sub-pixel 5, the eleventh sub-pixel 11 and a seventeenth sub-pixel 17) and the sixth light-splitting structure A6 correspondingly covers two sub-pixels (respectively the sixth sub-pixel 6 and the twelfth sub-pixel 12).

In the present disclosure, the serial numbers 1-17 of the above sub-pixels respectively represent relative positions between the sub-pixels and the light-splitting structures A right above them. As shown in FIG. 4, and FIG. 7 to FIG. 17, the relative positions between m*N+k sub-pixels in each pixel island S and the light-splitting structures A right above them may realize complementary arrangement.

Figure 18:
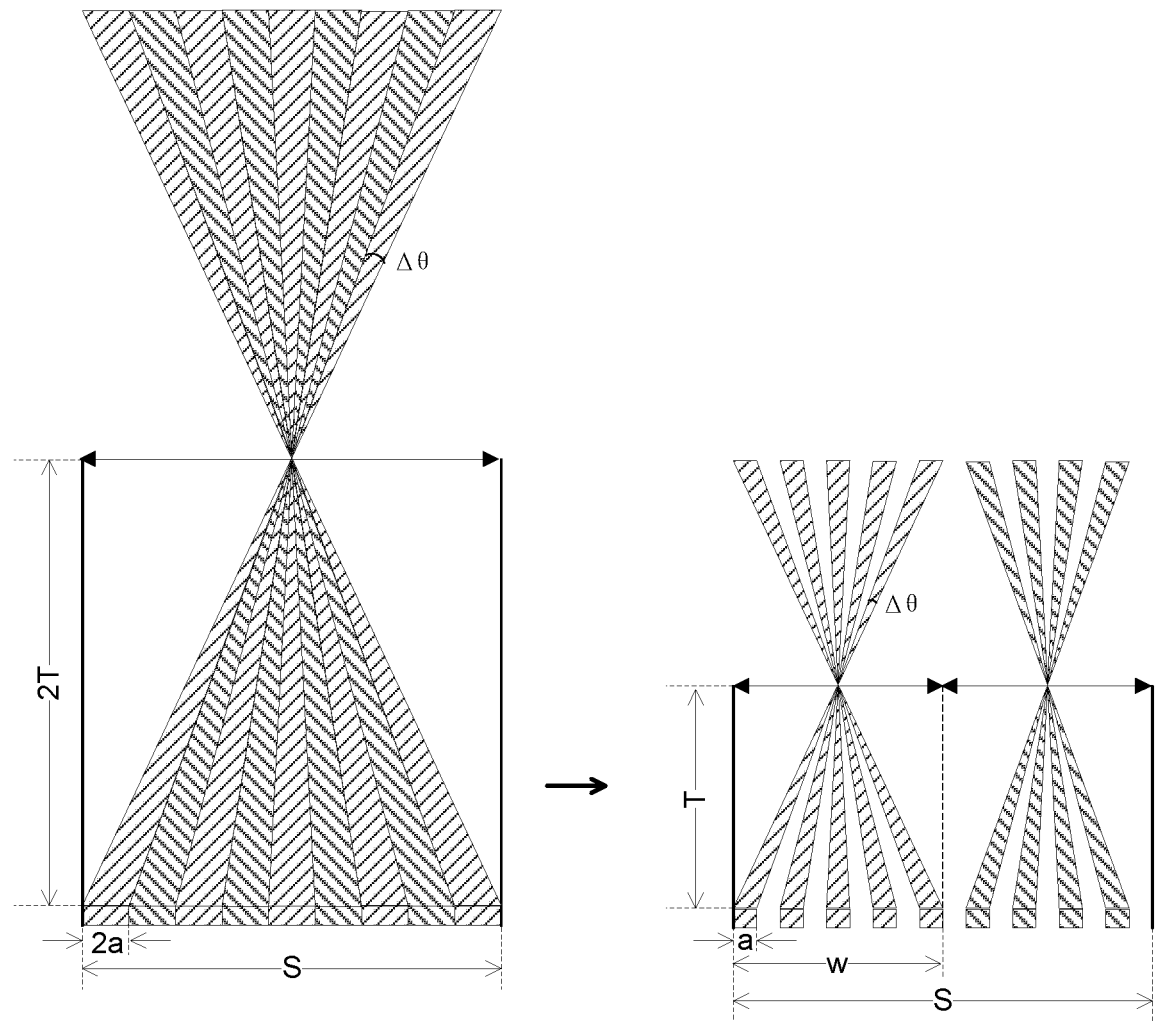
FIG. 18 is a schematic diagram of a thinned thickness of a display apparatus provided by an embodiment of the present disclosure.

Optionally, in the above display apparatus provided by the embodiments of the present disclosure, as shown in FIG. 18, in a direction perpendicular to the display panel 101, a perpendicular distance T between the pixel island S and the light-splitting structure A satisfies the following formula:

$$0.95 * \frac{W}{2} * \cot\frac{(m*N+k)*\Delta\theta}{2} \leq T \leq 1.05 * \frac{W}{2} * \cot\frac{(m*N+k)*\Delta\theta}{2},$$

w is a width of one of the light-splitting structures A in the row direction X, and $\Delta\theta$ is an angle of a viewpoint formed by light emitted by one of the sub-pixels passing the corresponding light-splitting structure A. In some embodiments, $$T = \frac{W}{2} * \cot\frac{(m*N+k)*\Delta\theta}{2}.$$

As shown in FIG. 18, when the sub-pixels are arranged continuously, assuming a placement height of the light-splitting structure A to be 2T, and the angle of each viewpoint to be $\Delta\theta$, when each pixel island S is covered with two light-splitting structures A and the opening ratio of the sub-pixel is 50%, in order to obtain the same viewpoint density, according to the above formula, it may be concluded that the placement height of the light-splitting structure A needs to be changed to be T in the present disclosure. Therefore, the embodiments of the present disclosure may reduce a thickness of the display apparatus. Similarly, when one pixel island S corresponds to three or more (for example, m) light-splitting structures A, the placement height of the light-splitting structure A relative to the sub-pixel may be changed to be 1/m of an original height, thereby further reducing the thickness of the apparatus. In addition, when T satisfies the formula of $$0.95 * \frac{W}{2} * \cot\frac{(m*N+k)*\Delta\theta}{2} \leq T \leq 1.05 * \frac{W}{2} * \cot\frac{(m*N+k)*\Delta\theta}{2},$$

interference defect caused by excessively high or low placement height of the light-splitting structure A may also be effectively avoided.

Optionally, in the above display apparatus provided by the embodiments of the present disclosure, as shown in FIG. 18, according to a triangular relationship, an angle of a gap between two adjacent viewpoints is $\Delta\theta$, which ensures that the relative positions of respective sub-pixels in the same pixel island S and the corresponding light-splitting structures A are closely complementary.

Optionally, in the above display apparatus provided by the embodiments of the present disclosure, the light-splitting structure A is a cylindrical lens, and a focal length of the cylindrical lens is equal to the perpendicular distance T between the pixel island S and the light-splitting structure A, so that the pixel island S is located on a focal plane of the cylindrical lens. Because in a human eye observation space, the plurality of sub-pixels emit light continuously, a plurality of 3D viewpoints may be formed continuously. The left and right eyes of an observer receive a view of a viewpoint respectively, and through grayscale adjustment of the sub-pixels, grayscales of different viewpoints are different, so there will be a time difference between the eyes, thus forming a 3D effect. Moreover, since the plurality of 3D viewpoints are formed, as the human eye moves, the viewpoints are switched, and a multi-viewpoint 3D display function can be realized.

In some embodiments, the above light-splitting structure A may also be a barrier grating or a liquid crystal grating. Of course, the light-splitting structure A may also be other types of gratings, or the light-splitting structure A may also be other optical devices that can achieve a light splitting effect, which is not limited here.

Figure 19:
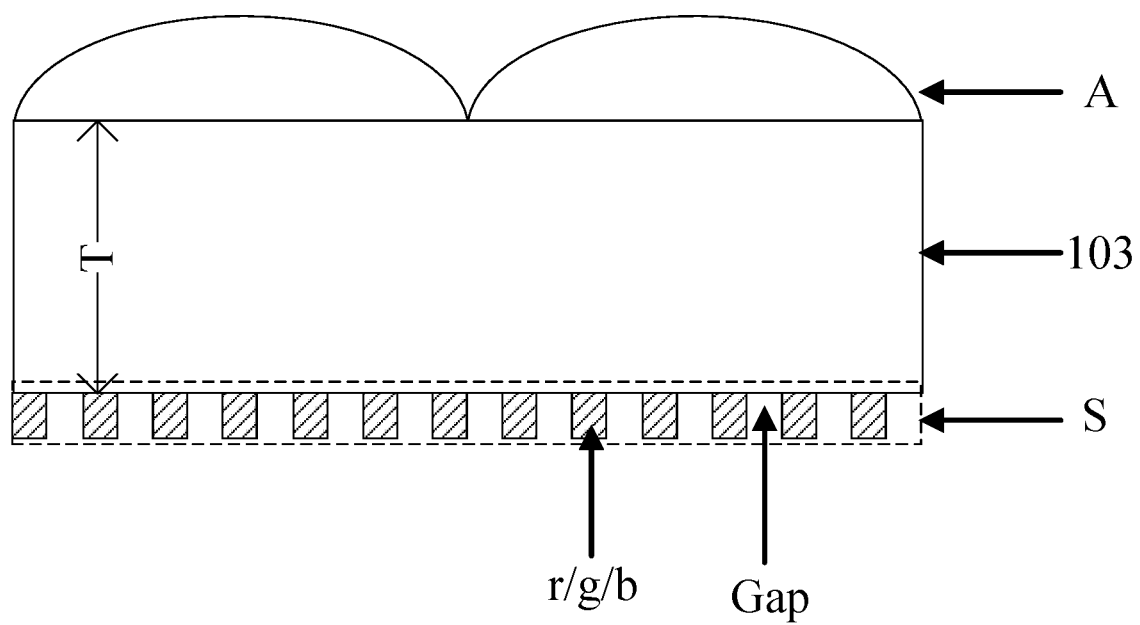
FIG. 19 is a schematic structural diagram of a region where a pixel island is located provided by an embodiment of the present disclosure.

Optionally, in the above display apparatus provided by the embodiments of the present disclosure, in order to ensure that the pixel island S is located on the focal plane of the cylindrical lens, as shown in FIG. 19, a spacer dielectric layer 103 with a certain thickness is bonded between the display panel 101 and the light-splitting structure A, so that a distance between the pixel island S and the cylindrical lens is equal to the focal length of the cylindrical lens. The spacer dielectric layer 103 may be prepared by selecting a material with a larger refractive index and better light transmittance, such as optically transparent glass.

Optionally, in the above display apparatus provided by the embodiments of the present disclosure, every three pixel islands S continuously arranged in the column direction Y are a pixel repeating unit P. In one pixel repeating unit P, the sub-pixels of the same pixel island S are the same in display color, and the sub-pixels of different pixel islands S are different in the display color.

In some embodiments, the every three pixel islands S continuously arranged may sequentially include red sub-pixels r, green sub-pixels g, and blue sub-pixels b. The quantity of red sub-pixels r, green sub-pixels g and blue sub-pixels b is the same. The red sub-pixels r are arranged in a row in a first direction X, the green sub-pixels g are arranged in a row in the first direction X, and the blue sub-pixels b are arranged in a row in the first direction X. Red sub-pixel rows, green sub-pixel rows and blue sub-pixel rows are arranged in a second direction Y, so that the sub-pixels in the pixel island S are arranged in an array.

In some embodiments, in the above display apparatus provided by the embodiments of the present disclosure, the display panel 101 may be an organic light emitting diode display panel, a quantum dot light emitting diode display panel, a micro light emitting diode display panel, a liquid crystal display panel, etc., which is not limited here.

In addition, the above display apparatus provided by the embodiments of the present disclosure may be: a mobile phone, a tablet computer, a television, a display, a notebook computer, a digital photo frame, a navigator, a smart watch, a fitness wristband, a personal digital assistant, or any other product or component with a display function. Other essential components of the display apparatus should be understood by those of ordinary skill in the art, and will not be described in detail here, nor should it be regarded as a limitation of the present disclosure.

Based on the same inventive concept, embodiments of the present disclosure further provide a method for driving any of the above display apparatuses. Since the principle of problem solving of the method is similar to that of the above display apparatus, for implementation of the method, reference may be made to the above display apparatus. Repeated parts will not be described here.

Figure 20:
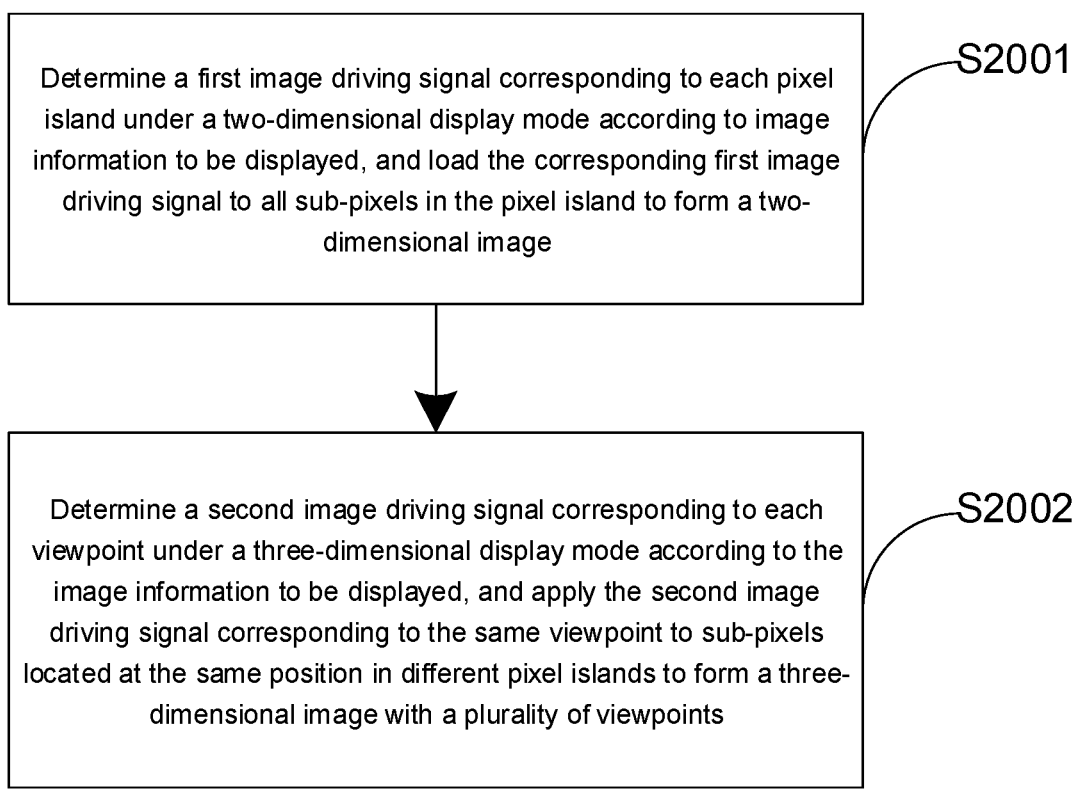
FIG. 20 is a flow chart of a method for driving a display apparatus provided by an embodiment of the present disclosure.

The method for driving the above display apparatus provided by the embodiments of the present disclosure, as shown in FIG. 20, may include the following steps.

S2001, a first image driving signal corresponding to each pixel island is determined under a two-dimensional display mode according to image information to be displayed, and the corresponding first image driving signal is loaded to all sub-pixels in the pixel island to form a two-dimensional image.

S2002, a second image driving signal corresponding to each viewpoint is determined under a three-dimensional display mode according to the image information to be displayed, and the second image driving signal corresponding to the same viewpoint is applied to sub-pixels located at the same position in different pixel islands to form a three-dimensional image with a plurality of viewpoints.

It should be noted that, in the above method provided by the embodiments of the present disclosure, an execution order of step S2001 and step S2002 is not limited to the above manner, that is, in specific implementation, step S2002 may also be executed first, and then step S2001 may be executed.

As can be seen from the above description, the above display apparatus and the driving method thereof provided by the embodiments of the present disclosure include the display panel, and the display panel includes: the plurality of pixel islands arranged at intervals in the row direction and the column direction, and each pixel island being provided with the plurality of sub-pixels arranged at intervals in the row direction; and the light-splitting component, disposed on the display side of the display panel and including the plurality of light-splitting structures extending in the column direction and continuously arranged in the row direction. In the row direction, every at least two adjacent light-splitting structures are one light-splitting repeating unit, each light-splitting repeating unit covers one column of the pixel islands correspondingly. In one of the pixel islands, relative positions of all sub-pixels to the corresponding light-splitting structures are complementary. By proposing an arrangement in which each pixel island is covered with a plurality of light-splitting structures and the sub-pixels of the pixel island are staggered and complementary, the problem of "black region" moiré patterns in space when the sub-pixels emit light discontinuously is effectively solved, and a continuous large 3D viewing angle is achieved; and further, the placement height of the light-splitting structures may be reduced, making the display apparatus lighter and thinner.

Figure 21:
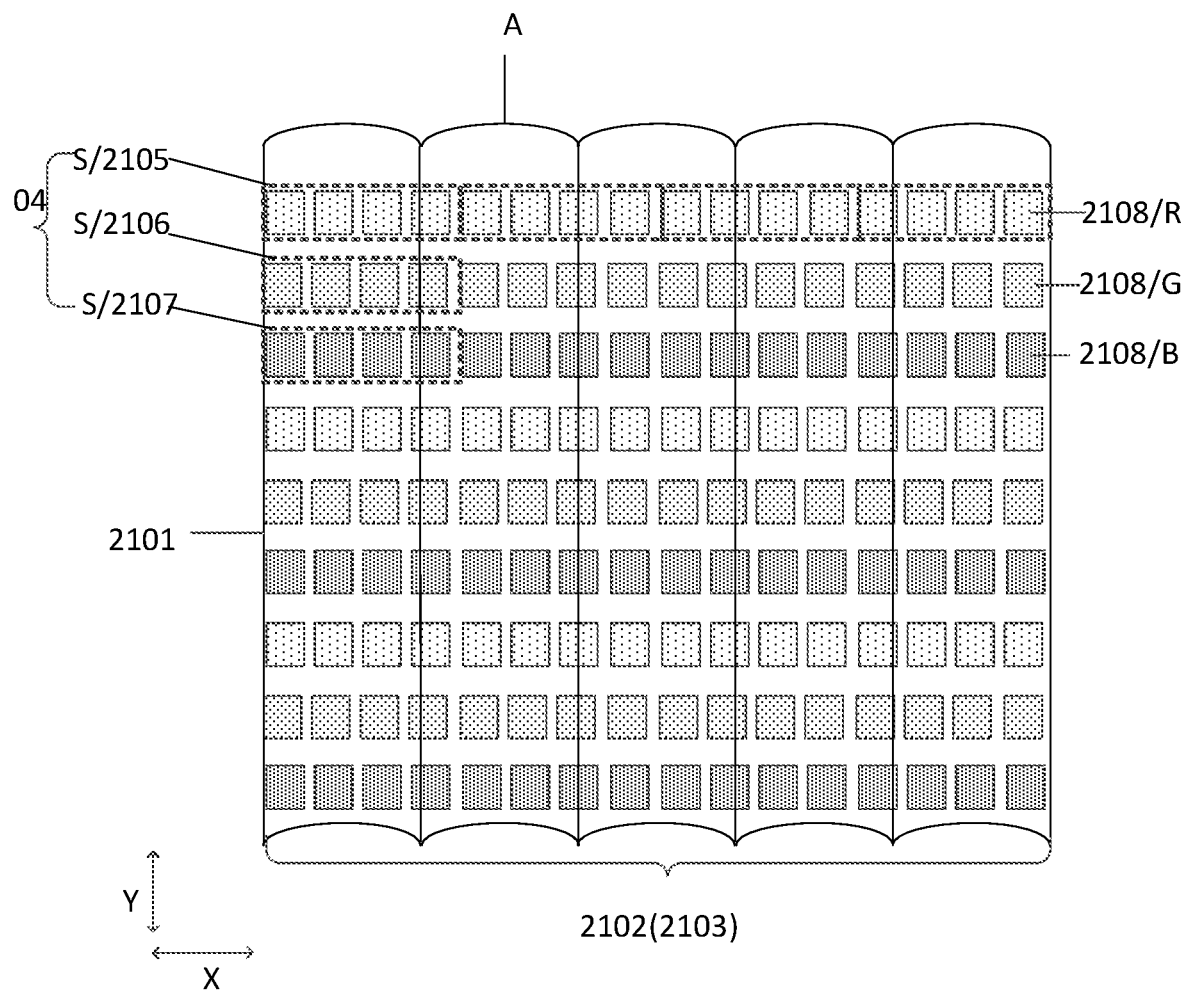
FIG. 21 is a schematic structural diagram of a display apparatus according to an embodiment of the disclosure.

To solve the technical problems existing in the related art, an embodiment of the disclosure provides a display apparatus. As shown in FIG. 21, the display apparatus includes:
- a display panel 2101, where the display panel 2101 includes a plurality of pixel islands S arranged in arrays in a row direction X and a column direction Y, and each pixel island S includes n sub-pixels 2108 arranged at intervals in the row direction X, where n is an integer greater than 1; and
- a light-splitting component 2102 at a display side of the display panel 2101, where the light-splitting component 2102 includes a plurality of light-splitting repeating units 2103 extending in the column direction Y and continuously arranged in the row direction X, the light-splitting repeating unit 03 includes M light-splitting structures A extending in the column direction Y and continuously arranged in the row direction X, each light-splitting repeating unit correspondingly covers K columns of pixel islands S, both M and K are integers greater than 1, and M and K are prime to each other.

In the display apparatus provided in the embodiment of the disclosure, M light-splitting structures correspondingly cover K columns of pixel islands, both M and K are integers greater than 1. That is, the light-splitting structures and the column of pixel islands are in many-to-many correspondence. Sizes of the light-splitting structures in the row direction may be prevented from being too small, difficulty in manufacturing the light-splitting component may be prevented from being increased, and influence on a display effect caused by increased crosstalk between views due to increase in a light-emitting divergence angle of a sub-pixel due to diffraction of a light-splitting structure too small in size may be further avoided.

It should be noted that the display apparatus provided in the embodiment of the disclosure may be used for three dimensional (3D) display, and may further switch between 3D and two dimensional (2D) display. A pixel island may be used as one secondary pixel of 2D display. One pixel island includes a plurality of sub-pixels, such that 3D display may maintain the same resolution as 2D display. By combining an eye-tracking system, multi-view display with a large viewing angle may be achieved, and 3D display with more pixels per inch (ppi) may be further achieved, with more information and less color crosstalk between adjacent viewpoints.

During specific implementation, the light-splitting structures are configured to control light-emitting angles of the sub-pixels, so as to achieve directional light emission.

During specific implementation, the display panel may be one of a liquid crystal display (LCD) panel, an organic light-emitting diode (OLED) display panel, a quantum dot light-emitting diode (QLED), a micro inorganic light-emitting diode (micro LED) display panel, and a mini LED display panel.

In some embodiments, as shown in FIG. 21, every three pixel islands S continuously arranged in the column direction Y constitute one pixel repeating unit 04; and in one pixel repeating unit 2104, color of the sub-pixels 2108 of the same pixel island S is the same, and colors of the sub-pixels 2108 of different pixel islands S are different.

In some embodiments, as shown in FIG. 21, one pixel repeating unit 2104 includes: a first pixel island 2105, a second pixel island 2106, and a third pixel island 2107. The first pixel island 2105 includes a plurality of red sub-pixels R, the second pixel island 2106 includes a plurality of green sub-pixels G, and the third pixel island 2107 includes a plurality of blue sub-pixels B.

In some embodiments, as shown in FIG. 21, colors of all the sub-pixels 2108 in one row of pixel islands S are the same.

In some embodiments, K*n and M are prime to each other.

In some embodiments, in a horizontal direction, a width of M light-splitting structures is equal to that of N columns of pixel islands.

In some embodiments, light-emitting zones of all the sub-pixels in K pixel islands are staggered in a space, such that light rays emitted from all the sub-pixels in the K pixel islands and split by M light-splitting structures form a continuous light-emitting zone in a space.

It should be noted that the space in "light-emitting zones of all the sub-pixels in K pixel islands are staggered in a space" refers to the visible space of the display apparatus.

In the display apparatus provided in the embodiment of the disclosure, M light-splitting structures cover K pixel islands, and the light-emitting zones of all the sub-pixels in K pixel islands are staggered in a space. The light-splitting structures have a small size in the row direction, and for K pixel islands covered with M light-splitting structures, human eyes cannot determine which light-splitting structure a light ray is emitted from, so the human eyes see that light rays emitted from the K pixel islands and split by the M light-splitting structures above the pixel islands form a continuous light-emitting zone in a space, and the human eyes cannot see a "black zone" when moving in the visible space.

It should be noted that viewing angles include a main lobe viewing angle and a side lobe viewing angle. The main lobe viewing angle refers to a viewing angle formed in a space after light emitted from a sub-pixel is split by a light-splitting structure directly above the sub-pixel. The side lobe viewing angle refers to a viewing angle formed in a space after a light ray emitted from a sub-pixel passes a light-splitting structure near the light-splitting structure directly above the sub-pixel. For example, a primary side lobe viewing angle is formed after light passes a first light-splitting structure adjacent to the light-splitting structure directly above, a secondary side lobe viewing angle is formed after light passes a second light-splitting structure adjacent to the light-splitting structure directly above, and so on.

In order to better understand the solution, with the main lobe viewing angle as an example, staggered arrangement of light-emitting zones of all sub-pixels in K pixel islands in a space and formation of a continuous light-emitting zone in a space by light rays emitted from light-emitting zones of all sub-pixels in K pixel islands and split by M light-splitting structures are illustrated.

During specific implementation, in M light-splitting structures arranged in the row direction, a viewpoint difference between two adjacent sub-pixels among a plurality of sub-pixels corresponding to each light-splitting structure is M.

Figure 22:
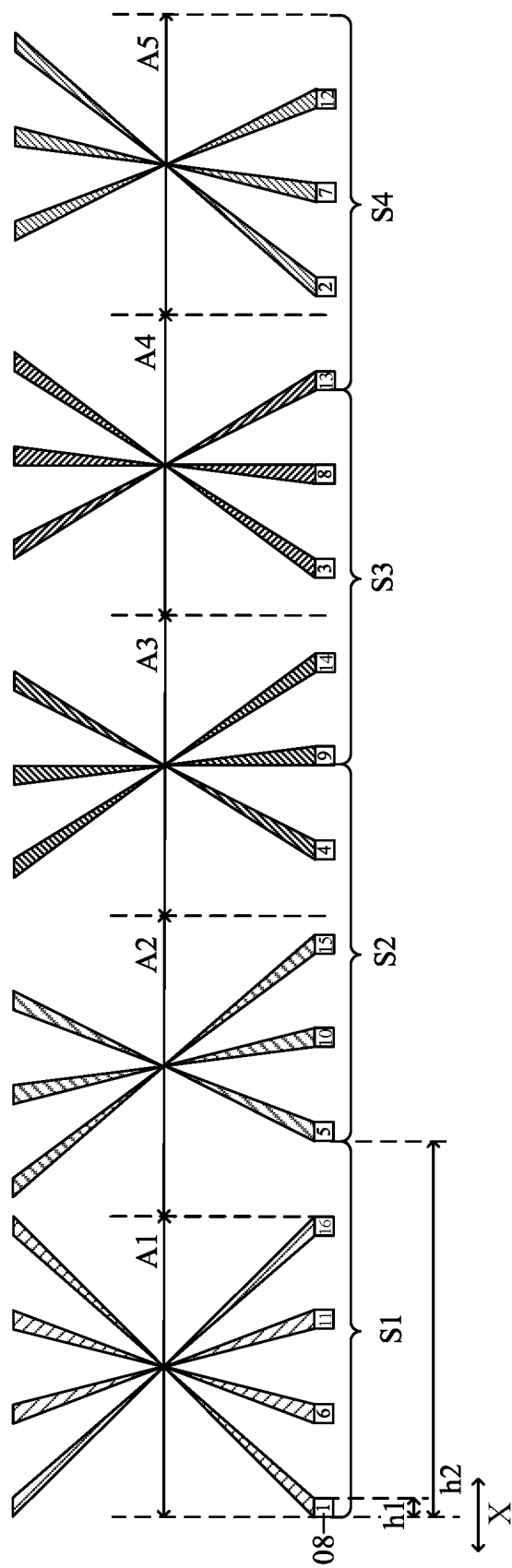
FIG. 22 is a schematic diagram of light paths of light from sub-pixels of a display apparatus according to an embodiment of the disclosure.
Figure 23:
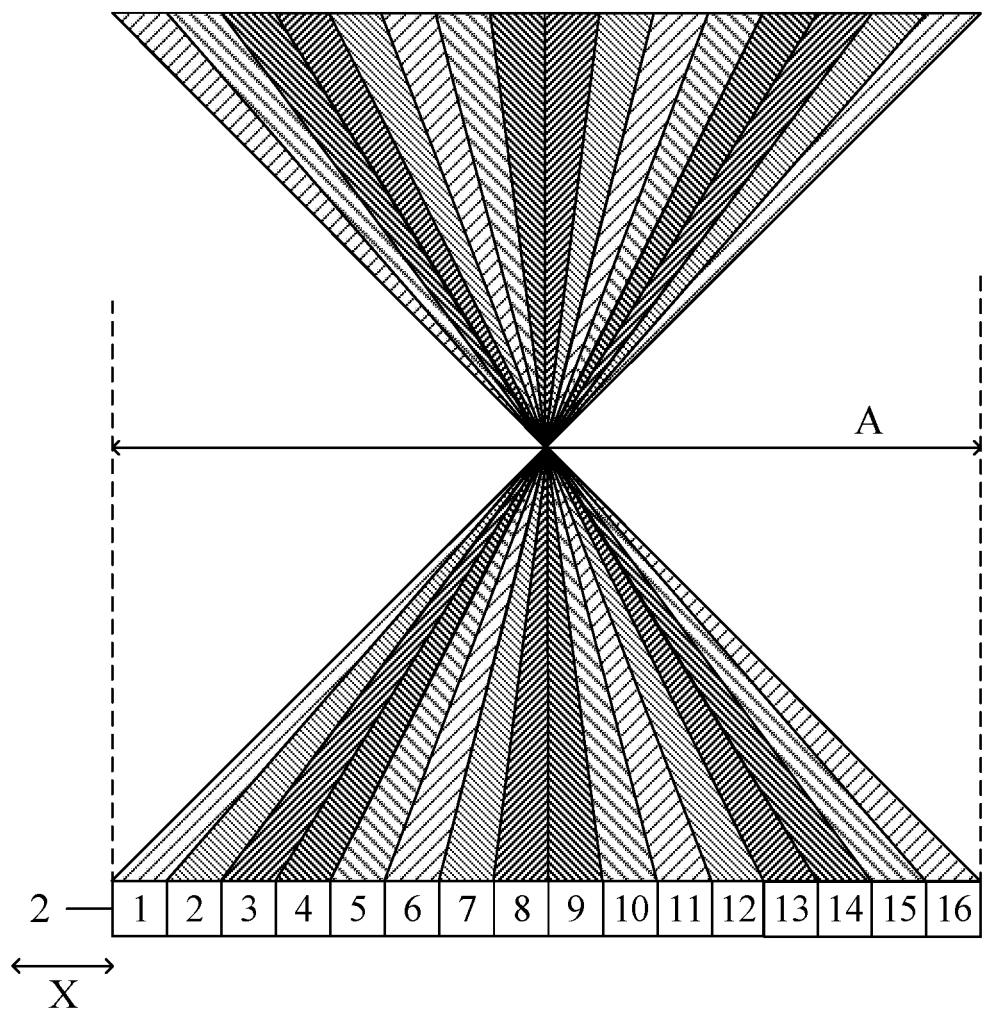
FIG. 23 is a schematic diagram of light paths of light from spliced sub-pixels of a display apparatus according to an embodiment of the disclosure.

In some embodiments, K is 4, M is 5, n is 4, and a light path diagram of K columns of pixel islands is as shown in FIGS. 22 and 23. 4 pixel islands corresponding to 5 light-splitting structures include 16 sub-pixels, which are labeled as a first sub-pixel 1 to a sixteenth sub-pixel 16, respectively, and an index of each sub-pixel represents a corresponding viewpoint. 4 pixel islands are a first pixel island S1, a second pixel island S2, a third pixel island S3, and a fourth pixel island S4. The first pixel island S1 includes a first sub-pixel 1, a sixth sub-pixel 6, an eleventh sub-pixel 11, and a sixteenth sub-pixel 16. The second pixel island S2 includes a fifth sub-pixel 5, a tenth sub-pixel 10, a fifteenth sub-pixel 15, and a fourth sub-pixel 4. The third pixel island S3 includes a ninth sub-pixel 9, a fourteenth sub-pixel 14, a third sub-pixel 3, and an eighth sub-pixel 8. The fourth pixel island S4 includes a thirteenth sub-pixel 13, a second sub-pixel 2, a seventh sub-pixel 7, and a twelfth sub-pixel 12. The light-splitting structures corresponding to the 16 sub-pixels are labeled as a first light-splitting structure A1 to a fifth light-splitting structure A5, respectively. As shown in FIG. 22, the first light-splitting structure A1 covers the first sub-pixel 1, the sixth sub-pixel 6, the eleventh sub-pixel 11, and the sixteenth sub-pixel 16, the second light-splitting structure A2 covers the fifth sub-pixel 5, the tenth sub-pixel 10, and the fifteenth sub-pixel 15, the third light-splitting structure A3 covers the fourth sub-pixel 4, the ninth sub-pixel 9, and the fourteenth sub-pixel 14, the fourth light-splitting structure A4 covers the third sub-pixel 3, the eighth sub-pixel 8, and the thirteenth sub-pixel 13, and the fifth light-splitting structure A5 covers the second sub-pixel 2, the seventh sub-pixel 7, and the twelfth sub-pixel 12. As shown in FIG. 22, no repeating unit is formed according to a relative position relation between each sub-pixel and the light-splitting structure in the 4 pixel islands. If all the sub-pixels are spliced in a viewpoint order, a relative position of each sub-pixel and the light-splitting structure remains unchanged. As shown in FIG. 23, after the sub-pixels corresponding to each light-splitting structure are spliced, positions of the sub-pixels are complementary, that is, a gap between the sub-pixels is 0, and the relative position relation between the sub-pixels and the light-splitting structures forms a staggered and complementary arrangement. Accordingly, light-emitting zones of all the sub-pixels in the 4 pixel islands are staggered in a space, and the light-emitting zones of all the sub-pixels in the 4 pixel islands are also arranged in a staggered and complementary manner in a space. As shown in FIG. 22, there is a gap between the first sub-pixel 1 and the fifth sub-pixel 5, such that light rays emitted from the adjacent sub-pixels corresponding to the same light-splitting structure A and split by the same light-splitting structure have a discontinuous light-emitting angle in a space. However, all the sub-pixels in the 4 pixel islands are staggered relative to the 5 light-splitting structures A, and the light-emitting zones of all the sub-pixels in the 4 pixel islands are staggered in a space, such that light-emitting angles of all the light-splitting structures A are also staggered and complementary. The light-splitting structures A have a small size, and human eyes cannot determine the light-splitting structure A from which a light ray is emitted, such that as shown in FIG. 23, the human eyes see that light rays emitted from the 16 sub-pixels in 4 pixel islands and split by the 5 light-splitting structures form a continuous light-emitting zone in a space, and the human eyes cannot see a "black zone" when moving in a space.

Continuity of the side lobe viewing angle is the same as that of the main lobe viewing angle, and K pixel islands may complement each other to form a continuous primary side lobe viewing angle through two discontinuous primary side lobe viewing angles of adjacent light-splitting structures. Moreover, in the horizontal direction, the width of M light-splitting structures is equal to that of K columns of pixel islands, so a main lobe viewing angle boundary is parallel to a side lobe viewing angle boundary. The human eyes cannot distinguish a distance between the main lobe viewing angle boundary and the side lobe viewing angle boundary, such that the main lobe viewing angle and the side lobe viewing angle are observed to be continuous. In the same way, the primary side lobe viewing angle and a secondary side lobe viewing angle are also continuous, the secondary side lobe viewing angle and a tertiary side lobe viewing angle are also continuous, and so on. In this way, a continuous viewing angle is obtained.

In some embodiments, the sub-pixels include sub-pixel opening regions; and in the row direction, the opening regions of all the sub-pixels have the same width h1.

In some embodiments, in the row direction, a ratio of a total width n×h1 of n sub-pixel opening regions to a width h2 of the pixel island is greater than or equal to 0.9/M and smaller than or equal to 1. That is, an aperture ratio of sub-pixels in the pixel island is greater than or equal to 0.9/M and smaller than or equal to 1.

In some embodiments, as shown in FIGS. 22 and 23, in the row direction X, light-emitting zones of all sub-pixels 2108 in K pixel islands S are complementarily spliced in a space.

In some embodiments, as shown in FIG. 22, in the row direction X, a ratio of the total width of the opening regions of n sub-pixels 2108 to the width of the pixel island S is 1/M. That is, an aperture ratio of sub-pixels in the pixel island is 1/M. In this way, all the sub-pixels below each light-splitting repeating unit may be arranged in a staggered and complementary manner relative to the corresponding light-splitting structures, such that light-emitting zones of all the sub-pixels in the K pixel islands are complementarily spliced in a space, that is, light paths of all viewpoints are closely contacted, moire patterns may be eliminated, and a display effect may be improved.

Figure 24:
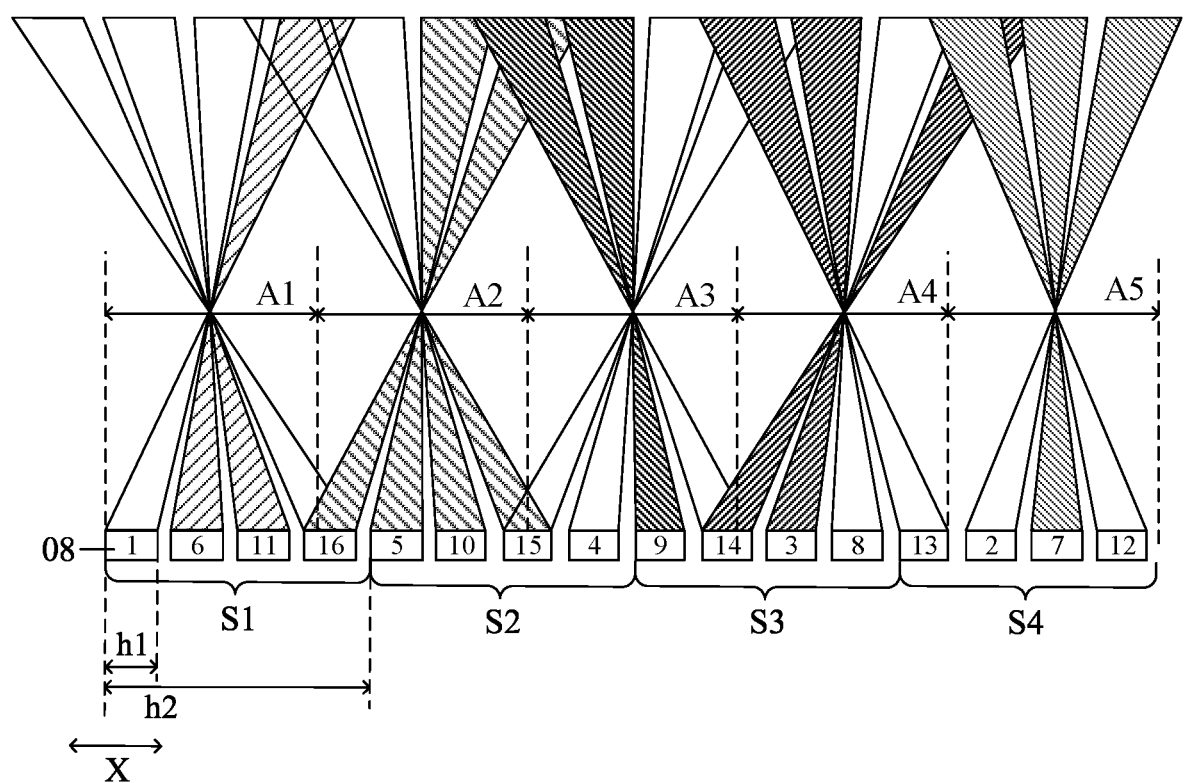
FIG. 24 is a schematic diagram of light paths of light from sub-pixels of another display apparatus according to an embodiment of the disclosure.
Figure 25:
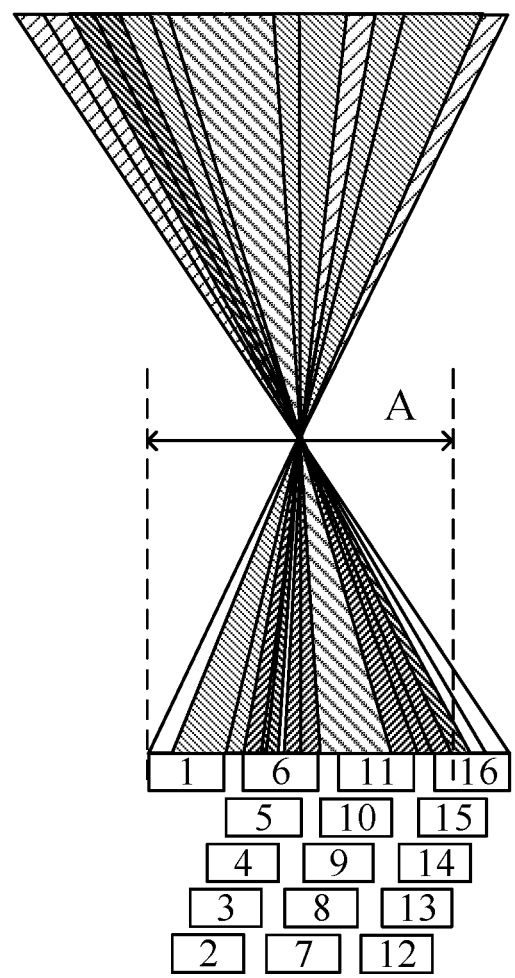
FIG. 25 is a schematic diagram of light paths of light from spliced sub-pixels of another display apparatus according to an embodiment of the disclosure.

In some embodiments, as shown in FIGS. 24 and 25, in the row direction, the light-emitting zones of all the sub-pixels in the K pixel islands overlap each other in a space.

In some embodiments, as shown in FIGS. 24 and 25, in the row direction, the light-emitting zones of all the sub-pixels in the K pixel islands evenly overlap each other in a space.

Then, still with the main lobe viewing angle as an example, formation of a continuous light-emitting zone in a space by light rays emitted from light-emitting zones of all sub-pixels in K pixel islands and split by M light-splitting structures is illustrated.

In some embodiments, K is 4, M is 5, n is 4, and a light path diagram of K columns of pixel islands is as shown in FIGS. 24 and 25. 4 pixel islands corresponding to 5 light-splitting structures include 16 sub-pixels, which are labeled as a first sub-pixel 1 to a sixteenth sub-pixel 16, respectively, and an index of each sub-pixel represents a corresponding viewpoint. 4 pixel islands are a first pixel island S1, a second pixel island S2, a third pixel island S3, and a fourth pixel island S4. The first pixel island S1 includes a first sub-pixel 1, a sixth sub-pixel 6, an eleventh sub-pixel 11, and a sixteenth sub-pixel 16. The second pixel island S2 includes a fifth sub-pixel 5, a tenth sub-pixel 10, a fifteenth sub-pixel 15, and a fourth sub-pixel 4. The third pixel island S3 includes a ninth sub-pixel 9, a fourteenth sub-pixel 14, a third sub-pixel 3, and an eighth sub-pixel 8. The fourth pixel island S4 includes a thirteenth sub-pixel 13, a second sub-pixel 2, a seventh sub-pixel 7, and a twelfth sub-pixel 12. The light-splitting structures corresponding to the 16 sub-pixels are labeled as a first light-splitting structure A1 to a fifth light-splitting structure A5, respectively. As shown in FIG. 24, the first light-splitting structure A1 covers the first sub-pixel 1, the sixth sub-pixel 6, the eleventh sub-pixel 11, and part of the sixteenth sub-pixel 16, the second light-splitting structure A2 covers part of the sixteenth sub-pixel 16, the fifth sub-pixel 5, the tenth sub-pixel 10, and part of the fifteenth sub-pixel 15, the third light-splitting structure A3 covers part of the fifteenth sub-pixel 15, the fourth sub-pixel 4, the ninth sub-pixel 9, and part of the fourteenth sub-pixel 14, the fourth light-splitting structure A4 covers part of the fourteenth sub-pixel 14, the third sub-pixel 3, the eighth sub-pixel 8, and the thirteenth sub-pixel 13, and the fifth light-splitting structure A5 covers the second sub-pixel 2, the seventh sub-pixel 7, and the twelfth sub-pixel 12. As shown in FIG. 24, no repeating unit is constituted according to a relative position relation between each sub-pixel and the light-splitting structure in the 4 pixel islands. If all the sub-pixels are spliced in a viewpoint order, a relative position of each sub-pixel and the light-splitting structure remains unchanged. As shown in FIG. 23, after the sub-pixels corresponding to each light-splitting structure are spliced, positions of the sub-pixels are overlapped, and the relative position relation between the sub-pixels and the light-splitting structures forms a staggered and complementary arrangement mode. Accordingly, light-emitting zones of all the sub-pixels in the 4 pixel islands are staggered in a space, and the light-emitting zones of all the sub-pixels in the 4 pixel islands are also arranged in a staggered and complementary manner in a space. As shown in FIG. 24, there is a gap between the first sub-pixel 1 and the fifth sub-pixel 6, such that light rays emitted from the adjacent sub-pixels corresponding to the same light-splitting structure A and split by the same light-splitting structure have a discontinuous light-emitting angle in a space. However, all the sub-pixels in the 4 pixel islands are arranged in a staggered, even and overlapped manner relative to the 5 light-splitting structures A, and the light-emitting zones of all the sub-pixels in the 4 pixel islands evenly overlap each other in a space, such that light-emitting angles of all the light-splitting structures A are also staggered, even and overlapped. The light-splitting structures A have a small size, and human eyes cannot determine the light-splitting structure A from which a light ray is emitted, such that as shown in FIG. 25, the human eyes see that light rays emitted from the 16 sub-pixels in 4 pixel islands and split by the 5 light-splitting structures form a continuous light-emitting zone in a space, and the human eyes cannot see a "black zone" when moving in a space.

In some embodiments, as shown in FIG. 24, in the row direction, a ratio of a total width n×h1 of n sub-pixel opening regions to a width h2 of the pixel island is i/M, i being an integer greater than 1 and smaller than or equal to M−1. That is, an aperture ratio of sub-pixels in the pixel island is i/M. In this way, all the sub-pixels below each light-splitting repeating unit may be arranged in a staggered, even and overlapped manner relative to the corresponding light-splitting structures, such that light-emitting zones of all the sub-pixels in the K pixel islands evenly overlap each other, that is, light paths of all the viewpoints evenly overlap each other, and similarly, moire patterns may be eliminated, and a display effect may be improved.

During specific implementation, when the light-emitting zones of all the sub-pixels in K pixel islands evenly overlap each other in a space, a ratio of an area of an overlapping zone of light-emitting zones of two sub-pixels having adjacent indexes to an area of a light-emitting zone of one of the sub-pixels is (i−1)/i. A ratio of an area of an overlapping zone of light-emitting zones of two sub-pixels having adjacent indexes to an area of one of the sub-pixels is (i−1)/M.

It should be noted that when a ratio of the total width n×h1 of n sub-pixel opening regions to the width h2 of the pixel island is 1/M in the row direction, that is, i=1, light-emitting zones of all the sub-pixels do not overlap each other in a space. When i=2, a ratio of an area of an overlapping zone of light-emitting zones of two sub-pixels having adjacent indexes to an area of a light-emitting zone of one of the sub-pixels is ½, and a ratio of an area of an overlapping zone of light-emitting zones of two sub-pixels having adjacent indexes to an area of one of the sub-pixels is 1/M; when i=3, a ratio of an area of an overlapping zone of light-emitting zones of two sub-pixels having adjacent indexes to an area of a light-emitting zone of one of the sub-pixels is ⅔, and a ratio of an area of an overlapping zone of light-emitting zones of two sub-pixels having adjacent indexes to an area of one of the sub-pixels is 2/M; when i=4, a ratio of an area of an overlapping zone of light-emitting zones of two sub-pixels having adjacent indexes to an area of a light-emitting zone of one of the sub-pixels is ¾, and a ratio of an area of an overlapping zone of light-emitting zones of two sub-pixels having adjacent indexes to an area of one of the sub-pixels is 3/M; when i=M−1, a ratio of an area of an overlapping zone of light-emitting zones of two sub-pixels having adjacent indexes to an area of a light-emitting zone of one of the sub-pixels is (M−2)/(M−1), and a ratio of an area of an overlapping zone of light-emitting zones of two sub-pixels having adjacent indexes to an area of one of the sub-pixels is (M−2)/M; and so on.

It should be noted that in the display apparatus provided in the embodiment of the disclosure, M light-splitting structures correspond to K columns of pixel islands, and both M and K are integers greater than 1, that is, the pixel islands and the light-splitting structures are in many-to-many correspondence. When the width of M light-splitting structures is equal to that of K columns of pixel islands in the row direction, even if the number of light-splitting structures is increased, difficulty in manufacturing the light-splitting structures due to too small a size in the row direction may be avoided. When the aperture ratio of the sub-pixels in the pixel island is i/M and i is an integer greater than 1 and smaller than or equal to M−1, compared with the condition that one sub-pixel corresponds to a plurality of light-splitting structures in the related art, the aperture ratio of the sub-pixels may be further improved under the same number of light-splitting structures.

It should be noted that illustration is conducted with the condition that a ratio of a total width of n sub-pixel opening regions to a width of a pixel island in the row direction in FIG. 24 is (M−1)/M as an example, that is, an aperture ratio of sub-pixels in the pixel island is ⅘ in FIG. 24. When an aperture ratio of the sub-pixels in the pixel island is (M−1)/M, the aperture ratio of the sub-pixels may be improved to the maximum extent under the condition that the light-emitting zones of all the sub-pixels in K pixel islands evenly overlap each other in a space in the row direction. Certainly, during specific implementation, the aperture ratio of the sub-pixels in the pixel island may also be 2/M, 3/M, etc.

In some embodiments, M is 5, K is 4, and n is 4; alternatively, M is 5, K is 4, and n is 16; alternatively, M is 3, K is 4, and n is 32; and alternatively, M is 5, K is 2, and n is 16.

Figure 26:
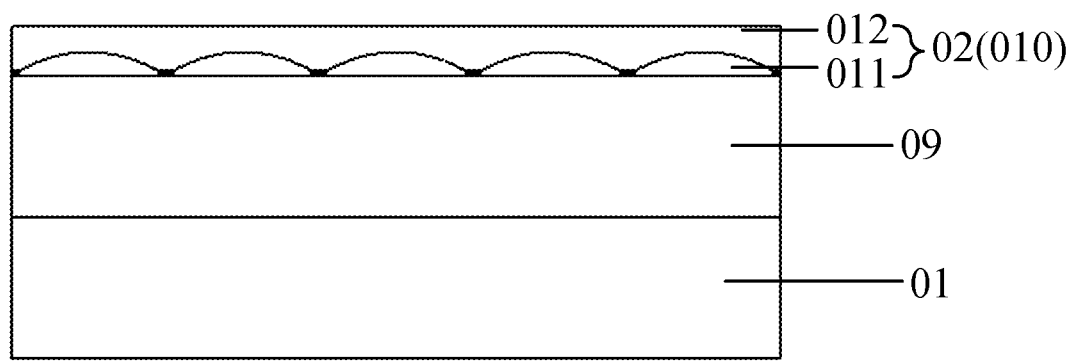
FIG. 26 is a schematic structural diagram of another display apparatus according to an embodiment of the disclosure.

In some embodiments, as shown in FIG. 26, the display apparatus further includes:

a spacer dielectric layer 2109 between the light-splitting component 2102 and the display panel 2101.

In some embodiments, the light-splitting structure is a cylindrical lens.

In some embodiments, as shown in FIG. 26, the cylindrical lens 010 includes a first resin layer 011 having a protrusion, and a planarization resin layer 012 at a side of the first resin layer 011 facing away from the display panel 2101; and a refractive index of the planarization resin layer 012 is smaller than that of the first resin layer 011.

Alternatively, in some embodiments, the cylindrical lens is a liquid crystal lens.

Certainly, during specific implementation, the light-splitting structure may be a geometric lens, a diffraction lens, a liquid lens, or another structural apparatus capable of controlling a light-emitting direction of a sub-pixel.

In some embodiments, a placement height of the light-splitting structure, that is, a thickness H of the spacer dielectric layer, satisfies the following condition:

$$H = \frac{n3l1P1}{W}$$

where, I1 is an optimal viewing distance of the display apparatus; W is a width of a projection of a main lobe viewing angle formed by light rays emitted from a sub-pixel at the optimal viewing distance, that is, W is a total width of viewpoints at the optimal viewing distance without repeated viewpoints; and n3 is a refractive index of the spacer dielectric layer.

In some embodiments, the cylindrical lens includes a first resin layer having a protrusion, and a planarization resin layer at a side of the first resin layer facing away from the display panel; and a refractive index of the planarization resin layer is smaller than that of the first resin layer.

Alternatively, in some embodiments, the cylindrical lens is a liquid crystal lens.

In some embodiments, a radius of curvature R of the cylindrical lens is greater than or equal to 0.87r and smaller than or equal to 1.33r, where $$r = \frac{(n1-n2)H}{n3} = \frac{(n1-n2)}{n3} \times \frac{n3l1P1}{W},$$

n1 is a refractive index of the first resin layer or an extraordinary-light refractive index of the liquid crystal lens, n2 is a refractive index of the planarization resin layer or an ordinary-light refractive index of the liquid crystal lens, n3 is a refractive index of the spacer dielectric layer, and H is a thickness of the spacer dielectric layer.

It should be noted that $$r = \frac{(n1-n2)}{n3} \times \frac{n3l1P1}{W}$$

is an ideal value of a radius of curvature of the cylindrical lens obtained according to a design of an ideal lens focal plane, in which a pixel light-emitting surface is located on a focal plane of the lens. During specific implementation, the radius of curvature of the cylindrical lens may be adjusted on the basis of the ideal value of the radius of curvature according to actual needs.

Then, with the light-splitting structure as a cylindrical lens as an example, parameter designs of the light-splitting structure in the display apparatus provided in the embodiment of the disclosure are introduced.

During specific implementation, when K=4, M=5, n=16, the display apparatus includes 3840×2160 pixel islands, and h2=181.8 μm.

In some embodiments, when the width of M light-splitting structures is equal to that of K columns of pixel islands in the row direction, the width of the cylindrical lens in the row direction satisfies P1=K×h2/M. K=4, M=5, and P1=145.44 μm.

It should be noted that since the total number of pixel islands included in the display apparatus is resolution of 2D display, 2D display with retina-level resolution should be achieved for sizes of the pixel islands of the display apparatus provided in the embodiment of the disclosure, that is, included angles between the pixel islands and human eyes are 1″, such that I1=630 mm is the optimal viewing distance. In order to ensure no crosstalk between left and right eyes of 3D display at the optimal viewing distance, it is necessary to maximize the number of viewpoint intervals between the left and right eyes at the optimal viewing distance, such that a total width of viewpoints without repeated viewpoints at the optimal viewing distance and a pupil distance D satisfy $$D = \left(\frac{1}{2} + m\right)W,$$

where m is an integer greater than or equal to 0. In this case, it may be seen that with increase in m, a viewpoint density may gradually increase, but a moving range of the human eyes may gradually decrease. In the embodiment of the disclosure, a large moving range of human eyes is preferable, such that m=0, the pupil distance D of people is usually 65 mm, that is, W=2*D=130 mm. The spacer dielectric layer is generally made of glass, and n3=1.5. l1=630 mm, W=130 mm, n3=1.5 and P1=145.44 µm are substituted into $$H = \frac{n3l1P1}{W},$$

and H=1057 µm is obtained.

During specific implementation, if n1=1.55, n2=1.42, and n3=1.5, H=1057 µm, and $$r = \frac{(n1-n2)H}{n3} = 91.6 \ \mu m.$$

Figure 27:
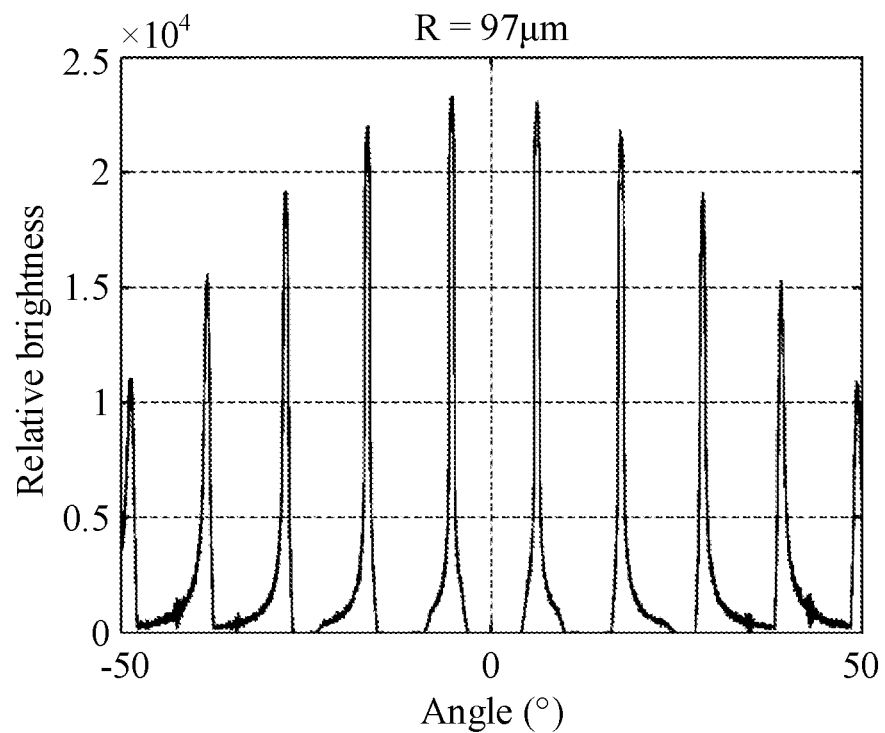
FIG. 27 is a light angular spectrum of sub-pixels of a display apparatus according to an embodiment of the disclosure.
Figure 28:
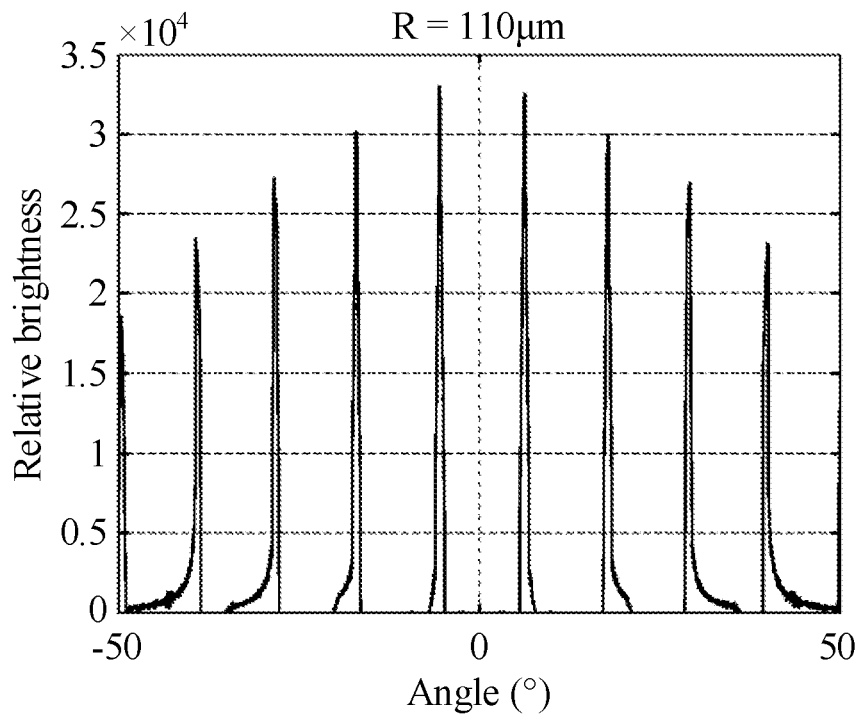
FIG. 28 is a light angular spectrum of sub-pixels of another display apparatus according to an embodiment of the disclosure.
Figure 29:
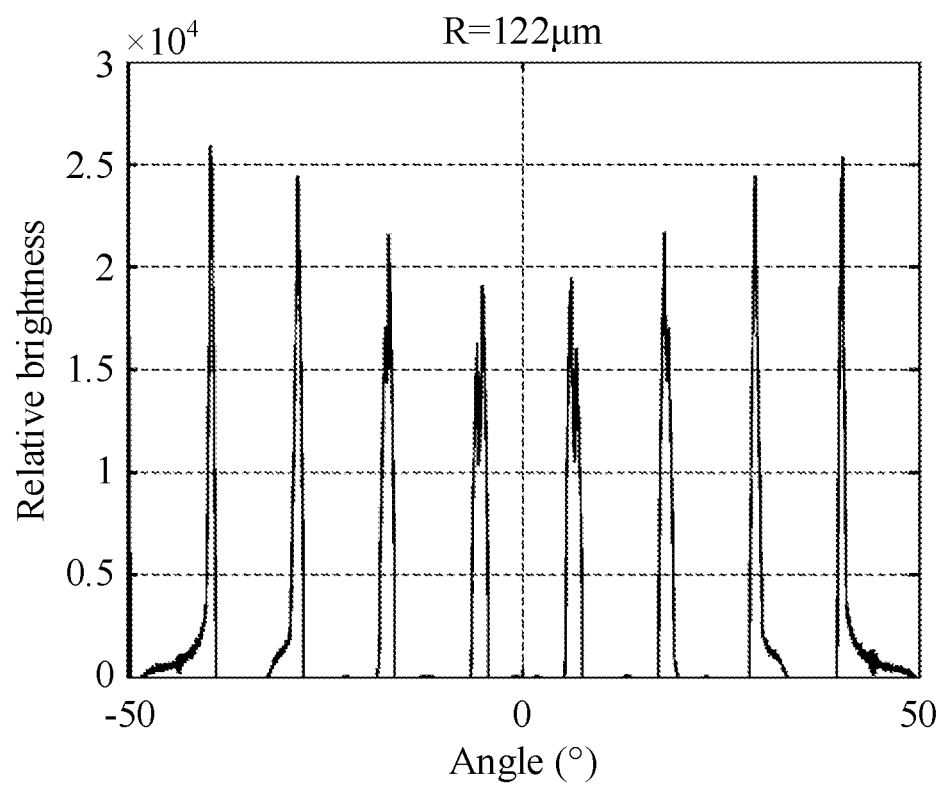
FIG. 29 is a light angular spectrum of sub-pixels of yet another display apparatus according to an embodiment of the disclosure.
Figure 30:
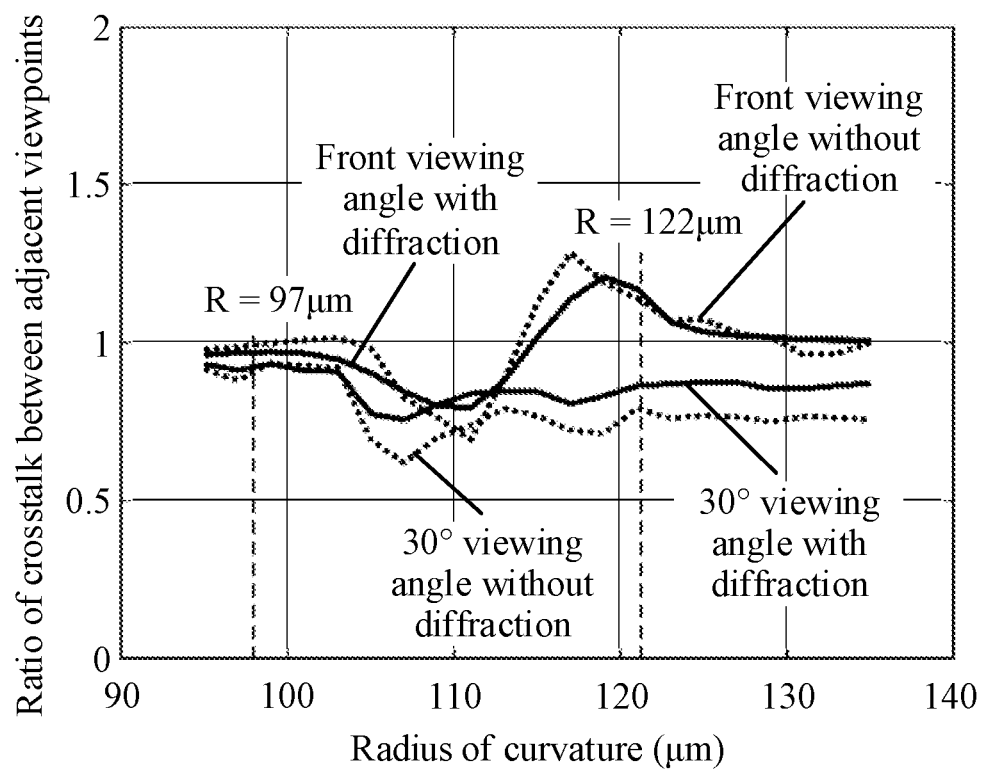
FIG. 30 is a diagram of a variation relation between crosstalk between adjacent viewpoints and a radius of curvature according to an embodiment of the disclosure.

Then, a simulation result under the condition that the radius of curvature of the cylindrical lens is greater than or equal to 0.87r and smaller than or equal to 1.33r is introduced. According to the above computed parameters: $P_1$=145.44 µm, H=1057 µm, r=91.6 µm, and h2=11.3625 µm, modeling is conducted, and then radii of curvature is scanned. FIGS. 27-29 are angular spectra of light from all sub-pixels under the radii of curvature of 97 µm, 110 µm, and 122 µm, respectively. It may be seen that angular spectra of sub-pixels under different radii of curvature are different, and crosstalk between all viewpoints is also different. The crosstalk between viewpoints is computed according to the angular spectra of all the viewpoints, and a variation relation between crosstalk between adjacent viewpoints and a radius of curvature as shown in FIG. 30 is obtained. In order to obtain small crosstalk between adjacent viewpoints without obvious change with fluctuation of radii of curvature, and a large viewing range of zero crosstalk between left and right eyes, a radius of curvature R is preferably 97 µm at a front viewing angle, and a radius of curvature R is preferably 122 µm at a large viewing angle. Moreover, according to crosstalk data comparison between diffraction and no diffraction, it may be seen that 4 pixel islands correspond to 5 cylindrical lenses in the embodiment of the disclosure, such that the width of the cylindrical lens is increased, and influence of diffraction on crosstalk is small, which is conducive to feasibility of a cylindrical lens preparation process and effectively avoids influence of diffraction on crosstalk due to a small size of the cylindrical lens.

During specific implementation, when the cylindrical lens is a zoom liquid crystal lens, the cylindrical lens may have different radii of curvature at different viewing angles, such that crosstalk between adjacent viewpoints may be relatively small without obvious change with fluctuation of radii of curvature, and a viewing range of zero crosstalk between left and right eyes may be large.

Figure 31:
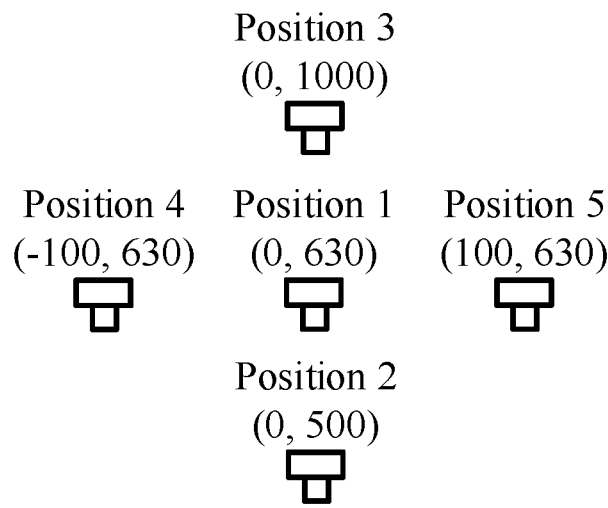
FIG. 31 is a schematic diagram of sub-pixels at different positions according to an embodiment of the disclosure.
Figure 32:
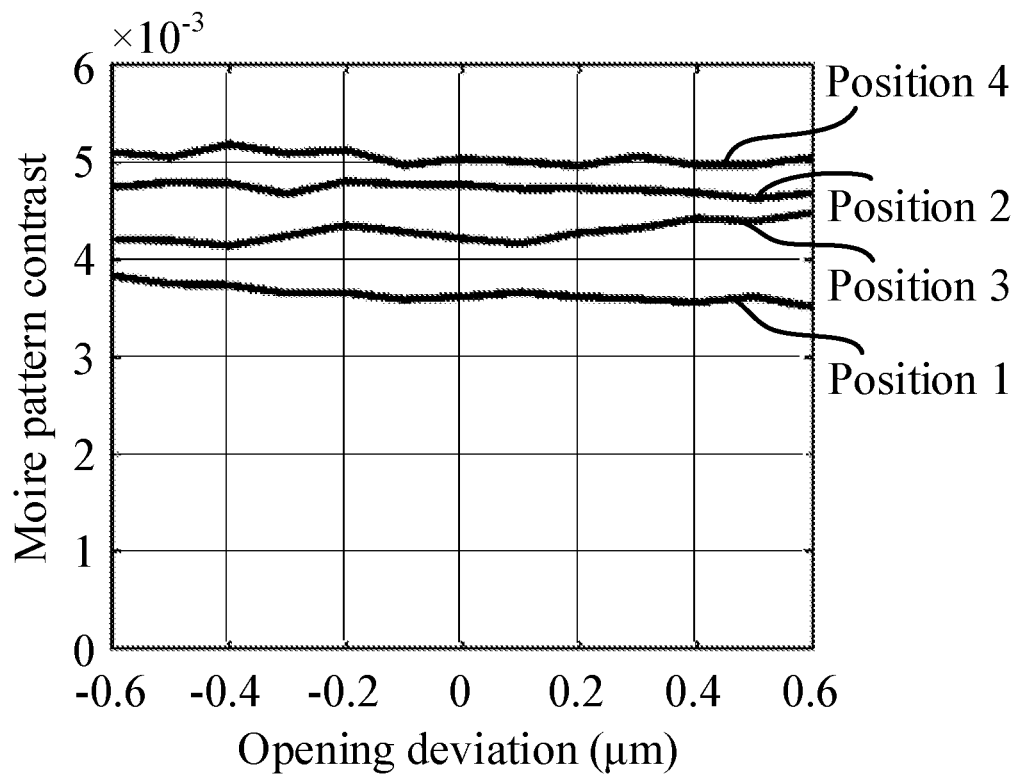
FIG. 32 is a schematic diagram of a variation relation between moire pattern contrast and opening deviations of sub-pixels according to an embodiment of the disclosure.

Based on the above simulation model: P1=145.44 µm, H=1057 µm, R=97 µm, and h2=11.3625 µm, a sub-pixel opening is 9.09 µm, the sub-pixel opening is scanned, angular spectra of light from sub-pixels at different opening positions are obtained, and positions of different sub-pixels are as shown in FIG. 31. Through computation according to the angular spectra, fluctuation of moire pattern contrast along with opening deviations of sub-pixels as shown in FIG. 32 is obtained. It may be seen that the embodiment of the disclosure may effectively reduce sensitivity influence on moire patterns caused by fluctuation of pixel apertures after increasing the aperture ratio of sub-pixels.

In some embodiments, in the row direction, an absolute value of a width difference between different sub-pixel opening regions is smaller than or equal to 2.5 µm. In this way, moire patterns caused by large opening deviations of sub-pixels at different positions may be avoided, and a display effect may be improved.

During specific implementation, in order to further avoid influence of fluctuation of sub-pixel opening regions on moire patterns, an absolute value of a width difference between different sub-pixels may be set to be smaller than or equal to 0.6 µm in the row direction.

In some embodiments, the display apparatus further includes an eye-tracking system configured to determine a position of eyes of a user in real time.

The display apparatus provided in the embodiment of the disclosure may be any product or component with a display function, such as a mobile phone, a tablet computer, a television, a display screen, a notebook computer, a digital photo frame, a navigator, a smart watch, a fitness wristband, and a personal digital assistant. Other essential components of the display apparatus should be understood by those of ordinary skill in the art, which will not be repeated herein and should not limit the disclosure.

Figure 33:
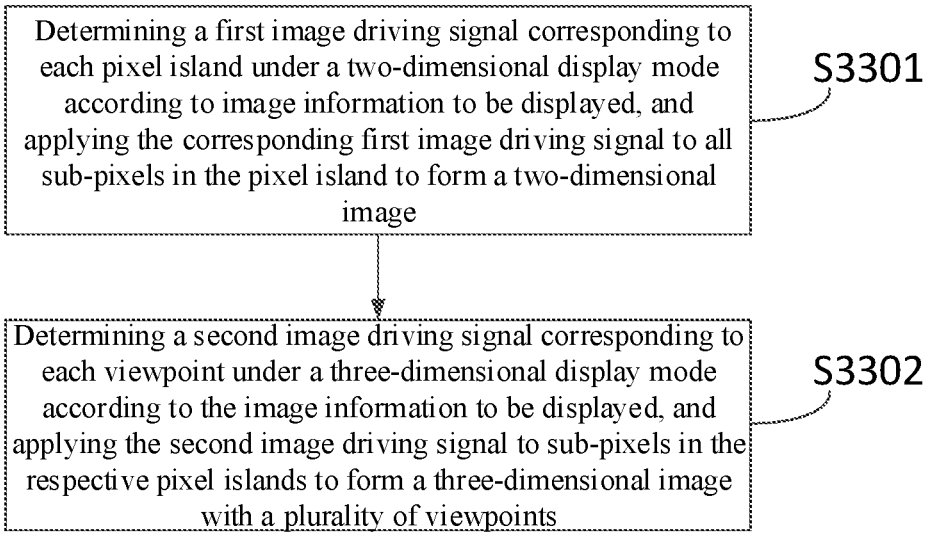
FIG. 33 is a flowchart of a driving method of the display apparatus according to an embodiment of the disclosure.

Based on the same inventive concept, embodiments of the present disclosure further provide a method for driving any of the above display apparatuses, and as shown in FIG. 33, the method may include the following steps.

S3301, determining a first image driving signal corresponding to each pixel island under a two-dimensional display mode according to image information to be displayed, and applying the corresponding first image driving signal to all sub-pixels in the pixel island to form a two-dimensional image.

S3302, determining a second image driving signal corresponding to each viewpoint under a three-dimensional display mode according to the image information to be displayed, and applying the second image driving signal to sub-pixels in the respective pixel islands to form a three-dimensional image with a plurality of viewpoints.

In some embodiments, determining a second image driving signal corresponding to each viewpoint under a three-dimensional display mode according to the image information to be displayed, includes:

determining the user's eye coordinates through the human eye tracking system, and determining the left eye image and right eye image according to the user's eye coordinates;

determining the sub-pixels corresponding to the left eye image and the sub-pixels corresponding to the right eye image in each pixel island group, here each pixel island group includes K columns of pixel islands covered by a corresponding light-splitting repeating unit, and a line connecting the user's left and right eyes is parallel to the row direction;

providing the driving signal corresponding to the left eye image to the sub-pixels corresponding to the left eye image, and providing the driving signal corresponding to the right eye image to the sub-pixels corresponding to the right eye image.

It should be noted that the display apparatus also includes a graphics processing unit (GPU), which can use GPU rendering acceleration, that is, calling GPU-accelerated graphics rendering can improve image loading speed. However, due to insufficient GPU rendering capabilities, for display apparatus with pixel islands including multiple sub-pixels, the GPU rendering capabilities cannot meet the needs of filling all sub-pixel images.

The driving method of the display apparatus provided by the present disclosure determines the user's eye coordinates through the human eye tracking system, determines the left eye image and the right eye image according to the user's eye coordinates, and then only needs to arrange the left eye image and the right eye image of each sub-pixel in the sub-pixel image merging process, which can avoid the problem of crosstalk between adjacent viewpoints and can improve the display effect. In addition, arranging only the left-eye image and the right-eye image can also make the sub-pixel view arranging within the GPU rendering ability.

In some embodiments, determining the sub-pixels corresponding to the left eye image and the sub-pixels corresponding to the right eye image in each pixel island group, includes:
  obtaining the light angular spectrum of each sub-pixel to obtain the angular spectrum boundary database;
  determining the coordinates of the center of the user's eyes according to the coordinates of the user's eyes;
  determining the angle between the center of the user's eyes and the center of each pixel island group;
  determining the center sub-pixel corresponding to the center of the user's eyes, according to the angle between the center of the user's eyes and the center of each pixel island group as well as the light angular spectrum of each sub-pixel;
  if $N=K*n$ is even, and the coordinates of the center of the user's eyes are in the left half of the center sub-pixel, determining that the center sub-pixel and its right $((N/2)-1)$ sub-pixels correspond to the left eye image, and the N/2 sub-pixels at the left side of the center sub-pixel correspond to the right eye image;
  if $N-K*n$ is even, and the coordinates of the center of the user's eyes are in the right half of the center sub-pixel, determining that N/2 sub-pixels at the right of the center sub-pixel correspond to the left eye image, and the center sub-pixel and its left $((N/2)-1)$ sub-pixels correspond to the right eye image;
  if $N=K*n$ is odd, determining that $(N-1)/2$ sub-pixels at the right of the center sub-pixel correspond to the left eye image, and $(N-1)/2$ sub-pixels at the left of the center sub-pixel correspond to the right eye image; when the coordinates of the center of the user's eyes are in the left half of the center sub-pixel, then determining that the center sub-pixel corresponds to the left eye image; when the coordinates of the center of the user's eyes are in the right half of the center sub-pixel, then determining that the center sub-pixel corresponds to the right eye image.

It should be noted that the left half of the center sub-pixel refers to the left side of the center of sub-pixel, and the right half of the center sub-pixel refers to the right side of the center of the sub-pixel.

Next, taking K=4, M=5, n=16, and the display apparatus including 3840×2160 pixel islands as an example, the driving method of the display apparatus provided in the disclosure is described.

In some embodiments, the user's eye coordinates are determined by the human eye tracking system, the left and right eye camera positions are set according to the eye coordinates determined by the human eye tracking system, and the camera orientation is set according to the image depth, and the left eye image and right eye image are determined in real time, and the resolution of each image is (960*5)*2160.

In some embodiments, for example, the light angular spectrum of each sub-pixel may be measured in advance by simulation. The display apparatus includes a driver chip that stores the light angular spectrum, so that the light angular spectrum for each sub-pixel stored can be obtained by the driver chip. Alternatively, the display apparatus may also include a measurement module for the light angular spectrum, through which light angular spectrum is measured in real time.

Figure 34:
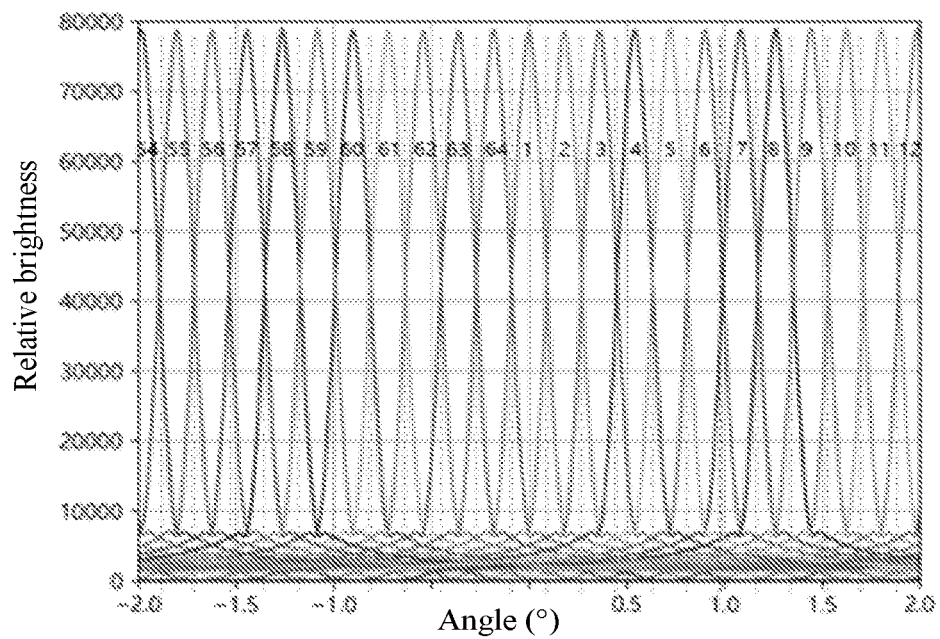
FIG. 34 shows a boundary of light angular spectrum of sub-pixels of an display apparatus according to an embodiment of the disclosure.
Figure 35:
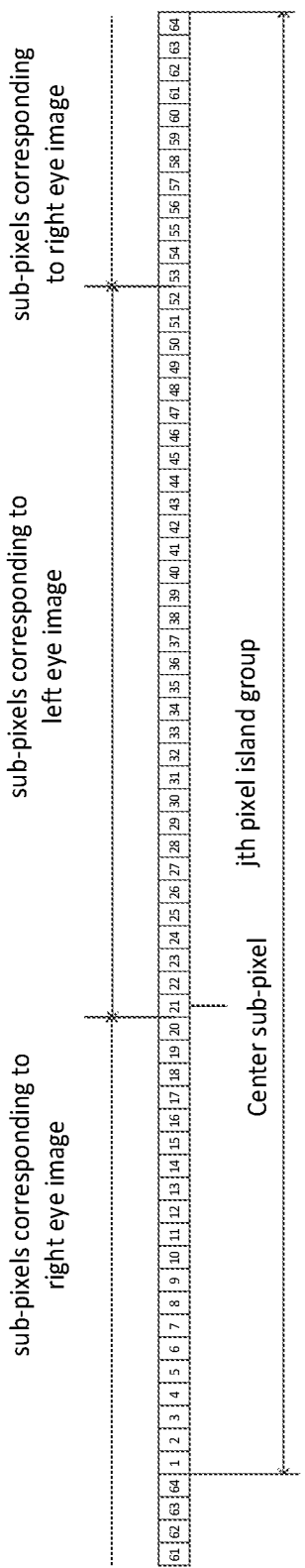
FIG. 35 is a schematic diagram of sub-pixels corresponding to left eye image and right eye image according to an embodiment of the disclosure.

In some embodiments, when the width of M light-splitting structures in the row direction is equal to the width of the K columns of pixel islands, the light angular spectrum for sub-pixels in each pixel island is the same. Determine the angular spectrum boundary of each sub-pixel according to the light angular spectrum for sub-pixels, taking the intersection of the adjacent sub-pixel angular spectrum as the boundary point, and determine the angular range occupied by each sub-pixel. As shown in FIG. 34, where FIG. 34 shows part of the sub-pixel angular spectrum boundary. In some embodiments, the relationship between all boundary points and the corresponding sub-pixel index can be stored as a sub-pixel angular spectrum boundary database, for example, it can be stored to the driver chip. Determine the center sub-pixel corresponding to the center of the user's eyes, according to the angle between a line connecting the center of the user's eyes and the center of each pixel island group and the row direction as well as the light angular spectrum of each sub-pixel. Specifically, according to the angle of the ling connecting the center of the user's eyes and the center of each pixel island group as well as sub-pixel angular spectrum boundary database to determine which sub-pixel angular spectrum range the user's binocular center is located in the pixel island group, and use the sub-pixel as the center sub-pixel of this pixel island group. For example, if the center of the user's binocular corresponds to the 21st sub-pixel of the jth island group, then the sub-pixel is the center sub-pixel of this island group. It should be noted that the sub-pixel index is the viewpoint corresponding to the sub-pixel. When determining the center sub-pixel, as shown in FIG. 35, the sub-pixels are stitched in the order of the viewpoint, each sub-pixel is arranged in the order of the viewpoint from smallest to largest, and the center sub-pixel and the sub-pixel corresponding to the left eye image and right eye image are determined according to the sub-pixel position in the viewpoint order. As shown in FIG. 35, when the center coordinates of the user's eyes fall on the left half of the 21st sub-pixel of the jth pixel island group, the 21st sub-pixel and the 31 sub-pixels on the right side in the pixel island group correspond to the left eye image, and the 32 sub-pixels to the left of the 21st sub-pixel correspond to the right eye image. As such, sub-pixel view merging is completed, with only the left-eye image and the right-eye image being arranged.

It should be noted that in the specific implementation, the order of the viewpoint from smallest to largest does not represent the actual positions of the sub-pixels in each pixel island group, and the specific position of the sub-pixel corresponding to each viewpoint in the pixel island group can be set according to actual needs. For example, the difference between the viewpoints of the adjacent two sub-pixels corresponding to the light-splitting structure can be set to M.

In some embodiments, providing the driving signal corresponding to the left eye image to the sub-pixels corresponding to the left eye image, and providing the driving signal corresponding to the right eye image to the sub-pixels corresponding to the right eye image, includes:
  providing the driving signal of a $(M(j-1)+a)$th viewpoint in the left eye image to the ath left-eye sub-pixel in the jth island group, and providing the driving signal of the $(M(j-1)+a)$th viewpoint in the right eye image to the ath right eye sub-pixel in the jth island group; where j is an integer greater than or equal to 1 and less than or equal to X, X is the total number of pixel island groups, and a is an integer greater than or equal to 1 and less than or equal to M.

Figure 36:
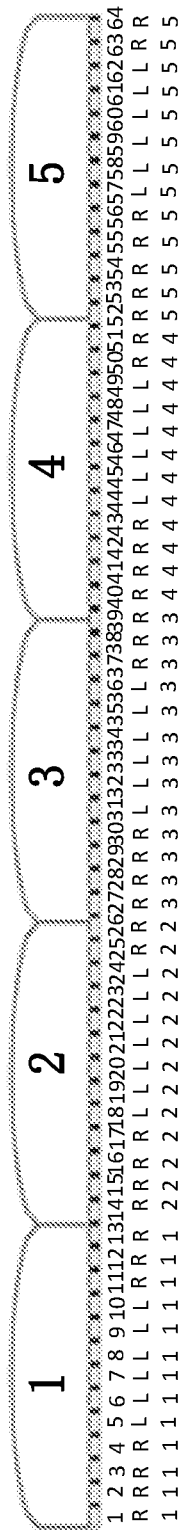
FIG. 36 is a schematic diagram of driving signals for sub-pixels corresponding to left eye image and right eye image according to an embodiment of the disclosure.
Figure 37:
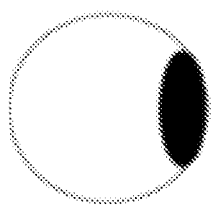
FIG. 37 is a schematic diagram illustrating a human eye viewing effect according to an embodiment of the disclosure.
Figure 37:
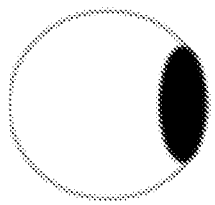

Compared with that one pixel island corresponds to M light-splitting structures, in this embodiment, K pixel islands correspond to M light-splitting structures, which will reduce the resolution of 3D display. When K=4, M=5, and the display apparatus includes 3840×2160 pixel islands, the above left and right eye images arranging method is adopted, and the resolution of each image is (960*5)*2160. For the driving method of the display apparatus provided by the present disclosure, 5 light-splitting structures covers on each pixel island, as shown in FIG. 36, the sub-pixel corresponding to the first light-splitting structure is marked as 1, the sub-pixel under the second light-splitting structure is marked as 2, the sub-pixel under the third light-splitting structure is marked as 3, the sub-pixel under the fourth light-splitting structure is marked as 4, and the sub-pixel under the fifth light-splitting structure is marked as 5. The drive signal of (5 (j−1)+1) of the left eye image is provided to the left eye sub-pixel labeled 1 (specifically L1 in the figure), the driving signal of the left eye view (5 (j−1)+2) is provided to the left eye sub-pixel labeled 2 (specifically L2 in the figure), the driving signal of the (5 (j−1)+3) is provided to the left eye sub-pixel labeled 3 (specifically L3 in the figure), the driving signal of (5 (j−1)+4) is provided to the left eye sub-pixel labeled 4 (specifically L4 in the figure), and the drive signal of the (5 (j−1)+5) drive signal is provided to the left eye sub-pixel labeled 5 (specifically L5 in the figure). The right-eye image is treated similarly. After the above processing, the human eye will get the view effect shown in FIG. 37. In this case, the view is no longer a crosstalk view, but the correct left eye image and right eye image with increased resolution, and the resolution is 4800×2160. That is, the 3D display achieves a resolution of 4800×2160, meeting the resolution requirements of the retinal level, of which the retinal resolution is: 3840×2160.

In view of the above, the display apparatus and the driving method provided by the disclosure, M light-splitting structures correspondingly cover K columns of pixel islands, M and K are integers greater than 1, that is, the light-splitting structure and pixel island columns are many-to-many correspondence. It can avoid the size of the light-splitting structure in the row direction being too small and the corresponding difficulty of preparing the light-splitting structure being increased. Also the increasing the divergence angle of the sub-pixel due to the diffraction of the light-splitting structure with a too small size can be avoided, the crosstalk between the views can be reduced, and the display effect can be improved.

Figure 38:
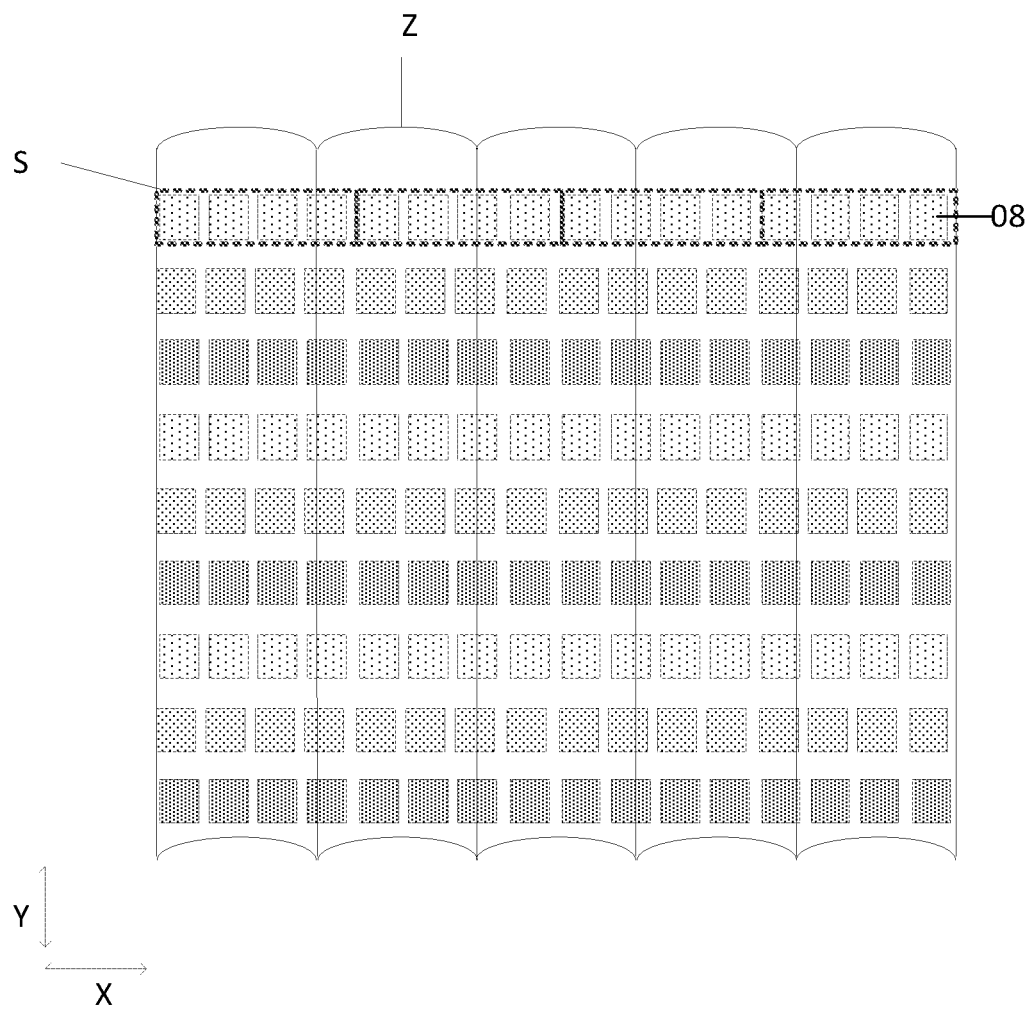
FIG. 38 is a schematic structural diagram of another display apparatus in the related art.
Figure 39:
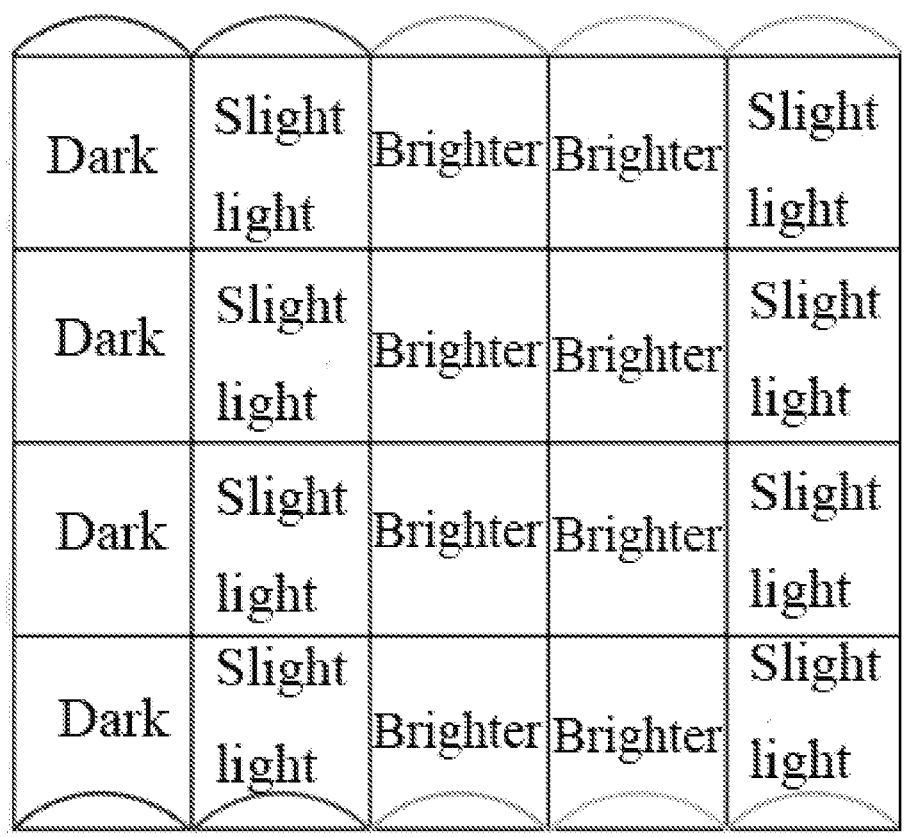
FIG. 39 is a schematic diagram illustrating a distribution of relative brightness according to an embodiment of the disclosure.
Figure 40:
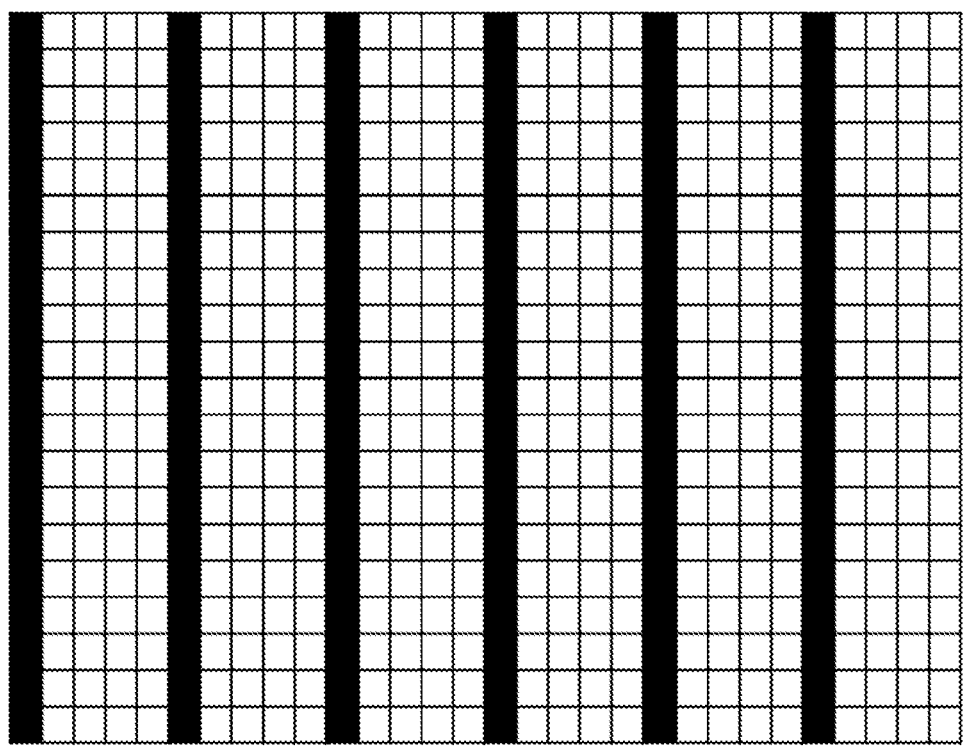
FIG. 40 is a schematic diagram illustrating a distribution of visual sense according to an embodiment of the disclosure.

In the related art, as shown in FIG. 38, the display apparatus includes: a plurality of pixel islands S arranged at intervals along the row direction X and column direction Y and a plurality of cylindrical lenses Z. Each pixel island S has a plurality of sub-pixels 08 arranged at intervals along the row direction X; M cylindrical lens Z correspondingly covers N columns of sub-pixels, which solves the problem of moiré pattern on the macroscopic level, but produces the problem of microscopic moiré pattern. In the unit with M=5 as the period, the area corresponding to each cylindrical lens produces different brightness at different viewing angles in space, under any viewing angle, the brightness of the 5 cylindrical lens areas seen is different. In one of the angles, the relative brightness distribution of the 5 regions seen is shown FIG. 39, and the visual sensory effect is shown in FIG. 40. Every 5 areas, there will be a region with the lowest brightness, which is called the dark area. Pinstripes are formed by connecting the dark areas, and due to the large spacing of the pinstripes (about 727.2 μm), they are easy to be recognized by the human eye, resulting in the problem of micro-observance of the display apparatus.

Figure 41:
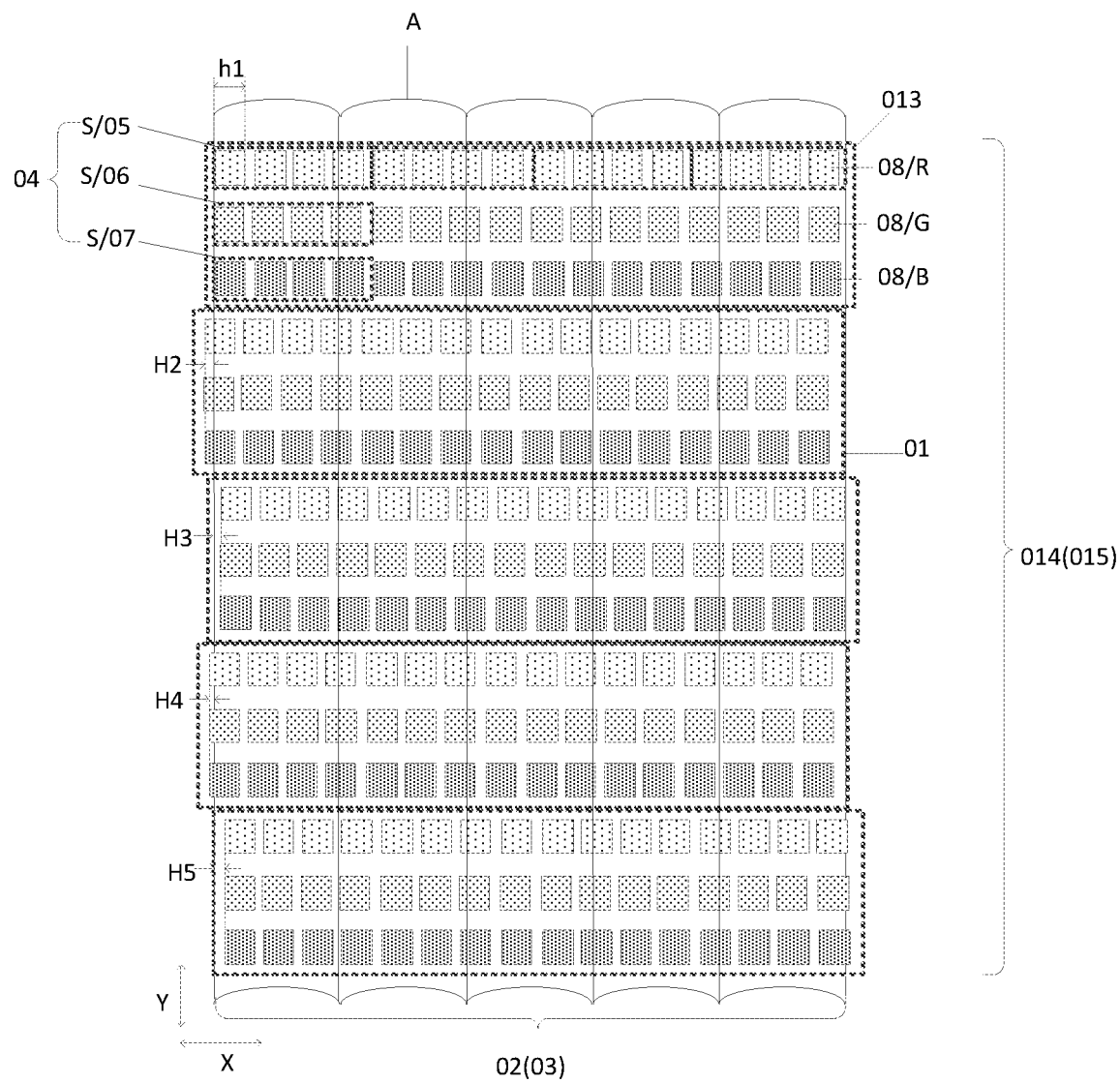
FIG. 41 is a schematic structural diagram of another display apparatus according to an embodiment of the disclosure.

Some embodiments of the disclosure provide another display apparatus, as shown in FIG. 41, including:
a display panel 01 including: a plurality of pixel repeating units 04 arranged along the row direction X and the column direction Y array; each pixel repeat unit 04 includes a plurality of pixel islands S arranged consecutively in the column direction; each pixel island S includes a plurality of sub-pixels 08 arranged at intervals along the row direction X; plurality of pixel repeating units 04 include pixel repeating unit rows 013 arranged in the column direction Y; the sub-pixels 08 in any two adjacent pixel repeat unit rows 013 are misaligned (staggered) in the row direction X;

a light-splitting component 02 positioned at a display side of the display panel 01; the light splitting 02 includes a plurality of light-splitting repeating units 03 extending along the column direction Y and continuously arranging along the row direction X; the light-splitting repeating unit 03 includes M light-splitting structures A extending along the column direction Y and arranged continuously along the row direction X; each light-splitting repeating unit 03 corresponds to the N columns of sub-pixels in the row of pixel repeating units; M and N are integers greater than 1, and M and N are prime to each other.

It should be noted that the misalignment of the sub-pixels in the row of two adjacent pixel repeating unit rows in the row direction means that the centers of the sub-pixels in the row of two adjacent pixel repeating units are not in a straight line in the column direction.

In the display apparatus provided in some embodiments of the present disclosure M light-splitting structures corresponds to N column of sub-pixels in the pixel repeating unit rows, and M and N are integers greater than 1, that is, the light-splitting structures and the sub-pixels are many-to-many correspondences. It can avoid the size of the light-splitting structures in the row direction being too small, the difficulty of preparing the light-splitting component, and avoid increasing of the light divergence angle of sub-pixel and increasing of the crosstalk between views which affect the display effect, due to the diffraction of the light-splitting structures that are too small. In addition, at least some of the sub-pixels in two adjacent pixel repeating unit rows are misaligned in the row direction, so that the distribution of the dark area corresponding to the light repeating unit can be disrupted, so that the dark area is misaligned and the thin stripes in the dark area in the column direction can be avoided, which can alleviate the problem of microscopic moiré pattern.

It should be noted that the N column of sub-pixels in the pixel repeating unit rows corresponding to each light repeating unit refer to the overlap between the orthographic projection of each light repeating unit in the plane where the display panel is located and the orthographic projection of the N column of sub-pixels in the pixel repeating unit rows in the plane where the display panel is located. Because the sub-pixels in any two adjacent pixel repeating unit rows are misaligned in the row direction, for example, for some pixel repeat unit rows, the orthographic projection of the light-splitting repeating unit in the plane where the display panel is located completely covers the orthographic projection of the N columns of the sub-pixels in these pixel repeating unit rows in the plane where the display panel is located. For the remaining pixel repeating unit rows, the orthographic projection of the light-splitting repeating unit in the display panel plane where the display panel is located does not completely cover the orthographic projection of the N column of sub-pixels in these pixel repeating unit rows in the plane where the display panel is located. For the sub-pixels located at the edge of the light-splitting repeating unit, the orthographic projection of the light-splitting repeating unit in the plane wherein the display panel is located covers only part of the orthographic projection of these sub-pixels in the display plane where the display panel is located.

In some embodiments, as shown in FIG. 41, the sub-pixels 08 in any two adjacent pixel repeating unit rows are misaligned in row direction X. Thus, there is no adjacent area of the dark area in the column direction, and the continuous formation of thin stripes in the dark area in the column direction can be avoided, which can effectively solve the problem of microscopic moiré patterns.

It should be noted that the display apparatus provided in the embodiment of the disclosure may be used for three dimensional (3D) display, and may further switch between 3D and two dimensional (2D) display. A pixel island may be used as one secondary pixel of 2D display. One pixel island includes a plurality of sub-pixels, such that 3D display may maintain the same resolution as 2D display. By combining an eye-tracking system, multi-view display with a large viewing angle may be achieved, and 3D display with more pixels per inch (ppi) may be further achieved, with more information and less color crosstalk between adjacent viewpoints.

During specific implementation, the light-splitting structures are configured to control light-emitting angles of the sub-pixels, so as to achieve directional light emission.

During specific implementation, the display panel may be one of a liquid crystal display (LCD) panel, an organic light-emitting diode (OLED) display panel, a quantum dot light-emitting diode (QLED), a micro inorganic light-emitting diode (micro LED) display panel, and a mini LED display panel.

In some embodiments, as shown in FIG. 41, a pixel repeating unit 04 in the column direction Y includes three pixel islands S arranged consecutively.

In a pixel repeating unit 04, the display color of the sub-pixel 08 of the same pixel island S is the same, and the display color of the sub-pixel 08 of different pixel island S is different.

In some embodiments, as shown in FIG. 41, a pixel repeating unit 04 includes: a first pixel island 05, a second pixel island 06 and a third pixel island 07. The first pixel island 05 includes multiple red sub-pixels R, the second pixel island 06 includes multiple green subpixels G, and the third pixel island 07 includes multiple blue subpixels B.

In some embodiments, as shown in FIG. 41, each sub-pixel 08 in a pixel island S is displayed in the same color.

In some embodiments, as shown in FIG. 41, a plurality of pixel repeating unit rows 013 are divided into a plurality of pixel repeating unit groups 014, and each pixel repeating unit group 014 includes M pixel repeating unit rows 013. In each pixel repeating unit group 014, the sub-pixels 08 in any two adjacent pixel repeating unit rows 013 are misaligned in the row direction X. Each pixel repeating unit group 014 is divided into sub-units 015 corresponding to the light-splitting repeating unit 03. That is, the part corresponding to M light-splitting structures A in each pixel repeating unit group 014 is used as one sub-unit 015.

It should be noted that in FIG. 41, M=5, that is, the pixel repeating unit group 014 includes 5 pixel repeating unit rows 013. Only one sub-unit 015 is shown in FIG. 41, i.e., only the part of the pixel repeating unit group 014 corresponding to the 5 light-splitting structures A is shown.

In some embodiments, as shown in FIG. 4, in the sub-unit, the ratio of the misaligned vector Hj of the c-th sub-pixel 08 in the j-th pixel repeating unit row 13 and the c-th sub-pixel 08 in the first pixel repeating unit row 013 in the row direction X to the width of sub-pixel is Jj=±E/M, wherein c is an integer greater than or equal to 1 and less than or equal to N, j is an integer greater than 1 and less than or equal to M, and E is an integer greater than or equal to 1 and not equal to M and not equal to an integer multiple of M.

That is, in the embodiments of the present disclosure, each sub-pixel in the second pixel repeating unit row in each sub-unit to each sub-pixel in the M-th pixel repeating unit row are misaligned Jj×h1 with respect to the sub-pixels in the first pixel repeating unit row.

It should be noted that, taking the row direction X as shown in FIG. 41 as an example, the row direction X is the left and right extension direction in the figure, and the sub-pixel 08 in the j-th pixel repeating unit row 013 can be misaligned to the left relative to the sub-pixel 08 in the first pixel repeating unit row 013. In this case, Hj is positive, Jj=+E/M. It can also be that the sub-pixel 08 in the j-th pixel repeat unit row 013 is misaligned to the right relative to the sub-pixel 08 in the first pixel repeating unit row 013. In this case, Hj is negative, Jj=−E/M.

In some embodiments, the misalignment vectors of the sub-pixels in different sub-units in the same pixel repeating unit row are the same in each pixel repeating unit group. That is, for M pixel repeating unit rows 013, the ratio of the misalignment vector Hj of the sub-pixels in the j-th pixel repeating unit row in the row direction and the width h1 of the sub-pixel in the row direction X is Jj=±E/M for.

It should be noted that the relative brightness distribution of a sub-unit corresponding to M light-splitting structures can be divided into M*M brightness regions. For one sub-unit, when each sub-pixel in the second pixel repeating unit row to each sub-pixel in the M-th pixel repeating unit row are misaligned relative to the sub-pixel in the first pixel repeating unit row, the dark area with the lowest brightness in the brightness region corresponding to the second to the M-th pixel repeating unit rows are misaligned relative to the dark area corresponding to the first pixel repeating unit, so that the distribution of the dark area in areas corresponding to the sub-unit can be disrupted, so that the dark area is misaligned. And because the display panel includes a plurality of pixel repeating unit groups, the pixel repeating unit group includes a plurality of sub-units, that is, the sub-unit is used as the smallest unit to scramble the distribution of dark areas. Because the distribution of the dark area of each sub-unit is disturbed in the column direction, the whole display apparatus can avoid the continuous formation of thin stripes in the dark area in the column direction, and solve the problem of microscopic moiré pattern.

In the specific implementation, when M=5, Jj can be: −11/5, −6/5, −4/5, −3/5, −2/5, −1/5, 1/5, 2/5, 3/5, 4/5, 6/5, 11/5, etc.

It should be noted that when the difference between two Jjs is M or an integer multiple of M, for example, Jj is −6/5 and −1/5 respectively, and the number of brightness regions between the dark area of the row when Jj is −6/5 and the dark area of the first row and the number of brightness regions between the dark area of the row when Jj is −1/5 and the dark area of the first row are the same.

In some embodiments, in the sub-unit, in the second to the M-th pixel repeating unit rows, the Jj corresponding to any two pixel repeating unit rows are not equal, and the absolute value of the difference between Jj corresponding to any two pixel repeating unit rows is not an integer greater than or equal to 1. In this way, there is no situation where the dark areas are in the same column in the column direction in a pixel repeating unit group, so that the distance between the two dark areas arranged in the column direction can be increased, and thin lines that are easily visible to the human eye in the column direction can be avoided.

In some embodiments, in the sub-unit, the ratio of the misaligned vector of the c-th sub-pixel in the row direction to the width of the sub-pixel in the row direction in at least parts of adjacent two pixel repeating unit rows ΔJ is not equal to $$\pm C\frac{1}{M} \text{ or } \pm C\frac{1}{M};$$

where C is an integer greater than 0. Thus, the dark areas in the adjacent pixel repeating unit rows can be separated by at least one brightness area, so as to avoid the continuity of the dark areas, which is more conducive to making the human eye not easy to detect the existence of thin lines extending in the oblique direction, and effectively solves the problem of microscopic moiré pattern.

In some embodiments, E is an integer greater than or equal to 1 and less than or equal to M−1. That is, the misalignment vector of sub-pixel does not exceed the width of one sub-pixel in the row direction X. Thus, while disrupting the distribution of the dark area of the corresponding area of the sub-unit, avoiding the misaligned distance of the sub-pixel being too large, which is conducive to the rational use of the display panel space.

It should be noted that when M=5 and E are integers greater than or equal to 1 and less than or equal to M−1, Jj can be one of the following: −⅘, −⅗, −⅖, −⅕, ⅕, ⅖, ⅗, ⅘. When Jj is −⅘, the dark area corresponding to the row is misaligned by four brightness regions to the right relative to the corresponding dark area of the first row (the dark area corresponding to the row is separated by three brightness regions from the dark area corresponding to the first row). When Jj is −⅗, the dark area corresponding to the row is misaligned by three brightness regions to the right relative to the corresponding dark area of the first row (the dark area corresponding to the row is separated by two brightness regions from the dark area corresponding to the first row). When Jj is −⅖, the dark area corresponding to the row is misaligned by two brightness regions to the right relative to the dark area corresponding to the first row (the dark area corresponding to the row is separated by one brightness region from the dark area corresponding to the first row). When Jj is −⅕, the dark area corresponding to the row is misaligned by one brightness region to the right relative to the dark area corresponding to the first row (the dark area corresponding to the row is separated by zero brightness regions from the dark area corresponding to the first row). When Jj is ⅕, the dark area corresponding to the row is misaligned by one brightness region to the left relative to the dark area corresponding to the first row (the dark area corresponding to the row is separated by zero brightness regions from the dark area corresponding to the first row). When Jj is ⅖, the dark area corresponding to the row is misaligned by two brightness regions to the left relative to the corresponding dark area of the first row (the dark area corresponding to the row is separated by one brightness region from the dark area corresponding to the first row). When Jj is ⅗, the dark area corresponding to the row is misaligned by three brightness regions to the left with respect to the dark area corresponding to the first row (the dark area corresponding to the row is separated by two brightness regions from the dark area corresponding to the first row). When Jj is ⅘, the dark area corresponding to the row is misaligned by four brightness regions to the left relative to the dark area corresponding to the first row (the dark area corresponding to the row is separated by three brightness regions from the dark area corresponding to the first row).

In some embodiments, when M is 5, J2 is −⅖ or ⅗, J3 is ⅕ or −⅘, J4 is −⅕ or ⅘, and J5 is ⅖ or −⅗.

In the specific embodiment, for example, J2 is −⅖, J3 is ⅕, J4 is −⅕, J5 is ⅖, and the corresponding is shown in FIG. 41, H2=(−⅖) h1, H3=(⅕) h1, H4=(−⅕) h1, H5=(⅖) h1.

Of course, in the specific implementation, it can also be, J2 is ⅗, J3 is −⅘, J4 is ⅘, J5 is −⅗.

Figures 42, 43:
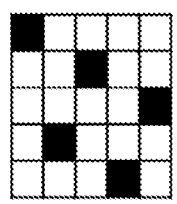
FIG. 42 is a schematic diagram illustrating a distribution of relative brightness of a sub-unit according to an embodiment of the disclosure.
FIG. 43 is a schematic diagram illustrating a distribution of visual sense of a sub-unit according to an embodiment of the disclosure.

In the specific implementation, when M=5, J2 is −⅖, J3 is ⅕, J4 is −⅕, J5 is ⅖, the relative brightness distribution of the region of a sub-unit corresponding to five light-splitting structures is shown in FIG. 42, and the relative brightness distribution of the region of a sub-unit corresponding to the five light-splitting structures can be divided into 5*5 brightness regions. Here, the area corresponding to the relative brightness of 55.6% is the dark area. As shown in FIG. 42, the visual sensory effect of the area of a sub-unit is shown in FIG. 43, the dark areas of different rows are not in the same column, that is, the dark areas of different rows are misaligned and arranged, and the visual sensory effect of the area of multiple sub-units is shown in FIG. 44.

Figure 44:
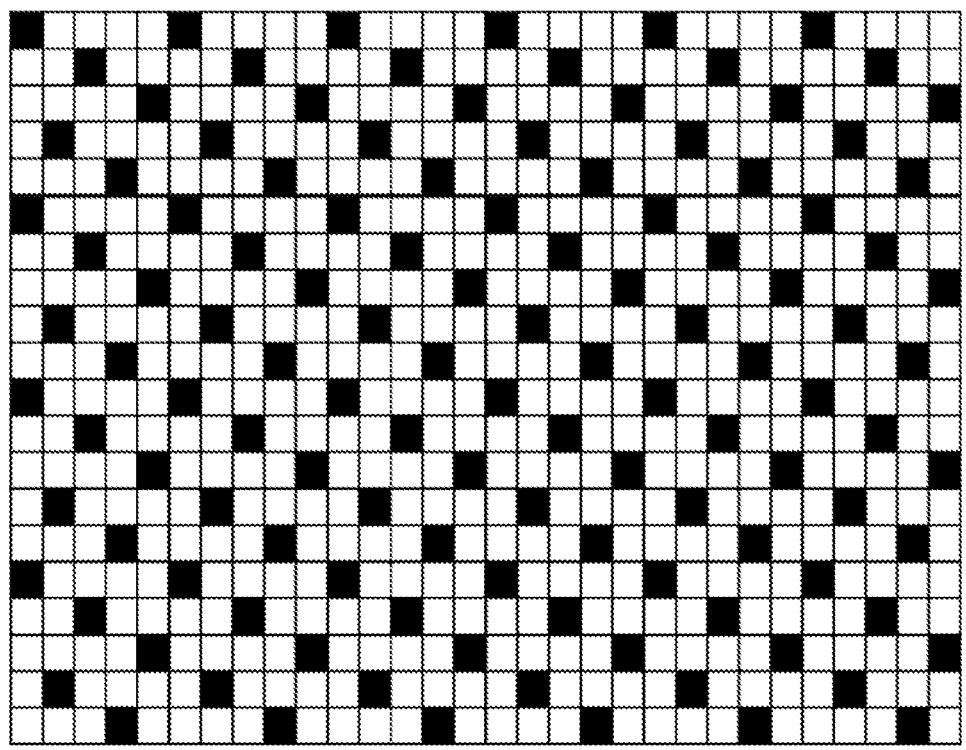
FIG. 44 is a schematic diagram illustrating a distribution of visual sense of multiple sub-units according to an embodiment of the disclosure.

It should be noted that if the dark areas are connected as shown in FIG. 44, although thin lines in the dark area are also formed, the extension direction of the thin lines in the dark area is greater than 0 in the direction of the row direction and the column direction (hereinafter referred to as the oblique direction), and the interval between the thin lines in the dark area extending in the oblique direction is 391.6 microns, which is much smaller than the interval between the thin lines in the dark area extending in the column direction in the related art (727.2 microns). For the interval of 391.6 microns, it is not easy to detect at a viewing distance of 300 mm, and under normal circumstances, the viewing distance of the user when using the display apparatus is usually 630 mm.

In some embodiments, when E is an integer greater than or equal to 1 and less than or equal to M−1, in the sub-unit, in the second to the M-th pixel repeating unit rows, the Jj corresponding to any two pixel repeating unit rows is not equal, and when the Jj corresponding to the two pixel repeating unit rows is positive the other is negative, the sum of the absolute values of Jj corresponding to the two pixel repeating unit rows is not equal to 1. In this way, there is no situation where the dark areas are in the same column in the column direction in a pixel repeating unit group, so that the distance between the two dark areas arranged in the column direction can be increased, and thin lines that are easily visible to the human eye in the column direction can be avoided.

In some embodiments, as shown in FIG. 42 and FIG. 43, in the brightness region corresponding to one sub-unit, the central line of the plurality of dark areas is not in the same straight line. That is, in the brightness region corresponding to one subunit, multiple dark areas are not arranged in the direction of the angle greater than 0 with the row direction and column direction (hereinafter referred to as the oblique direction), but the multiple dark areas are distributed in a plurality of straight lines extending along the oblique direction. In this way, compared with the situation that the center line of the plurality of dark areas is in the same straight line, as shown in FIG. 44, in the whole display apparatus, the distance between the thin lines of the dark area is smaller, which is more conducive to making the human eye not easy to detect the existence of the thin line extending in the oblique direction, and effectively solves the problem of microscopic moiré pattern.

In some embodiments, when E is an integer greater than or equal to 1 and less than or equal to M−1, in the sub-unit, the ratio of the misaligned vector of the c-th sub-pixel in the row direction to the width of the sub-pixel in the row direction of at least part of adjacent two pixel repeating unit rows ΔJ is not equal to ±1/M or ±(M−1)/M. Thus, the dark areas in the rows of adjacent pixel repeating units can be separated by at least one brightness area, so as to avoid the continuity of the dark areas, which is more conducive to making the human eye not easy to detect the existence of thin lines extending in the oblique direction, and effectively solves the problem of microscopic moiré pattern.

In some embodiments, each light-splitting repeating unit corresponds to a K column of pixel islands in a pixel repeating unit row, where K is an integer greater than 1.

In the display apparatus provided in the embodiments of the present disclosure, each light-splitting repeating unit corresponds to the K column of pixel islands in a pixel repeating unit row, that is, M light-splitting structures correspond to K column of pixel islands in a pixel repeating unit row, and M and K are integers greater than 1, that is, the correspondence between the light-splitting structure and the pixel island column is many-to-many. It can avoid the size of the light-splitting structures in the row direction being too small, the difficulty of preparing the light-splitting component, and avoid increasing of the light divergence angle of sub-pixel and increasing of the crosstalk between views which affect the display effect, due to the diffraction of the light-splitting structures that are too small.

In some embodiments, N/K is an integer. That is, the N columns of sub-pixels in the pixel repeating unit rows corresponding to M light splitting units can be evenly divided into multi-column of pixel islands.

In the specific embodiment, as shown in FIG. 41, each pixel island S includes n sub-pixels 08 arranged at intervals along the row direction X; where n is an integer greater than 1. Each light-splitting repeating unit correspondingly covers the K column of pixel islands in the pixel repeating unit rows, N−K*n; K is an integer greater than 1, and M and K are prime to each other.

Alternatively, in some embodiments, N and K are prime to each other. That is, the N sub-pixels in the corresponding pixel repeating unit rows of M light splitting units cannot be evenly divided into multi-column of pixel islands.

In the specific implementation, even if the sub-pixels in the N column of the corresponding pixel repeating unit row of M light splitting units cannot be evenly divided into multi-column of pixel islands, the relationship between the light splitting unit and the pixel island is still many-to-many. It still can avoid the size of the light-splitting structures in the row direction being too small, the difficulty of preparing the light-splitting component, and avoid increasing of the light divergence angle of sub-pixel and increasing of the crosstalk between views which affect the display effect, due to the diffraction of the light-splitting structures that are too small.

Although preferred embodiments of the disclosure have been described, those skilled in the art can still make additional changes and modifications to the embodiments once they learn the basic inventive concept. Therefore, the appended claims are intended to be interpreted as including the preferred embodiments and all changes and modifications falling within the scope of the disclosure.

Obviously, those of skill in the art can make various changes and modifications to the embodiments of the present invention without departing from the spirit and scope of the embodiments of the present invention. Thus, provided that these changes and modifications of the embodiments of the present invention fall within the scope of the claims of the present invention and their equivalents, the present invention is also intended to cover these changes and modifications.

What is claimed is:

1. A display apparatus, comprising:
a display panel, wherein the display panel comprises a plurality of pixel repeating units arranged in arrays in a row direction and a column direction; each of the plurality of pixel repeating units comprises a plurality of pixel islands arranged continuously in the column direction, and each pixel island comprises a plurality of sub-pixels arranged at intervals in the row direction, the plurality of pixel repeating units comprise a plurality of pixel repeating unit rows arranged in the column direction; sub-pixels in at least parts of adjacent pixel repeating units are misaligned in the row direction, and
a light-splitting component at a display side of the display panel, wherein the light-splitting component comprises a plurality of light-splitting repeating units extending in the column direction and continuously arranged in the row direction, the light-splitting repeating unit comprises M light-splitting structures extending in the column direction and continuously arranged in the row direction, and each light-splitting repeating unit corresponds to N column of sub-pixels in the pixel repeating unit rows; wherein both M and N are integers greater than 1, and M and N are prime to each other.

2. The display apparatus according to claim 1, wherein the plurality of pixel repeating unit rows are divided into a plurality of pixel repeating unit groups, each of the plurality of pixel repeating unit groups comprises M pixel repeating unit rows; in each of the pixel repeating unit groups, sub-pixels in any two adjacent pixel repeating unit rows are misaligned in the row direction;
each of the pixel repeating unit groups comprises sub-units corresponding to the light-splitting repeating units in many-to-many manner;
in the sub-units, a ratio of a misaligned vector of a c-th sub-pixel in a j-th pixel repeating unit row and a c-th sub-pixel in a first pixel repeating unit row in the row direction to a width of sub-pixel is Jj=±E/M, wherein c is an integer greater than or equal to 1 and less than or equal to N, j is an integer greater than 1 and less than or equal to M, and E is an integer greater than or equal to 1 and not equal to M and not equal to an integer multiple of M.

3. The display apparatus according to claim 2, wherein in the sub-unit, in a second to a M-th pixel repeating unit rows, Jj corresponding to any two pixel repeating unit rows are not equal, and an absolute value of a difference between Jj corresponding to any two pixel repeating unit rows is not an integer greater than or equal to 1.

4. The display apparatus according to claim 3, wherein in the sub-unit, a ratio of a misaligned vector of a c-th sub-pixel in the row direction to a width of the sub-pixel in the row direction in at least parts of adjacent two pixel repeating unit rows ΔJ is not equal to $$\pm C\frac{1}{M} \text{ or } \pm C\frac{1}{M};$$

wherein C is an integer greater than 0.

5. The display apparatus according to claim 2, wherein E is an integer greater than or equal to 1 and less than or equal to (M−1).

6. The display apparatus according to claim 5, wherein in the sub-unit, a ratio of the misaligned vector of the c-th sub-pixel in the row direction to the width of the sub-pixel in the row direction of at least part of adjacent two pixel repeating unit rows ΔJ is not equal to ±1/M or ±(M−1)M.

7. The display apparatus according to claim 5, wherein M is 5, J2 is −⅖ or ⅗, J3 is ⅕ or −⅘, J4 is −⅕ or ⅘, and J5 is ⅖ or −⅗.

8. The display apparatus according to claim 2, wherein in each pixel repeating unit group, the misalignment vectors of the sub-pixels in different sub-units in the same pixel repeating unit row are the same.

9. The display apparatus according to claim 1, wherein each light-splitting repeating unit corresponds to K columns of pixels islands in the pixel repeating unit row, K is an integer greater than 1.

10. The display apparatus according to claim 9, wherein N is prime to K.

11. The display apparatus according to claim 9, wherein N/K is an integer.

12. The display apparatus according to claim 11, wherein each pixel island comprises n sub-pixels arranged at intervals along the row direction; wherein n is an integer greater than 1; each light-splitting repeating unit covers K column of pixel islands in at least parts of the pixel repeating unit rows, N=K*n; K is an integer greater than 1, and M and K are prime to each other.

13. The display apparatus according to claim 9, wherein light rays emitted from light-emitting zones of N columns of sub-pixels in the pixel repeating unit rows and split by the M light-splitting structures form a continuous light-emitting zone in a space.

14. The display apparatus according to claim 13, wherein in a horizontal direction, a width of the M light-splitting structures is equal to a width of the N columns of sub-pixels.

15. The display apparatus according to claim 14, wherein the sub-pixels comprise sub-pixel opening regions; and in the row direction, a ratio of a total width of n sub-pixel opening regions to a width of the pixel island is greater than or equal to 0.9/M and smaller than or equal to 1.

16. The display apparatus according to claim 15, wherein in the row direction, light-emitting zones of the N columns of sub-pixels in the pixel repeating unit rows are complementarily spliced in a space.

17. The display apparatus according to claim 16, wherein in the row direction, a ratio of a width of opening regions of sub-pixels to a width of the pixel island is 1/M.

18. The display apparatus according to claim 17, wherein in the row direction, light-emitting zones of the N columns of sub-pixels in the pixel repeating unit rows overlap each other in a space.

19. The display apparatus according to claim 18, wherein in the row direction, the light-emitting zones of the N columns of sub-pixels evenly overlap each other in the space.

20. The display apparatus according to claim 19, wherein in the row direction, a ratio of a width of the opening regions of the sub-pixel to the width of the pixel island is i/M, i being an integer greater than 1 and smaller than or equal to (M−1).

21. The display apparatus according to claim 1, further comprises:
a spacer dielectric layer between the light-splitting component and the display panel.

22. The display apparatus according to claim 1, wherein the light-splitting structure is a geometric lens, a diffraction lens, a liquid crystal lens, or a liquid lens.

23. The display apparatus according to claim 1, wherein each of the pixel repeating units comprises three pixel islands continuously arranged in the column direction;
in one pixel repeating unit, colors of sub-pixels in a same pixel island are same, and colors of sub-pixels in different pixel islands are different.

24. The display apparatus according to claim 1, further comprises:
a human eye-tracking system configured to determine a position of eyes of a user in real time.

* * * * *